US007094902B2

(12) United States Patent
Roberts et al.

(10) Patent No.: US 7,094,902 B2
(45) Date of Patent: Aug. 22, 2006

(54) ELECTROACTIVE POLYMERS

(75) Inventors: Ralph R. Roberts, Cottage Grove, MN (US); James G. Bentsen, North St. Paul, MN (US); Yingbo Li, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 264 days.

(21) Appl. No.: 10/254,218

(22) Filed: Sep. 25, 2002

(65) Prior Publication Data
US 2004/0062930 A1 Apr. 1, 2004

(51) Int. Cl.
C07D 249/08 (2006.01)
C07D 271/06 (2006.01)
C07D 285/08 (2006.01)
G09G 3/30 (2006.01)

(52) U.S. Cl. .................. 548/128; 548/131; 548/262.2; 548/269.4; 345/30; 345/36; 345/45

(58) Field of Classification Search ................ 548/131, 548/128, 262.2, 269.4; 514/364; 345/30, 345/36, 45, 76
See application file for complete search history.

(56) References Cited

U.S. PATENT DOCUMENTS

| | | | |
|---|---|---|---|
| 4,215,129 A * | 7/1980 | Arrington et al. ........... 514/364 |
| 4,597,896 A | 7/1986 | Denisevich, Jr. et al. |
| 5,235,044 A | 8/1993 | Mercer et al. |
| 5,408,109 A | 4/1995 | Heeger et al. |
| 5,550,290 A | 8/1996 | Mizuta et al. |
| 5,558,904 A | 9/1996 | Hsieh et al. |
| 5,668,245 A | 9/1997 | Marrocco, III et al. |
| 5,681,664 A | 10/1997 | Tamano et al. |
| 5,693,446 A | 12/1997 | Staral et al. |
| 5,695,907 A | 12/1997 | Chang |
| 5,708,130 A | 1/1998 | Woo et al. |
| 5,710,097 A | 1/1998 | Staral et al. |
| 5,725,989 A | 3/1998 | Chang et al. |
| 5,759,709 A | 6/1998 | Doi et al. |
| 5,777,070 A | 7/1998 | Inbasekaran et al. |
| 5,792,557 A | 8/1998 | Nakaya et al. |
| 5,807,974 A | 9/1998 | Kim et al. |
| 5,821,002 A | 10/1998 | Ohnishi et al. |
| 5,876,864 A | 3/1999 | Kim et al. |
| 5,998,045 A | 12/1999 | Chen et al. |
| 5,998,085 A | 12/1999 | Isberg et al. |
| 6,074,734 A | 6/2000 | Kawamura et al. |
| 6,107,452 A | 8/2000 | Miller et al. |
| 6,114,088 A | 9/2000 | Wolk et al. |
| 6,169,163 B1 | 1/2001 | Woo et al. |
| 6,194,119 B1 | 2/2001 | Wolk et al. |
| 6,203,933 B1 | 3/2001 | Nakaya et al. |
| 6,214,520 B1 | 4/2001 | Wolk et al. |
| 6,221,543 B1 | 4/2001 | Guehler et al. |
| 6,221,553 B1 | 4/2001 | Wolk et al. |
| 6,228,543 B1 | 5/2001 | Mizuno et al. |
| 6,228,555 B1 | 5/2001 | Hoffend et al. |
| 6,242,152 B1 | 6/2001 | Staral et al. |
| 6,284,425 B1 | 9/2001 | Staral et al. |
| 6,309,763 B1 | 10/2001 | Woo et al. |
| 6,358,664 B1 | 3/2002 | Nirmal et al. |
| 6,451,457 B1 | 9/2002 | Taguchi |
| 2002/0045719 A1 | 4/2002 | Hawker et al. |
| 2002/0158574 A1 | 10/2002 | Wolk et al. |
| 2002/0160296 A1 | 10/2002 | Wolk et al. |

FOREIGN PATENT DOCUMENTS

| | | |
|---|---|---|
| DE | 19846766 | 4/2000 |
| DE | 19846767 | 4/2000 |
| DE | 19846768 | 4/2000 |
| EP | 0 650 955 | 5/1995 |
| EP | 0 827 367 | 3/1998 |
| EP | 0 879 868 A2 | 11/1998 |
| EP | 0 891 121 | 1/1999 |
| EP | 0 953 624 A1 | 11/1999 |
| EP | 1011154 | 6/2000 |
| EP | 1074600 | 2/2001 |
| WO | WO 98/06773 | 2/1998 |
| WO | WO 99/32537 | 7/1999 |
| WO | WO 00/46321 | 8/2000 |
| WO | WO 00/70655 | 11/2000 |
| WO | WO 01/39234 A2 | 5/2001 |
| WO | WO 01/41512 A1 | 6/2001 |

OTHER PUBLICATIONS

Shi, Wei et al, "Synthesis and insecticidal activity of novel 2-fluorophenyl-5-aryl/cyclopropyl-1,3,4-oxadiazoles," J. Fluorine Chem. (2000), vol. 106, pp. 173-179.*
Detert et al, "Synthesis of substituted 1,4-divinylbenzenes by Heck reactions with compressed ethene," Journal fuer Praktische Chemie (1999), vol. 341(4), pp. 358-362, abstract in CAPLUS, Accession No. 1999:3327278.*
Dutta et al, "Studies on biologically active heterocycles. Part I . . . " J. Het. Chem, (1986), vol. 23 (3), pp. 793-795, abstract in CAPLUS, Accession No. 1987:138340.*
Mazzone et al, "Some aroylhydrazones of halobenzaldehydes and halo-subst. 2,5-diaryl-1,3,4-oxadiazoles." Farmaco, Edizione Scientifica (1978), vol. 33 (12), pp. 963-971, abstract in CAPLUS, Accession No. 1978:152086.*
Rulliere et al, "Krypton fluoride laser pumps new dyes in the 3500 A spectral range," Optics Communications (1977), vol. 20 (3), pp. 339-341, abstract in CAPLUS, Accession No. 1977:180337.*

(Continued)

*Primary Examiner*—Kamal A. Saeed
*Assistant Examiner*—Janet L Coppins
(74) *Attorney, Agent, or Firm*—Dean A. Ersfeld

(57) ABSTRACT

Electroactive polymeric arylenes and intermediates useful for making such polymers are disclosed. The present invention also provides electroactive compositions comprising the electroactive polymeric arylenes, organic electronic devices which comprise these polymers and compositions, and methods of fabricating these devices.

6 Claims, 5 Drawing Sheets

OTHER PUBLICATIONS

CAPLUS Accession No. 1968:69002. Abstract of Siegrist et al, "2,5-diaryl-1,3,4-thiadiazoles," CH 426848 (1967).*
CAPLUS Accession No. 1962:469260. Abstract of "2,5-diaryl-1,3,4-thiadiazoles," GB 899842 (1962).*
"Properties of Polymers; Their Correlation with Chemical Structure; their Numerical Estimation and Prediction from Additive Group Contributions." Third, completely revised edition by D.W. Van Krevelen; Elsevier Science Publishers B.V., 1990; Chapter 7, pp. 189-225.
Ranger et al., *Chem. Commun.* 1597-1598 (1997).
Creason et al., *J.Org.Chem.* 37, 4440-4446 (1972).
Lamansky et al., *J. Am. ☐hem.. Soc.* 123(18), 4304-4312 (2001).
Pilgram et al., *J. Heterocycl. Chem.*, 7, 629-633 (1970).
Park et al., *Tetrahedron*, 42, 12707-12714 (1998).
Zinke et al., *Chem.Ber.* 54, 107-112 (1941).
Ranger et al., *Can. J. Chem.*, 1571-1577(1998).
Otera et al., *Bull. Chem. Soc. Jpn.* 2964-2967 (1981).
Tew et al., *Angew. Chem. Int. Ed.* 39, 517(2000).
Sreenivasulu, B.; Sundaramurthy, V.; Subba Rao, *N.V. Proceedings of the Indan Academy of Sciences*, Sect A, 78, 159-168 (1973).
Koene et al., *Chem. Mater.* 10, 2235-2250 (1998).
Tokito et al., *Polym. Prep.* (Am. Chem. Soc. Div. Polym. Chem.) 38(1), 388-389, (1997).
Tanake et al., *Chem.Commun.* 2175-2176 (1996).
Tokito et al., *Appl. Phys. Lett.* 70(15), 1929-1931 (1997).
Chung et al., *Advanced Materials*, 10, 1112 (1998).
Meng et al., *Macromolecules*, 32, 8841 (1999).
Bradley et al., in Springer-Verlag Berlin Heidelberg, 1992, pp. 304-309.
Zhan et al., *Macromol.* 35, 2529-2537 (2002).
Tsuie et al., *J. Mater. Chem.* 9, 2189-2200 (1999).
Li et al., *Mat. Res. Soc. Symp. Proc.* 413, 13-22 (1996).
Bernius et al., *Advanced Mater.* 12, 1737-1750 (2000).
Millard, *Synthetic Metals*, 111-112, 119-123 (2000).
Neher et al., *Macromol. Rapid Commun.* 22, 1365-1385 (2001).
Yammamoto et al. (*Macromolecules*, 25, 1214-1223 (1992).
Colon et al. (*J. Polym. Sci., Polym. Chem.* 28, 367-383 (1990).
Ueda et al. (*Macromolecules*, 24, 2694-2697 (1991).
Miyaura and Suzuki (*Chemical Reviews*, 95, 2457-2483 (1995).
Myznikov et al., *J. Ge. Chem. Of USSR*, 62 (6), 1125-1128 (1992).
Grekow et al., *J. Gen. Chem. USSR* (*Engl.Transl.*), 30, 3763-3766 (1960).
A.T. Prudchenko, *J.Gen.Chem.USSR* (*Engl. Transl.*), 37, 2082-2084(1967).
V (E. Klingsberg, *J. Org. Chem.* 23, 1086(1958).

Moss et al., *J. Chem. Soc.* Perkin Trans. 1, 9, 1999-2006 (1982).
Gautun et al., *Acta Chem. Scand.* 45(6), 609-615 (1991).
Yoon et al., *J. Chem. Soc., Chem. Commun.* 13, 1013-1014 (1987).
Bokova et al., *J. Org. Chem.* USSR (Engl.Transl.), 5, 1103-1106 (1969).
Schidlo et al., *Chem Ber.*, 96, 2595-2600 (1963).
Rule et al., *J. Chem. Soc.* 1096-1101 (1937).
Namkung et al., *J. Med. Chem. Soc.* 8, 551-554 (1965).
Huntress et al., *J. Am. Chem. Soc.* 55, 4262-4270 (1933).
Fritsch et al., *Chem Ber.* 125, 849-855 (1992).
Meng et al., *J.Am. Chem. Soc.* 123(37), 9214-9215 (2001).
H. Fujikawa et al., *Synthetic Metals*, 91, 161 (1997).
Strukelj et al., *Science*, 267, 1969 (1995).
Jang et al., *J. Appl. Phys.*, 87(6), 3183-3185 (2000).
Peng et al., *Polymer Prep.*, 41(1), 881-882 (2000).
Kraft et al., *Angew. Chem. Int. Ed.*, 37, 402-428 (1998).
J.V. Grazulevicius, P. Strohriegl, "Charge-Transporting Polymers and Molecular Glasses", *Handbook of Advanced Electronic and Photonic Materials and Devices*, H.S. Nalwa (ed.), 10, 233-274 (2001).
Bettenhbausen et al., *Synthetic Metals*, 91, 223 (1997).
Tokito et al., *Synthetic Metals*, 111-112, 393-396 (2000).
C.H. Chen, et al., *Macromol. Symp.* 125, 1 (1997).
Peng et al., "Novel oxadiazole-containing conjugated polymers as efficient single-layer light-emitting diodes", *Synthetic Metals*, 105, 73-78 (1999).
Bao et al., "Novel Oxadiazole Side Chain Conjugated Polymers as Single-Layer Light-Emitting Diodes with Improved Quantum Efficiencies", *Chemistry of Materials*, 10, 1201-1204 (1998).
U.S. Appl. No. 09/451,984, filed Nov. 30, 1999, Thermal Transfer of Microstructured Layers.
U.S. Appl. No. 09/662,980, filed Sep. 15, 2000, Selective Thermal Transfer of Light Emitting Polymer Blends.
U.S. Appl. No. 09/853,062, filed May 10, 2001, Electrode Fabrication Methods for Organic Electroluminescent Devices.
U.S. Appl. No. 09/931,598, filed Aug. 16, 2001, Method and Materials for Patterning of an Amorphous, Non-Polymeric, Organic Matrix with Electrically Active Material Disposed Therein.
U.S. Appl. No. 10/004,706, filed Dec. 4, 2001, Method and Materials for Transferring a Material onto a Plasma Treated Surface According to a Pattern.
U.S. Appl. No. 60/374,044, filed Apr. 19, 2002, Electroluminescent Materials and Methods of Manufacture and Use.
International Search Report.

* cited by examiner

ELECTROACTIVE POLYMERS

TECHNICAL FIELD

This invention relates to electroactive polymers, compositions and organic electronic devices comprising the electroactive polymers.

BACKGROUND

Organic electronic devices such as organic electroluminescent (OEL) devices, including organic light emitting diodes (OLEDs), are desirable for use in electronic media because of their thin profile, low weight, capability of obtaining a wide variety of emission colors, and low driving voltage. OLEDs have potential use in applications such as backlighting of graphics, pixelated displays, and large emissive graphics.

There has been continuing research and development of electroluminescent materials, electroactive materials, and charge transporting materials suitable for such devices and methods for making the devices. In some instances, materials have been selected or developed which facilitate one or more of these methods.

Pattern-wise thermal transfer of materials from donor sheets to receptor substrates has been proposed as one method for forming OEL devices. Selective thermal transfer of organic light emitters for formation of organic electroluminescent devices has been shown to be particularly useful.

There remains a need in the art for electroactive polymers and electroluminescent polymers that may be used in these devices and methods.

SUMMARY OF THE INVENTION

The present invention provides electroactive, charge transporting or electroluminescent arylene polymers. In some embodiments, these polymers have improved electron transport and electron injection properties. The present invention also provides electroactive compositions, which comprise at least one of these arylene polymers. The present invention also provides novel intermediates for making such polymers. The present invention further provides organic electronic devices comprising these arylene polymers. The present invention further provides methods and materials for making organic electronic devices from these materials including selective thermal patterning of electroactive materials comprising the arylene polymers onto a receptor. Organic electroluminescent devices, which can easily be produced using the present arylene polymers, have high luminous efficiency and long service life.

In one aspect the present invention comprises an electroactive polymeric arylene. The electroactive polymeric arylene comprises a conjugated internal region, end capping groups, and optionally a soft segment; wherein the conjugated internal region comprises three or more arylene units, each of said arylene units being covalently bonded to two adjacent arylene units, to an adjacent arylene unit and to an end capping group, or to an adjacent arylene unit and to the soft segment if present; wherein one or more of the arylene units of the internal region have the structure of Formula I

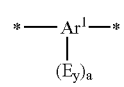

wherein $Ar^1$ is a phenylene or naphthylene group arylene that is unsubstituted or substituted with one or more groups selected from alkyl, alkenyl, alkoxy, fluoro, aryl, fluoroalkyl, heteroalkyl, heteroaryl, and hydrocarbyl containing one or more S, N, O, P, or Si atoms; where a is 1 or 2; where each $E_y$ is independently selected from groups having the structures of Formulas II and III

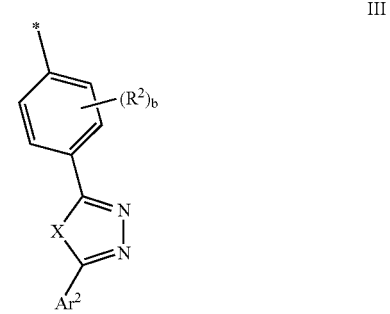

wherein X is O, S, or $NR^1$, where $R^1$ is alkyl, aryl, heteroaryl, or heteroalkyl; wherein each $R^2$ is independently selected from alkyl, alkoxy, fluoro, aryl, fluoroalkyl, heteroalkyl, and heteroaryl; wherein b is 0, 1, or 2; wherein $Ar^2$ is a carbocyclic aryl group, unsubstituted or substituted with one or more substituents selected from alkyl, alkenyl, alkoxy, fluoro, aryl, fluoroalkyl, heteroalkyl, heteroaryl, alkyloxadiazolyl, aryloxadiazolyl, alkyltriazolyl, aryltriazolyl, and hydrocarbyl containing one or more S, N, O, P, or Si atoms; and wherein the end capping groups are each independently selected from carbocyclic aryl, heteroaryl, and tertiary aromatic amino groups that are electrochemically stable, wherein each end capping group is conjugated to the conjugated internal region or bonded to the soft segment if present, and wherein each end capping group is unsubstituted or substituted with one or more groups selected from alkyl, alkenyl, alkoxy, aryl, fluoroalkyl, heteroalkyl, heteroaryl, and hydrocarbyl containing one or more S, N, O, P, or Si atoms.

In one embodiment the electroactive polymeric arylene described above further comprises one or more comonomer units independently selected from carbocyclic arylene, heteroarylene, and tertiary aromatic amino arylene groups that modify one or more properties of the electroactive polymeric arylene selected from light absorption, light emission, ionization potential, electron transport, hole transport, electroluminescence, and solubility parameter. Preferably the comonomer units are conjugated with $Ar^1$ of Formula I. The comonomer units are unsubstituted or substituted with one or more groups selected from alkyl, alkenyl, alkoxy, fluoro, aryl, fluoroalkyl, heteroalkyl, heteroaryl, and hydrocarbyl containing one or more S, N, O, P, or Si atoms.

In a second aspect, the present invention also relates to novel intermediates useful for making the electroactive polymeric arylenes. More specifically, this invention relates to monomer units having the structure of Formula IV:

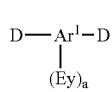

IV where $Ar^1$, $E_y$, and a are as described for Formula I; and where D is a reactive group selected from chlorine, bromine, iodine, boronic acid, and boronic ester.

In a third aspect, the present invention also provides electroactive compositions that comprise one or more of the electroactive polymeric arylenes.

In a fourth aspect, the present invention also provides organic electronic devices that comprise the electroactive polymeric arylenes or the electroactive compositions of the present invention.

In a fifth aspect, the present invention also provides a donor sheet comprising a composition, which comprises one or more of the present electroactive polymeric arylenes and a method for making an organic electronic device comprising the step of selectively transferring a composition, which comprises one or more of the present electroactive polymeric arylenes, from the donor sheet to a receptor substrate.

BRIEF DESCRIPTION OF THE DRAWINGS

The invention may be more completely understood in consideration of the following detailed description of various embodiments of the invention in connection with the accompanying drawings, in which.

DETAILED DESCRIPTION OF THE INVENTION

Definitions

Figure 1:
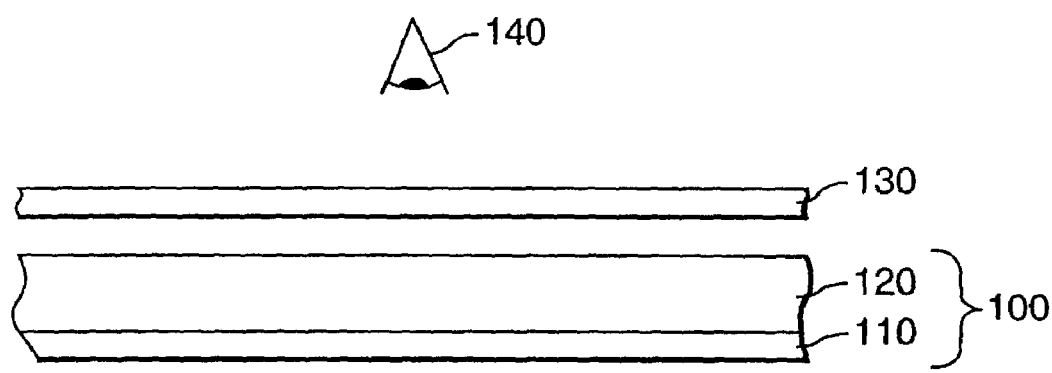
FIG. 1 is a schematic side view of an organic electroluminescent display construction of the present invention.

As used herein, "a" or "an" or "the" are used interchangeably with "at least one", to mean "one or more" of the element being modified.

Unless otherwise indicated, the term "alkyl" includes both straight-chained, branched, and cyclic alkyl groups and includes both unsubstituted and substituted alkyl groups. Unless otherwise indicated, the alkyl groups typically contain from 1 to 20 carbon atoms. Examples of "alkyl" as used herein include, but are not limited to, methyl, ethyl, n-propyl, n-butyl, n-pentyl, isobutyl, t-butyl, isopropyl, n-octyl, n-heptyl, ethylhexyl, and the like.

Unless otherwise indicated, the term "heteroalkyl" includes both straight-chained, branched, and cyclic alkyl groups with one or more heteroatoms independently selected from S, O, N, P, and Si and includes both unsubstituted and substituted alkyl groups. Unless otherwise indicated, the heteroalkyl groups typically contain from 1 to 20 carbon atoms. "Heteroalkyl" is a subset of "hydrocarbyl containing one or more S, N, O, P, or Si atoms" described below. Examples of "heteroalkyl" as used herein include, but are not limited to methoxy, ethoxy, propoxy, 3,6-dioxaheptyl, 3-(trimethylsilyl)-propyl, 4-dimethylaminobutanyl, and the like.

Unless otherwise indicated, the term "alkenyl" includes both straight-chained, branched, and cyclic alkene groups having one or more aliphatic carbon-carbon double bonds and includes both unsubstituted and substituted alkenyl groups. Unless otherwise indicated, the alkenyl groups typically contain from 1 to 20 carbon atoms. Examples of "alkenyl" as used herein include, but are not limited to, n-oct-3-enyl, n-hept-6-enyl, and the like.

In the present invention, the term "aryl" includes carbocyclic aryl, heteroaryl, and tertiary aromatic amino aryl.

Unless otherwise indicated, the term "carbocyclic aryl" refers to monovalent aromatic carbocyclic radicals having one to fifteen aromatic rings, such as phenyl, biphenyl, phenylene group aryl as defined infra, or multiple fused rings, such as naphthyl or anthryl, or combinations thereof. Examples of suitable carbocyclic aryl as used herein include phenyl, biphenyl, naphthyl, acenaphthyl, phenanthryl, anthracenyl, fluorenyl, 9-silafluorenyl, dihydrophenanthryl, perylenyl, spirobisfluorenyl, fluoranthenyl, pyrenyl, dihydropyrenyl, tetrahydropyrenyl, rubrenyl, chrysenyl, benzo[g,h,i]perylenyl, and the like. When the carbocyclic aryl contains phenylene rings fused with divalent alkylene, dialkylsilylene, or diarylsilylene radicals, these radicals are substituted with two or more $R^3$ groups wherein each $R^3$ is independently selected from hydrogen, $C_{1-30}$ alkyl, $C_{1-30}$ alkenyl, $C_{6-20}$ aryl, $C_{3-20}$ heteroaryl, and $C_{1-30}$ hydrocarbyl containing one or more S, N, O, P, or Si atoms.

In the present invention, the "arylene", "arylene monomer", and "arylene unit" include carbocyclic arylene, heteroarylene, and tertiary aromatic amino arylene.

Unless otherwise indicated, the term "carbocyclic arylene" refers to divalent aromatic carbocyclic radicals having one to fifteen aromatic rings, such as phenylene, phenylene group arylene as defined infra, or multiple fused rings, such as naphthylene or anthrylene, or combinations thereof. Examples of suitable "carbocyclic arylene" as used herein include benzene-1,3-diyl, benzene-1,4-diyl, naphthalene-2,7-diyl, naphthalene-2,6-diyl, naphthalene-1,4-diyl, naphthalene-1,5-diyl, acenaphthenediyl, phenanthen-3,8-diyl, 5,6-dihydrophenathren-3,8-diyl, 4,5,9,10-tetrahydropyren-2,7-diyl, pyren-2,7-diyl, fluoren-2,7-diyl, 9-silafluoren-2,7-diyl, anthracene-9,10-diyl, perylene-3,9-diyl, perylene-3,10-diyl, spirobisfluorenediyl, fluoranthenediyl, rubrenediyl, chrysenediyl, benzo[g,h,i]perylenediyl and the like. When the carbocyclic arylene contains phenylene rings fused with divalent alkylene, dialkylsilylene, or diarylsilylene radicals, these radicals are substituted with two or more $R^3$ groups wherein each $R^3$ is independently selected from hydrogen, $C_{1-30}$ alkyl, $C_{1-30}$ alkenyl, $C_{6-20}$ aryl, $C_{3-20}$ heteroaryl, and $C_{1-30}$ hydrocarbyl containing one or more S, N, O, P, or Si atoms.

Unless otherwise indicated, the term "phenylene group arylene" refers to divalent aromatic carbocyclic radicals having one, two, or three conjugated phenylene rings (e.g. phenylene, biphenylene, and triphenylene) that are optionally fused with divalent alkylene, dialkylsilylene, or diarylsilylene radicals. Examples of suitable "phenylene group arylene" as used herein include benzene-1,3-diyl, benzene-1,4-diyl, 5,6-dihydrophenathren-3,8-diyl, 4,5,9,10-tetrahydropyren-2,7-diyl, fluoren-2,7-diyl, 9-silafluoren-2,7-diyl, spirobisfluoren-2,7-diyl, 6,12-dihydroindeno[1,2-b]fluorene-2,8-diyl, 5,6,12,13-tetrahydrodibenzo[a,h]anthracene-3,10-diyl, 5,12-dihydro-6H-indeno[1,2-b]phenathrene-3,10-diyl, and the like.

Unless otherwise indicated, the term "phenylene group aryl" refers to monovalent unsaturated aromatic carbocyclic radicals having one, two, or three conjugated phenyl or phenylene rings (e.g. phenyl, biphenyl, and terphenyl) that are optionally fused with divalent alkylene, dialkylsilylene, or diarylsilylene radicals. Examples of suitable "phenylene group aryl" as used herein include phenyl, 5,6-dihydrophenathrenyl, 4,5,9,10-tetrahydropyrenyl, fluorenyl, 9-silafluorenyl, spirobisfluorenyl, 6,12-dihydroindeno[1,2-b]fluorenyl, 5,6,12,13-tetrahydrodibenzo[a,h]anthracenyl, 5,12-dihydro-6H-indeno[1,2-b]phenathrenyl, and the like.

Unless otherwise indicated, the term "naphthalene group arylene" refers to divalent unsaturated aromatic carbocyclic radicals having a fused naphthalene ring structure, which can be fused with a divalent alkylene radical. Examples of suitable "naphthalene group arylene" as used herein include naphthalene-2,7-diyl, naphthalene-2,6-diyl, naphthalene-1,4-diyl, naphthalene-1,5-diyl, and acenaphthene-diyl.

Unless otherwise indicated, the term "naphthalene group aryl" refers to monovalent unsaturated aromatic carbocyclic radicals having a fused naphthalene ring structure, which can be fused with a divalent alkylene radical. Examples of suitable "naphthalene group aryl" as used herein include naphthalen-2-yl, naphthalen-1-yl, naphthalen-7-yl, naphthalen-6-yl, naphthalen-4-yl, naphthalen-5-yl, and acenaphthenyl.

Unless otherwise indicated, the term "heteroaryl" refers to an aromatic monovalent radical comprising a monovalent five—to seven—membered aromatic ring radical with one or more heteroatoms independently selected from S, O, N, and Si. Such a heteroaryl ring may be optionally fused to one or more heterocyclic ring(s), carbocyclic aryl ring(s), cycloalkenyl ring(s), cycloalkyl ring(s), or to one or more of another heteroaryl ring(s). Examples of "heteroaryl" used herein include, but are not limited to, furyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuryl, benzothiophenyl, indolyl, carbazoyl, benzoxazolyl, benzothiazolyl, benzimidazolyl, cinnolinyl, quinazolinyl, quinoxalinyl, phthalazinyl, benzothiadiazolyl, benzotriazinyl, phenazinyl, phenanthridinyl, acridinyl, and indazolyl, siloles, and the like.

Unless otherwise indicated, the term "heteroarylene" refers to an aromatic divalent radical comprising a five—to seven—membered aromatic ring radical with one or more heteroatoms independently selected from S, O, N, and Si. Such a heteroarylene ring may be optionally fused to one or more heterocyclic ring(s), heteroaryl ring(s), carbocyclic aryl ring(s), cycloalkenyl ring(s), or cycloalkyl ring(s). Examples of "heteroarylene" used herein include furan-2,5-diyl, thiophene-2,4-diyl, 1,3,4-oxadiazole-2,5-diyl, 1,3,4-thiadiazole-2,5-diyl, 1,3-thiazole-2,4-diyl, benzo[1,2,5]thiadiazole-4,7-diyl, 1,3-thiazole-2,5-diyl, pyridine-2,4-diyl, pyridine-2,3-diyl, pyridine-2,5-diyl, pyrimidine-2,4-diyl, quinoline-2,3-diyl, 1,1-dialkyl-1H-silole-2,5-diyl, and the like.

Unless otherwise indicated, the term "condensed polycyclic arylene" refers to a subset of the "carbocyclic arylenes" as defined above that comprise three to fifteen fused aromatic rings. For example, "condensed polycyclic arylene" used herein include acenaphthylene, phenanthrene, anthracene, fluoranthene, pyrene, perylene, benzoperylene, rubrene, chrysene, and corene.

Unless otherwise indicated, the term "heteroarylenes comprising imine linkages" refers to a subset of the "heteroarylenes" as defined above that comprise an imine linkage. Examples of suitable "heteroarylenes comprising imine linkages" include oxadiazoles, N-substituted-triazoles, N-substituted imidazoles, N-substituted pyrazole oxazoles, isooxazoles, thiazoles, isothiazoles, pyridines, pyridazines, pyrimidines, pyrazines, triazines, tetrazenes, benzoxazoles, benzothiazoles, benzothiadiazoles, quinolines, isoquinolines, cinnolines, quinazolines, quinoxalines, phthalazines, benzotriazines, phenazines, phenanthridines, acridines.

Unless otherwise indicated, the term "heteroaryls comprising imine linkages" refers to a subset of the "heteroaryls" as defined above that comprise an imine linkage. Examples of suitable "heteroaryls comprising imine linkages" include oxadiazolyls, N-substituted-triazolyls, N-substituted imidazolyls, N-substituted pyrazolyls, oxazolyls, isooxazolyls, thiazolyls, isothiazolyls, pyridinyls, pyridazinyls, pyrimidinyls, pyrazinyls, triazinyls, tetrazenyls, benzoxazolyls, benzothiazolyls, benzothiadiazolyls, quinolinyls, isoquinolinyls, cinnolinyls, quinazolinyls, quinoxalinyls, phthalazinyls, benzotriazinyls, phenazinyls, phenanthridinyls, and acridinyls.

Unless otherwise indicated, the term "heteroarylenes that are electron rich" refers to a subset of the "heteroarylenes" that are electron rich. Heteroarylenes that are electron rich can donate electron density from the heteroatom of the heteroarylene into aπ system that is conjugated to a neighboring π system. Heteroarylenes that are electron rich exhibit electron donating ability that exceeds the electron donating ability of heteroarylenes comprising imine linkages. For example, "heteroarylenes that are electron rich" include diarylsilanoles, thiophenes, bithiophenes, furans, N-alkyl and N-aryl carbazoles, and N-alkyl pyrroles.

Unless otherwise indicated, the term "heteroaryls that are electron rich" refers to a subset of the "heteroaryls" that are electron rich. Heteroaryls that are electron rich exhibit electron donating ability that exceeds the electron donating ability of heteroaryls comprising imine linkages. For example, "heteroaryls that are electron rich" include diarylsilanolyls, thiophenyls, bithiophenyls, and furanyls.

Unless otherwise indicated, the term "tertiary aromatic amine" refers to a class of molecular compounds comprising one or more tertiary nitrogen centers, each bonded to three aromatic carbon centers. Examples of suitable "tertiary aromatic amines" used herein include diarylanilines, alkylcarbazole, arylcarbazole, tetraaryldiamines such as N,N,N'N'-tetraarylbenzidines, N,N,N',N'-tetraaryl-1,4-phenylenediamines, N,N,N'N'-tetraryl-2,7-diaminofluorene derivatives such as those taught in EP 0 953 624 A1 and EP 0 879 868 A2 (both Canon Kabushiki Kaisha), N,N'-bis(3-methylphenyl)-N,N'-bis(phenyl)benzidine (also known as TPD), N,N'-bis(3-naphthalen-2-yl)-N,N'-bis(phenyl)benzidine (also known as NPB), 1,4-bis(carbazolyl)biphenyl (also known as CBP), other tetraaryldiamine derivatives such as those described in Koene et al., Chem. Mater. 10, 2235–2250 (1998), and in U.S. Pat. Nos. 5,792,557 and 5,550,290, and EP 0891121; peraryltriamine derivatives such as those described in U.S. Pat. No. 6,074,734 and EP 0827367, starburst amine derivatives such as 4,4',4"-tris(N,N-diarylamino)triphenylamines and 1,3,5-tris(4-(N,N-diarylamino)phenyl)benzenes, 4,4',4"-tris(N,N-diphenylamino)triphenylamine (also known as TDATA), 1,3,5-tris(4-(N,N-diphenylamino)phenyl)benzenes (TDAPBs), and other dendridic and spiro amine derivatives as taught in EP 0650955; Tokito et al., Polym. Prep. (Am. Chem. Soc. Div. Polym. Chem.) 38(1), 388–389, (1997); Tanake et al., Chem. Commun. 2175–2176 (1996); and Tokito et al., Appl. Phys. Lett. 70(15), 1929–1931 (1997).

Unless otherwise indicated, the term "tertiary aromatic amino aryl" refers to a monovalent aromatic ring radical of a tertiary aromatic amine as defined above.

Unless otherwise indicated, the term "tertiary aromatic amino arylene" refers to a divalent unsaturated aromatic carbocyclic radical of a tertiary aromatic amine as defined above.

Unless otherwise indicated, the term "hydrocarbyl" refers to monovalent radicals containing aliphatic or aromatic groups, or combinations thereof. Unless otherwise indicated, the hydrocarbyl groups typically contain from 1 to 60 carbon atoms. Hydrocarbyls containing one or more S, N, O, P, or Si atoms are also called out. Some examples of such hydrocarbyls as used herein include, but are not limited to methoxy, ethoxy, propoxy, 4-diphenylaminobutanyl, 2-(2'-phenoxyethoxy)ethyl, 3,6-dioxaheptyl, 3,6-dioxahexyl-6-phenyl, 9-sila-9,9-(3,6-dioxaheptyl )fluoren-2-yl, and —[Ar]$_P$-SS-R" where Ar is carbocyclic arylene or heteroarylene, p is 0 or 1, R" is a sterically hindering functional group such as an aryl, heteroaryl, or a branched alkyl, and SS is a soft segment moiety defined below.

Unless otherwise indicated, the terms "soft segment", SS, or "soft segment moiety" refers to a divalent aliphatic group which includes two or more groups each independently selected from ethers, fluoroalkylene, perfluoroalkylene, teriary amines, thioethers, dialkylsiloxanes, and dialkoxysiloxanes. Examples of suitable soft segment moieties include, for example, poly(oxyalkylene) groups (e.g., —O($C_qH_{2q}$O)$_s$ — where q is an integer in the range of 1 to 6 and s is an integer in the range of 2 to 20) and poly(dialkylsiloxanes) (e.g., [—Si($C_rH_{2r+1}$)$_2$O—]$_n$, where r is an integer in the range of 1 to 10 and n is an integer in the range of 2 to 20). Preferably, SS is a poly(oxyalkylene) containing from 2 to 20 carbon atoms.

Unless otherwise indicated, each of the above alkyl, alkenyl, carbocyclic aryl, carbocyclic arylene, heteroalkyl, heteroaryl, heteroarylene, polycyclic arylene, and hydrocarbyl groups is unsubstituted or substituted with one or more groups, each independently selected from $C_{1-30}$ alkyl, $C_{1-30}$ alkenyl, $C_{1-30}$ alkoxy, $C_{6-20}$ aryl, $C_{1-30}$ heteroalkyl, $C_{1-60}$ hydrocarbyl containing one or more S, N, O. P, or Si atoms, $C_{3-20}$ heteroaryl, $C_{6-20}$ aryloxy, $C_{1-30}$ thioalkyl, $C_{6-20}$ thioaryl, diarylamino, fluoro, cyano, —COO—alkyl, fluoroalkyl, and perfluoroalkyl.

Unless otherwise indicated, the term "copolymer" refers to polymers having two or more different divalent monomer units.

By "electrochemically stable" is meant stable to electrochemical degradation such that any oxidation and/or reduction reactions entered into are reversible.

An asterisk (*) in any of the structures infra indicates the bond to an adjacent group or unit of the compound or polymer in which the structure resides.

Polymers

The electroactive polymeric arylenes described herein can be useful in organic electronic devices, and in particular OLEDs. In some embodiments, the electroactive polymeric arylenes have improved electron transport and electron injection properties compared with polymeric arylenes that do not contain arylene units of the Formula I. OLEDs comprising these electroactive polymeric arylenes can have increased light emission quantum efficiencies and/or reduced operating voltages compared with OLEDs without the electroactive polymeric arylenes. The increased efficiencies can also be maintained over time and repeated use. Such electroactive polymeric arylenes comprise a conjugated internal region, end capping groups, and optionally a soft segment. Each arylene unit of the internal region is covalently bonded to two adjacent arylene units, to an adjacent arylene unit and to an end capping group, or to an adjacent arylene unit and to the soft segment if present. Vinylene and acetylene units are generally not included in the conjugated internal region of the polymeric arylene because of the low band-gap and low external quantum efficiencies found with poly(phenylenevinylenes) (PPV) (see Chung et al., Advanced Materials, 10, 1112 (1998) and Meng et al., Macromolecules, 32, 8841 (1999)).

At least two of the arylene units of the conjugated internal region have the structure of Formula I:

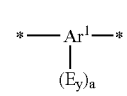

where Ar$^1$ is a carbocyclic arylene group, preferably a phenylene group arylene or a naphthalene group arylene, unsubstituted or substituted on one or more of the aromatic rings with one or more groups (R$^y$) selected from alkyl, alkenyl, alkoxy, fluoro, aryl, fluoroalkyl, heteroalkyl, heteroaryl, hydrocarbyl containing one or more S, N, O, P, or Si atoms; where a is 1 or 2; where each E$_y$ is independently selected from groups having the structures of Formulas II and III

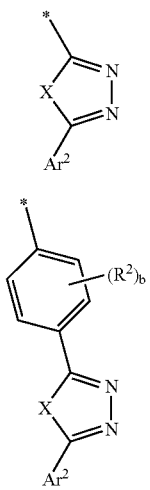

wherein X is O, S, or NR¹, where R¹ is alkyl, aryl, heteroaryl, or heteroalkyl; wherein each R² is independently alkyl, alkenyl, alkoxy, fluoro, aryl, fluoroalkyl, heteroalkyl, or heteroaryl; wherein b is 0, 1, or 2; wherein Ar² is a carbocyclic aryl group, unsubstituted or substituted on one or more of the aromatic rings with one or more groups (R²) selected from alkyl, alkenyl, alkoxy, fluoro, aryl, fluoroalkyl, heteroalkyl, heteroaryl, alkyloxadiazolyl, aryloxadiazolyl, alkyltriazolyl, aryltriazolyl, diarylaminoaryl, diarylamino, and hydrocarbyl containing one or more S, N, O, P, or Si atoms.

The end capping groups (EC) are each independently selected from carbocyclic aryl, heteroaryl, and tertiary aromatic amino groups that are electrochemically stable and unsubstituted or substituted with one or more groups selected from alkyl, alkoxy, alkenyl, aryl, fluoroalky, heteroalkyl, heteroaryl, and hydrocarbyl containing one or more S, N, O, P, or Si atoms, each end capping group being conjugated to the conjugated internal region or bonded to the soft segment if present.

In some embodiments the electroactive polymeric arylenes of the present invention have been found to remain amorphous at temperatures above their glass transition temperature. In some embodiments it as also been found that the color of light emission from light emitting electroactive polymeric arylenes of the present invention remains stable during thermal aging. That is, the color of the emitted light does not appreciably change during thermal aging. In some embodiments the emission color that does not shift is blue.

Substituents that are known to be photoluminescent quenchers, such as arylcarbonyls and nitro, may be undesireable as they degrade electroluminescence efficiency in OLEDs. Substituents that are known to undergo electrochemical elimination reactions, such as alkylamines, may be undesireable because they degrade the operating lifetime of OLEDs. Substituents comprising titratable protons that can undergo electrochemical reduction, such as primary or secondary amines, phenols, alcohols and the like, may be undesireable since they can be reduced to hydrogen during OLED operation, and lead to delamination of the cathode and ultimate failure of the OLED. Chlorine, bromine, iodine, boronic acid, and boronic ester substitutents can cause electrochemical instability and are typically present in the electroactive polymeric arylenes of the present invention in an amount less than 1000 part per million (ppm) by weight of the polymer, for example, less than 100 ppm. Parafluorophenyl may not be desirable as a capping group because it is susceptible to irreversible electrochemical degradation.

The end capping group (EC) can serve many functions relevant to OLED device performance and to the fabrication of these devices. The stable carbocyclic aryl capping groups mentioned above include phenylene group and naphthalene group aryls and condensed polycyclic aryls. The phenylene group and naphthalene group aryls can provide an electrochemically stable end group, while also providing an electron affinity for the highest occupied molecular orbital (HOMO) and an ionization potential for the lowest unoccupied molecular orbital (LUMO) that are well matched to the conjugated polymer backbone structures comprising Ar¹ groups. By well matched it is meant that the HOMO and LUMO of EC are close in energy (for example, 0.5 eV or 0.25 eV) to the HOMO and LUMO, respectively, of the conjugated internal region of the polymer. This energy match and a large bandgap between the HOMO and LUMO are particularly important when a high bandgap polymer is desired for use as an electron transport agent, a hole blocker, as a host polymer for molecular blue emitters, or as a blue emitting electroluminescent polymer. In these cases, low energy traps must be avoided as they can degrade device performance.

Stable condensed polycyclic aryl, heteroaryl or tertiary aromatic amino aryl end capping groups mentioned above can provide an electrochemically stable end group, while also introducing redox active functional groups that can further enhance electron transport character, introduce hole transport character, enhance or modify the band gap and/or electroluminescent character of the polymer. Certain of these end capping groups, when incorporated at terminal positions in a polymeric arylene of the present invention, will give rise to specific emissions, for example, red, green, or blue. This is particularly useful when tuning the emission wavelength of an electroluminescent oligomer or polymer comprising arylene units of Formula I. The stable condensed polycyclic aryl end capping groups can modify energetics to stabilize terminal positions with respect to excimer formation and emission wavelength. The stable heteroaryl or tertiary aromatic amino aryl capping groups are also important when balancing the hole and electron transport efficiencies, or tuning the ionization potential and/or electron affinity of the end capping group to other conjugated units of an electroactive and /or electroluminescent polymer comprising arylene units of Formula I, for example to improve the electroluminescent quantum efficiency for the polymer, or to energetically match the polymer to a molecular emitter in molecularly doped polymer film constructions for OLEDs. In addition, these groups may be sufficiently sterically hindering to reduce the formation of intermolecular or intramolecular configurations (of the light emitting polymers) that produce excimer or exciplex emission that can cause color shifting of the electroluminescence.

Examples of carbocyclic arylene groups and substitution patterns useful for —Ar¹(E$_y$)$_a$- are represented by Formulas XI–XLIII below, each of which is a subgenus of Formula I, wherein each E$_y$ is independently selected from the pendant groups of Formulas II and III above, wherein Ar¹ is unsubsituted or substituted on one or more of the aromatic rings with one or more groups (R$^y$); wherein each R³ is independently selected from hydrogen, $C_{1-30}$ alkyl, $C_{1-30}$ alkenyl, $C_{6-20}$ aryl, $C_{3-20}$ heteroaryl, and $C_{1-30}$ hydrocarbyl containing one or more S, N, O, P, or Si atoms; and wherein R$^y$ is independently selected from fluoro, $C_{1-20}$ fluoroalkyl, $C_{1-20}$ perfluoroalkyl, $C_{1-20}$ alkyl, $C_{1-20}$ alkenyl, $C_{6-20}$ aryl, $C_{3-20}$ heteroaryl, and $C_{1-30}$ hydrocarbyl containing one or more S, N, O, P, or Si atoms.
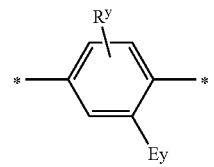
XI
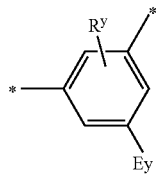
XII
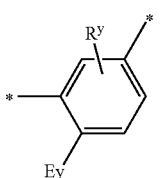
XIII
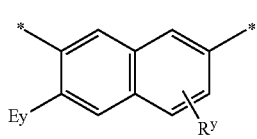
XIV
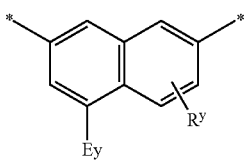
XV
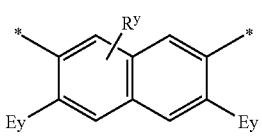
XVI
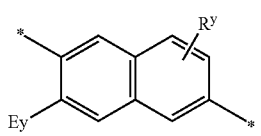
XVII
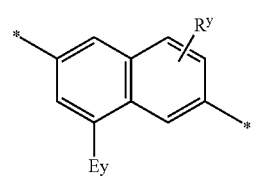
XVIII
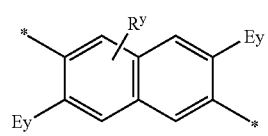
XIX
-continued
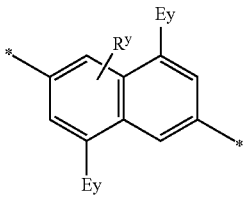
XX
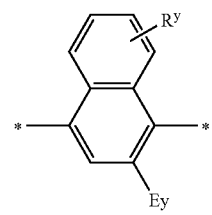
XXI
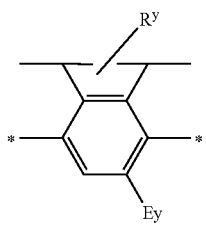
XXII
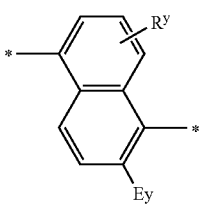
XXIII
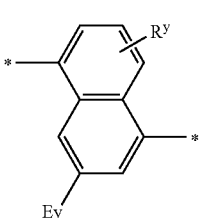
XXIV
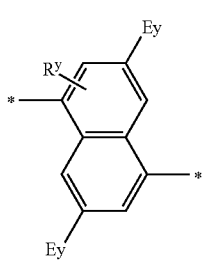
XXV
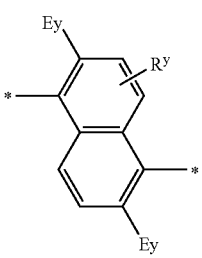
XXVI -continued
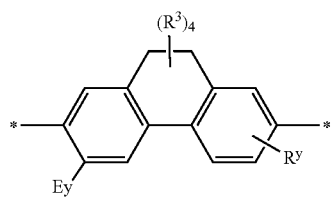
XXVII
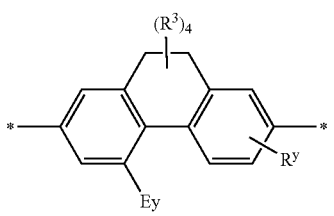
XXVIII
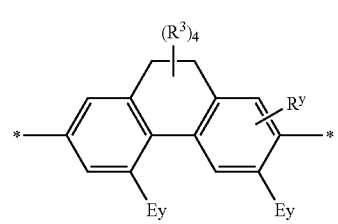
XXIX
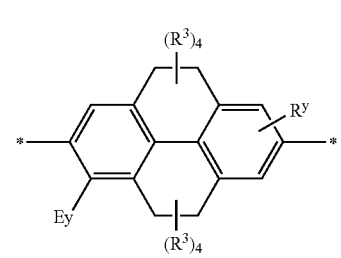
XXX
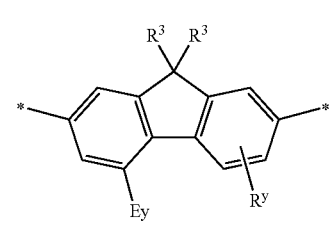
XXXI
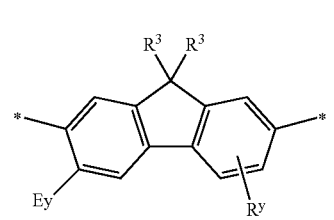
XXXII
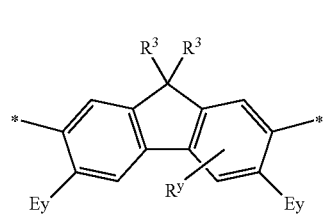
XXXIII
-continued
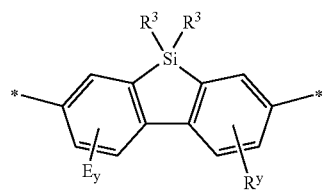
XXXIV
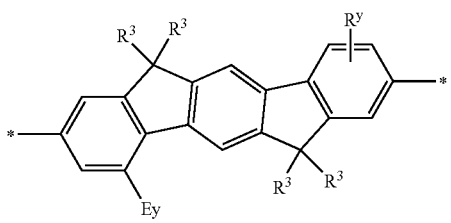
XXXV
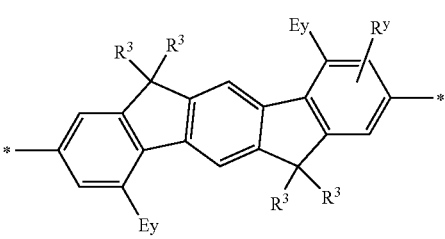
XXXVI
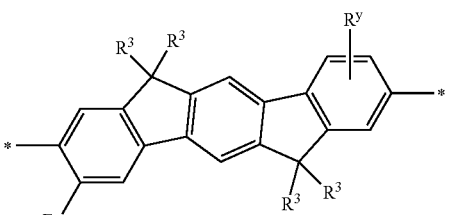
XXXVII
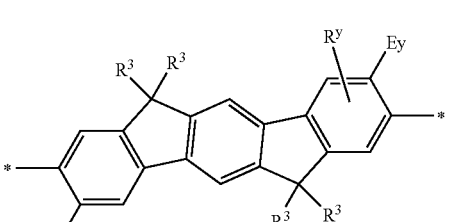
XXXVIII
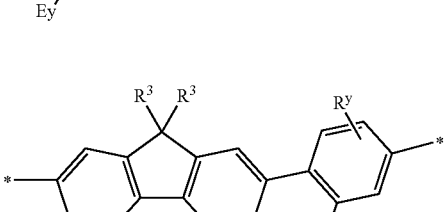
XXXIX
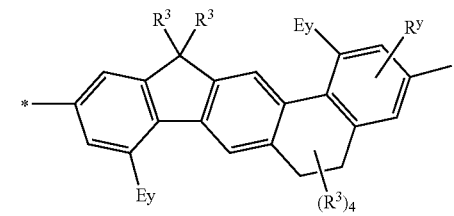
XL -continued

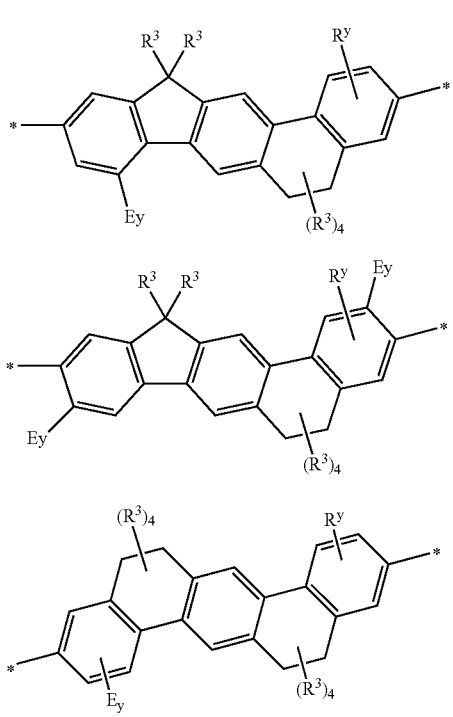

XLI

XLII

XLIII

Some examples of carbocyclic aryl groups and substitution patterns useful for $Ar^2$ are represented by Formulas XLIV–LIV below where $Ar^2$ is unsubstituted or substituted on one or more of the aromatic rings with one or more groups ($R^z$); where $R^3$ is independently in each case hydrogen, $C_{1-30}$ alkyl, $C_{1-30}$ alkenyl, $C_{6-20}$ aryl, $C_{3-20}$ heteroaryl, or $C_{1-30}$ hydrocarbyl containing one or more S, N, O, P, or Si atoms; where $R^z$ is independently in each case fluoro, $C_{1-20}$ fluoroalkyl, $C_{1-20}$ perfluoroalkyl, $C_{1-20}$ alkyl, $C_{1-20}$ alkenyl, $C_{6-20}$ aryl, $C_{3-20}$ heteroaryl, $C_{1-30}$ hydrocarbyl containing one or more S, N, O, P, or Si atoms; $C_{3-30}$ alkyloxadiazolyl, $C_{3-30}$ aryloxadiazolyl, $C_{3-30}$ alkyltriazolyl, $C_{3-30}$ aryltriazolyl; and where X is O, S, or NR, wherein $R^1$ is alkyl, aryl, heteroaryl, or heteroalkyl.

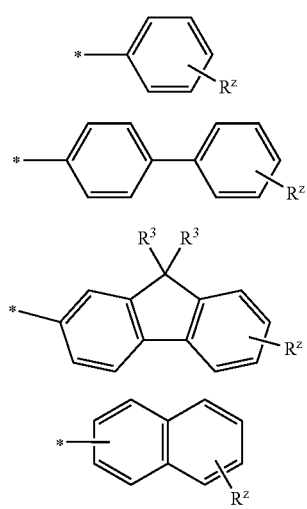

XLIV

XLV

XLVI

XLVII

-continued

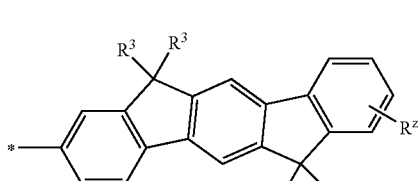

XLVIII

XLIX

L

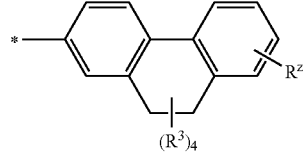

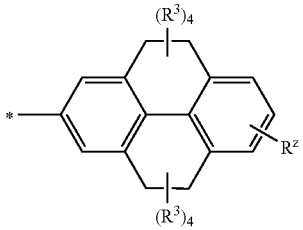

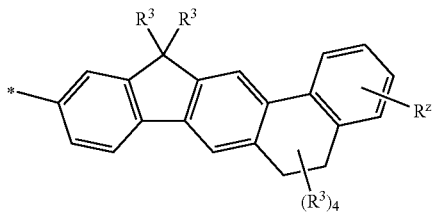

LI

LII

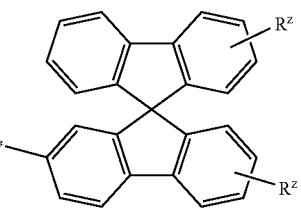

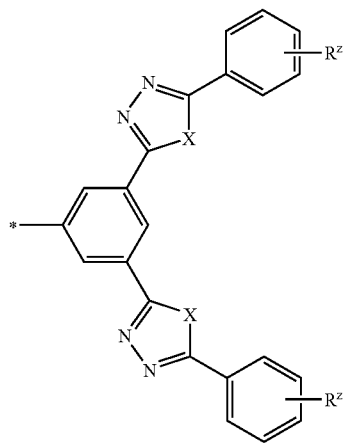

LIII

-continued

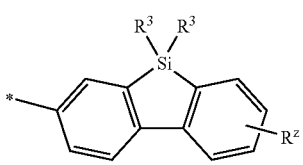

LIV

In some embodiments electroactive polymeric arylenes of the present invention exhibit improved electron transport properties and, where desired, large exciton energy to prevent energy transfer of the excitons. Furthermore, through incorporation of substituent groups $R^1$, $R^2$, $R^3$, $R^y$, and $R^z$ described supra, we have found that we can improve the solubility of polymeric arylenes in organic solvents and that the films made from these polymeric arylenes remain amorphous as thin films, by suppressing aggregation and phase separation. Furthermore these materials are typically free of polymerization by-products that degrade OLED performance, such as terminal aryl halides.

In some embodiments the electroactive arylene polymers of the present invention serve as effective n-type electron transport host materials for making solution processible molecularly doped polymer compositions that can serve as the emissive organic element in OLED devices. In addition, difunctional electroactive carbocyclic arylene monomers of the present invention can be copolymerized into light emitting polymers to enhance electron transport character without adversely affecting the emission characteristics of the polymers.

One exemplary embodiment of the electroactive polymeric arylenes of this invention are endcapped polymers as illustrated in Formula V:

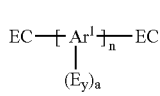

V where a=1 or 2; n is an integer in the range of 3 to 100,000, 10 to 10,000, or 20 to 2,000; $Ar^1$ and $E_y$ are as described above for Formulas I–III; and EC is an end capping group as described supra. These polymers may optionally comprise a soft segment moiety in the polymer backbone or pendent from any of the arylene units or end capping groups to improve processibility. When $E_y$ and a are not the same on all $Ar^1$ units, the polymer can be a random, alternating, or block copolymer.

These polymers can be used effectively as electron transport layers or as a component therein with good hole blocking characteristic in a multilayer OLED device. These polymers can also be used as an active electron transport host when blended with hole transport agents and emissive dopants to create high efficiency electroluminescent layers for OEL devices. This may be done, for example, by blending the polymer with a hole transport material and an emissive dopant, spin coating or otherwise applying the mixture onto a suitable transparent anode substrate and depositing a cathode.

For certain choices of $Ar^1$ (e.g. certain 2,7-fluorenylenes, paraphenylenes) the polymers of Formula V exhibit strong electroluminescence in the absence of an emissive dopant. These polymers exhibit improved electron transport charac-ter compared to corresponding polymers not comprising the pendant $E_y$ groups. The pendant $E_y$ groups can also confer improved processibility (e.g., solubility, thermal transferability, web processiblity, solution coatability) for these polymers relative to corresponding polymers without the $E_y$ groups.

Examples of useful electroactive polymeric arylene polymers of Formula V include, but are not limited to homopolymers of Formulas LV–LXVII

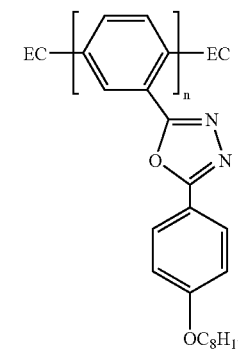

LV

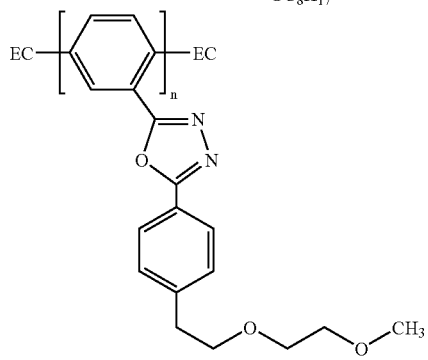

LVI

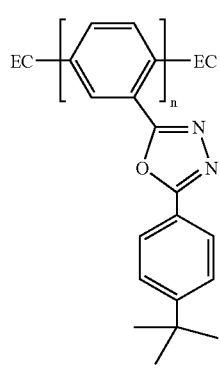

LVII

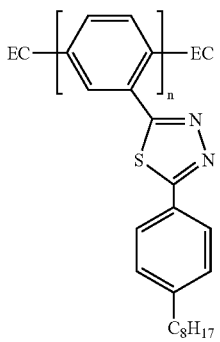

LVIII

-continued
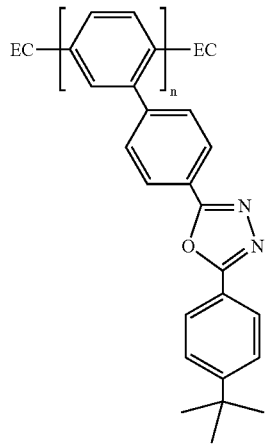
LIX
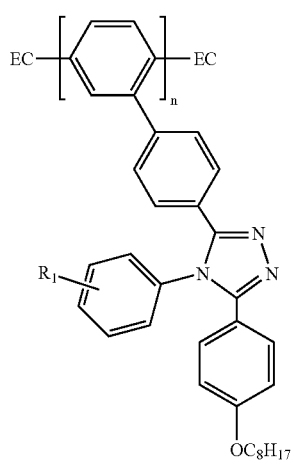
LX
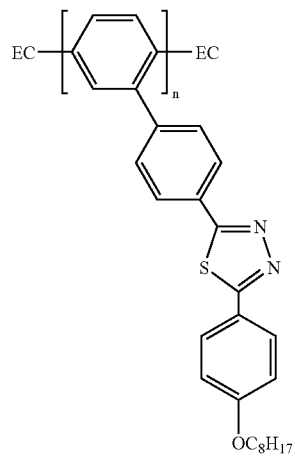
LXI
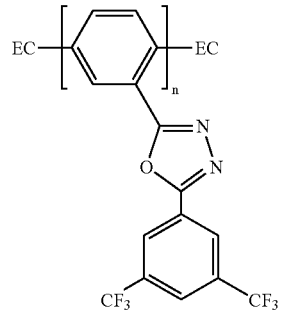
LXII
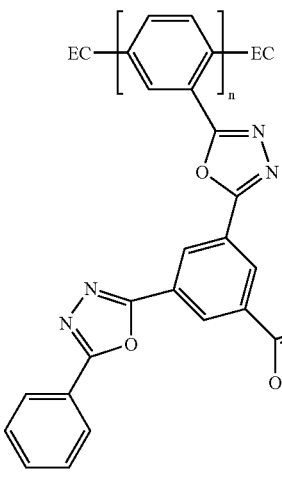
LXIII
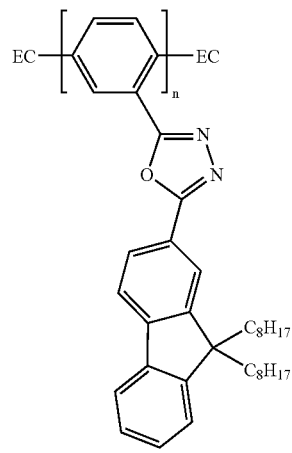
LXIV LXV
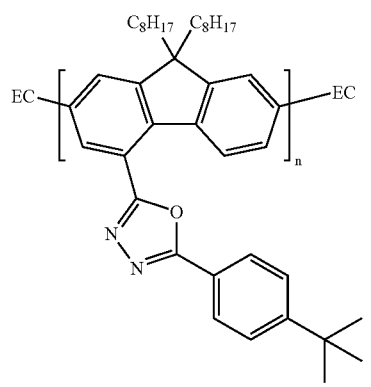
LXVI
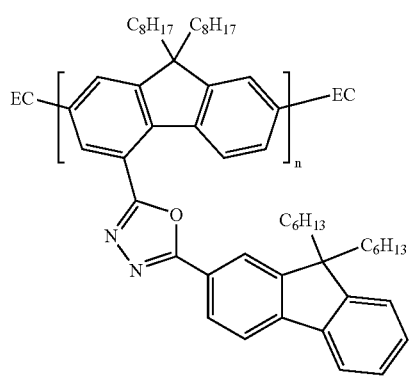
LXVII
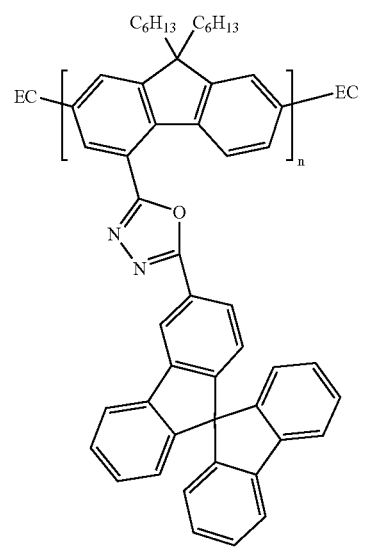
Some examples of useful end capping groups (EC) include, but are not limited to, the groups of Formulas LXVIII–LXXXVIII:
LXVIII
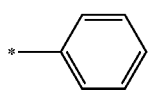
LXIX
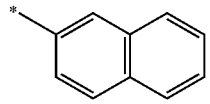
LXX
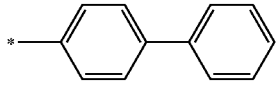
LXXI
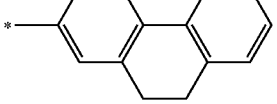
LXXII
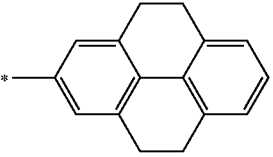
LXXIII
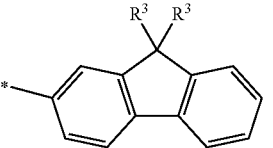
LXXIV
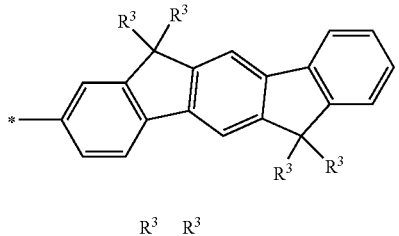
LXXV
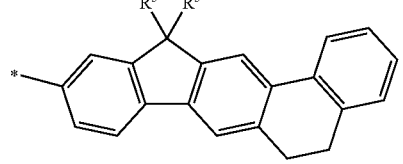
LXXVI
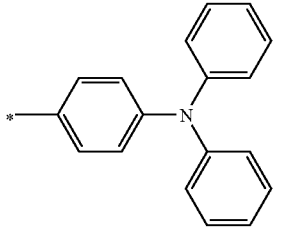
LXXVII
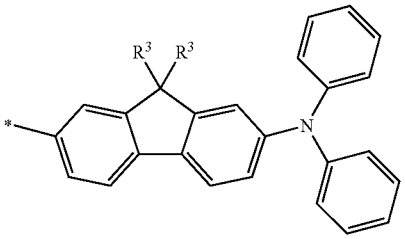

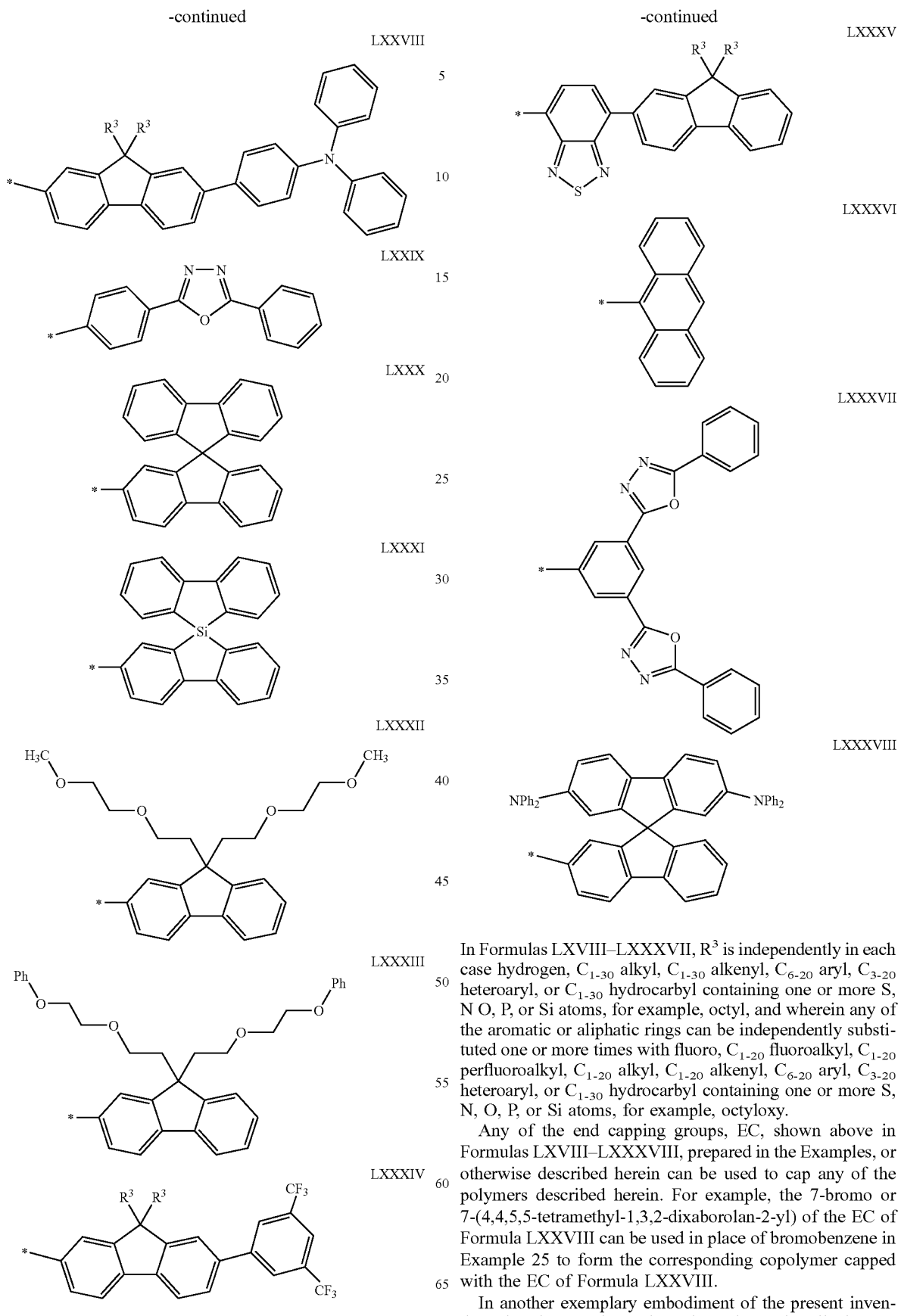

In Formulas LXVIII–LXXXVII, $R^3$ is independently in each case hydrogen, $C_{1-30}$ alkyl, $C_{1-30}$ alkenyl, $C_{6-20}$ aryl, $C_{3-20}$ heteroaryl, or $C_{1-30}$ hydrocarbyl containing one or more S, N O, P, or Si atoms, for example, octyl, and wherein any of the aromatic or aliphatic rings can be independently substituted one or more times with fluoro, $C_{1-20}$ fluoroalkyl, $C_{1-20}$ perfluoroalkyl, $C_{1-20}$ alkyl, $C_{1-20}$ alkenyl, $C_{6-20}$ aryl, $C_{3-20}$ heteroaryl, or $C_{1-30}$ hydrocarbyl containing one or more S, N, O, P, or Si atoms, for example, octyloxy.

Any of the end capping groups, EC, shown above in Formulas LXVIII–LXXXVIII, prepared in the Examples, or otherwise described herein can be used to cap any of the polymers described herein. For example, the 7-bromo or 7-(4,4,5,5-tetramethyl-1,3,2-dixaborolan-2-yl) of the EC of Formula LXXVIII can be used in place of bromobenzene in Example 25 to form the corresponding copolymer capped with the EC of Formula LXXVIII.

In another exemplary embodiment of the present invention, the electroactive polymeric arylenes described supra are copolymers. These electroactive polymeric arylenes are terminally capped copolymers wherein one or more of the arylene units are comonomer units, each independently selected from a different arylene unit of Formula I, carbocyclic arylene, heteroarylene, and/or tertiary aromatic amino arylene, wherein the comonomer units are conjugated with $Ar^1$. The comonomer units are unsubstituted or substitued with one or more groups independently selected from alkyl, alkenyl, fluoro, aryl, fluoroalkyl, heteroalkyl, heteroaryl, and hydrocarbyl containing one or more S, N, O, P, or Si atoms. These copolymers may optionally comprise a soft segment moiety, further described infra, in the polymer backbone or pendent from an arylene unit or end capping group to improve processibility (e.g., solubility, thermal transferability, web processiblity, solution coatability) for these polymers relative to corresponding polymers without a soft segment moiety. The incorporation of the additional carbocyclic arylene, heteroarylene, and/or tertiary aromatic amino arylene units into the polymeric arylene may be used to modify the light absorption, light emission, ionization potential, electron affinity, solubility parameter, and/or electron and hole conducting properties of the polymeric arylene.

Many electronic applications require the active material to exhibit both hole transporting and electron transporting properties without the addition of molecular transport agents. To maximize the efficiency of an OLED, for example, the polymer should ideally transport both holes and electrons equally well (Bradley et al., in Springer-Verlag Berlin Heidelberg, 1992, pp. 304–309). However, in practice this is difficult to achieve. Condensed polycyclic arylenes and heteroarylenes comprising imine linkages can be polymerized directly into the polymer backbone to increasing the electron transport character of the polymer. However, these groups simultaneously shift the emission wavelength due to resonance effects (Zhan et al., *Macromol.* 35, 2529–2537 (2002), Tsvie et al., *J. Mater. Chem.* 9,2189–2200 (1999), U.S. Pat. No. 4,597,896). This makes it difficult to use these types of monomers to simultaneously balance electron transport character and tune the emission of the polymer. Furthermore, polymers with conjugated oxadiazoles have been shown to provide only mediocre electron transport properties (Li et al., *Mat. Res. Soc. Symp. Proc.* 413, 13–22 (1996)).

Applicants have now discovered that electron transport properties can be introduced into arylene based polymers using the electroactive arylene units of Formula I. Surprisingly, these units can be introduced in relatively high amounts into a wide range of arylene based polymers without affecting the emission characteristics of the polymer.

Suitable copolymers of the invention are illustrated, for example, by Formulas VI, VII, and VIII

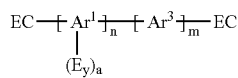

VI

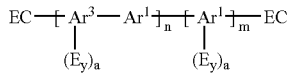

VII

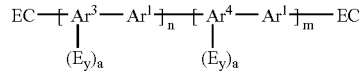

VIII wherein electroactive arylene units —$Ar^1(E_y)_a$- are as defined for Formula I supra and may be the same or different; wherein $Ar^3$ and $Ar^4$ are each independently selected from $C_{6-20}$ carbocyclic arylenes, $C_{3-20}$ heteroarylenes, and $C_{18-60}$ tertiary aromatic amino arylenes and are unsubstituted or substituted with one or more substituents ($R^x$) selected from alkyl, aryl, heteroaryl, and hydrocarbyl containing one or more S, N, O, P, or Si atoms; wherein m and n are integers in the range of 2 to 100,000; and wherein the end capping groups (EC) are the same or different and are electrochemically stable aryl, heteroaryl, or tertiary aromatic amino aryl groups or combinations thereof as described supra. These copolymers may optionally comprise a soft segment moiety in the polymer backbone or pendent to an arylene unit or end capping group to improve processibility (e.g., solubility, thermal transferability, web processiblity, solution coatability) for these polymers relative to corresponding polymers without a soft segment moiety. The soft segment moiety is divalent or monovalent; the divalent soft segments being bonded to two of the groups or units selected from EC and $Ar^1$, EC and $Ar^3$, EC and $Ar^4$, $Ar^1$ and $Ar^1$, $Ar^3$ and $Ar^3$, $Ar^1$ and $Ar^3$, $Ar^1$ and $Ar^4$, and $Ar^3$ and $Ar^4$; and the monovalent soft segments being pendent to one or more of EC, $Ar^1$, $Ar^3$, $Ar^4$, or $E_y$. These polymers may be random, alternating, or block copolymers. Alternating and block coplymers are particularly suitable.

Suitable carbocyclic arylene, heteroarylene, and tertiary aromatic amino arylene units for $Ar^3$ and $Ar^4$ in Formulas VI–VIII can be selected based on the desired function for the polymer (e.g. electron transport-hole blocking polymer, electroluminescent polymer, host polymer for molecularly doped polymer films) and on the functional attributes of the comonomer units. In this context, the comonomer units can be subdivided into one of three categories based on their function: high band gap units, hole transport units, and electron transport units. High bandgap means that the energy difference between the HOMO and LUMO of the monomoer or copolymer unit or polymer comprising the monomer or copolymer unit is at least 2.5 eV, for example 3 eV. Light emitting polymers with a high bandgap function can provide emission of blue or blue-green light and have a bandgap of at least 2.5 eV. Host polymers with a bandgap of at least 2.5 eV, for example 3 eV, can serve as useful host polymers for polymeric, oligomeric, or molecular emitters of blue light.

In some embodiments $Ar^3$ and/or $Ar^4$ can provide high bandgap function when $Ar^3$ and/or $Ar^4$ in Formulas VI–VIII are selected from phenylene group arylene units and naphthalene group arylene units. In some exemplary embodiments of copolymers of Formulas VI–VIII, one or both of $Ar^3$ and $Ar^4$ are fluorenylene of Formula LXXXIX

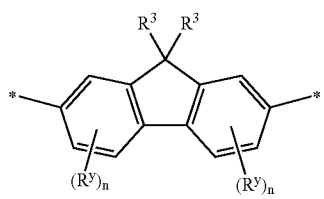

LXXXIX wherein $R^3$ is independently in each case selected from hydrogen, $C_{1-30}$ alkyl, $C_{1-30}$ alkenyl, $C_{6-20}$ aryl, $C_{3-20}$ heteroaryl, and $C_{1-30}$ hydrocarbyl containing one or more S, N, O, P, or Si atoms; wherein $R^y$ is independently in each case selected from fluoro, $C_{1-20}$ fluoroalkyl, $C_{1-20}$ perfluoroalkyl, $C_{1-20}$ alkyl, $C_{1-20}$ alkenyl, $C_{6-20}$ aryl, $C_{3-20}$ heteroaryl, and $C_{1-30}$ hydrocarbyl containing one or more S, N, O, P, or Si atoms; and wherein n is 0, 1, or 2, in combination with —$Ar^1(E_y)_a$- selected from Formulas XI–XLIII. In some embodiments —$Ar^1(E_y)_a$- is selected from Formulas XXXI–XXXIV. In at least some of these embodiments, the copolymers are electroluminescent and, surprisingly, provide stable emission of blue light (or green light depending upon the selection of $Ar^3$ or $Ar^4$) with improved electron transport efficiencies. Incorporation of the —$Ar^1(E_y)_a$- units into a polyfluorene backbone unexpectedly eliminated excimer formation and crystallization responsible for color shifting observed with previously known blue light emitting poly(dialkylfluorenes).

Some electron transport character and significant color tuning can be introduced if $Ar^3$ and $Ar^4$ in Formulas VI–VIII are electron deficient monomer units selected from arylene units that are condensed polycyclic arylene units and heteroarylene units comprising imine linkages as defined above, or both.

Hole transport character and some color tuning can be introduced if $Ar^3$ and $Ar^4$ in Formulas VI–VIII are electron rich monomer units selected from heteroarylenes that are electron rich and tertiary aromatic amino arylenes as defined above, or both.

Non-limiting examples of divalent hole transport units useful in the present invention include tertiary aromatic amino arylenes of Formulas XC–XCVI

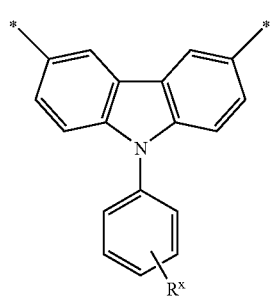

XC

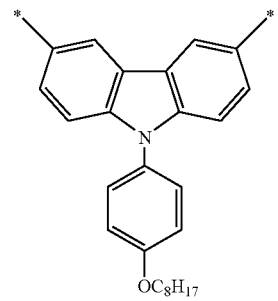

XCI

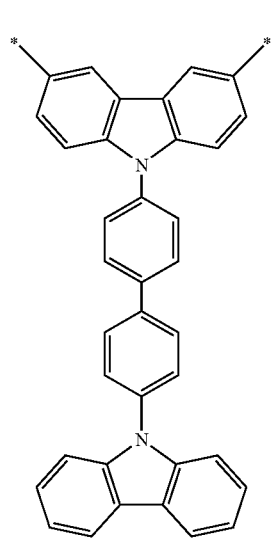

XCII

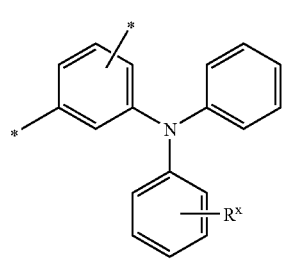

XCIII

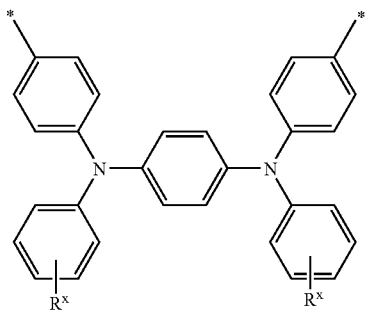

XCIV

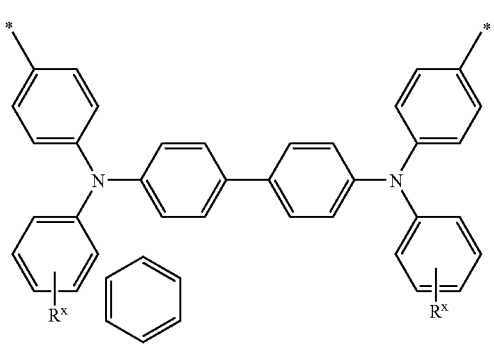

XCV

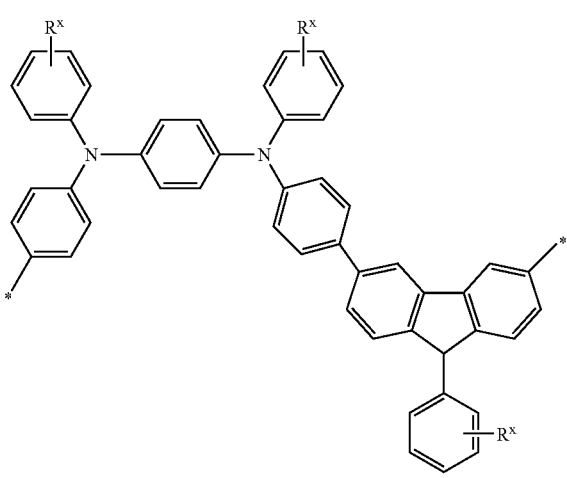

XCVI wherein $R^x$ is as defined above in Formulas VI–VIII.

Through selection of $Ar^1$, $Ar^3$ and $Ar^4$, delocalized emission centers can be incorporated into the polymer. For example, condensed polycyclic arylenes and heteroarylenes comprising imine linkages can be incorporated selectively into the conjugated backbone structures of otherwise phenylene group and naphthalene group conjugated arylene polymers to provide centers for exciton recombination, giving rise to characteristic emissions. As examples, the condensed polycyclic arylenes derived from anthracene, perylene and pyrene can be incorporated with adjacent carbocyclic arylene, heteroarylene, or aromatic amino arylene units to give blue or green electroluminescence (Millard, *Synthetic Metals*, 111–112, 119–123 (2000), Bernius et al., *Advanced Mater.* 12, 1737–1750 (2000)). The same is true for several of the heteroarylenes comprising imine linkages, most notably the benzothiadiazol-4,7-diyl.

In some embodiments of the electroactive polymeric arylene terminally capped copolymers of Formulas VI–VIII, $Ar^3$ and $Ar^4$ are independently selected from phenylene group arylenes and naphthalene group arylenes wherein each phenylene group arylene and naphthalene group arylene is independently unsubstituted or substituted with one or more substituents ($R^x$) selected independently in each case from fluoro, $C_{1-20}$ fluoroalkyl, $C_{1-20}$ perfluoroalkyl, $C_{1-20}$ alkyl, $C_{6-20}$ aryl, $C_{3-20}$ heteroaryl, and $C_{1-30}$ hydrocarbyl containing one or more S, N, O, P, or Si atoms. In one embodiment, for example, the electroactive polymeric arylene copolymers comprise at least 5% of the electroactive arylene units of Formula I, and at least 10% of comonomer units independently selected from phenylene group arylenes and naphthalene group arylenes. In another embodiment, the copolymers comprise at least 15% of the electroactive arylene units of Formula I, and at least 10% of the phenylene group or naphthalene group arylene units, unsubstituted or substituted as described above. In yet another embodiment, the copolymers comprise at least 20% of the electroactive arylene units of Formula I, and at least 20% of the phenylene group or naphthalene group arylene units, unsubstituted or substituted as described above. The ratios of different electroactive arylene units of Formula I may vary without limit and the ratio of different phenylene group or naphthalene group arylene units may vary without limit. When the ratio varies without limit, one unit in the ratio may be absent while the other unit provides 100% of this type of unit. The above % values for each of the arylene units are based on the total number of repeat units in the copolymer.

As with the homopolymers, these copolymers can be used effectively as electron transport layers with good hole blocking characteristic in a multilayer OLED device. These copolymers can also be used as an active electron transport host when blended with molecular hole transport agents and emissive dopants to create high efficiency electroluminescent devices. For certain choices of $Ar^1$, $Ar^3$, and $Ar^4$, polymerization gives rise to extended conjugation in the polymer backbone (e.g. oxadiazolyl substituted poly(2,7-fluorenes) or oxadiazolyl substituted polyparaphenylenes) that can provide electoluminescent polymers with improved electron transport character compared with the same polymers not comprising the electroactive arylene units of Formula I.

Examples of useful electroactive polymeric arylene copolymers comprising electroactive arylene units of Formula I and phenylene group or naphthalene group arylene units include, but are not limited to those of the Formulas XCVII–CII

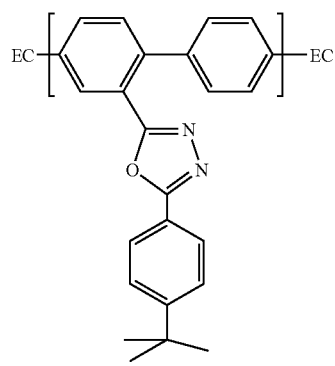 XCVII
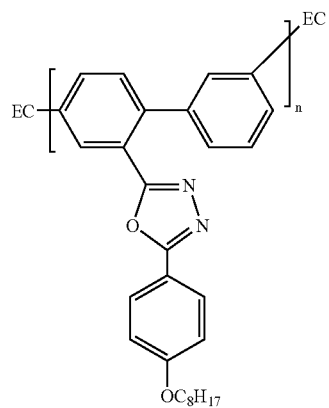 XCVIII
XCIX
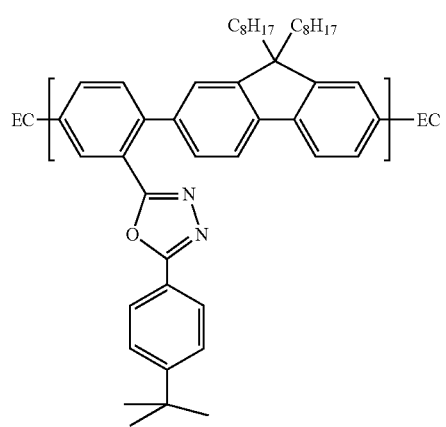
C
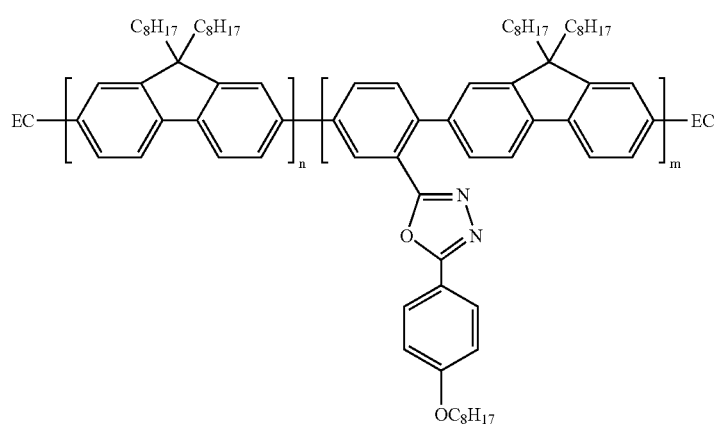
CI
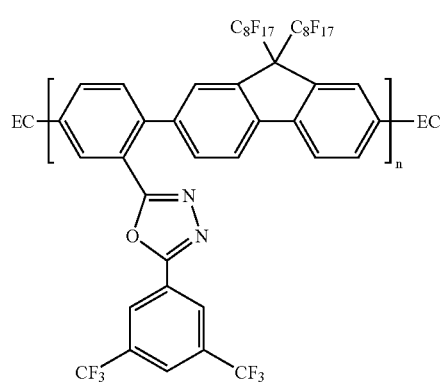

-continued

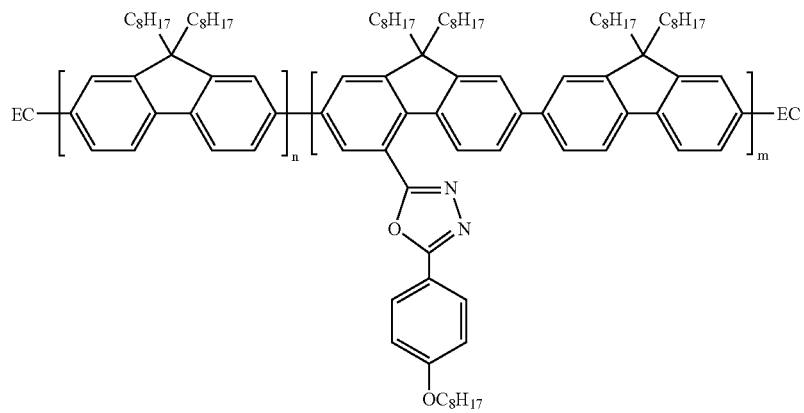

CII wherein EC is as described supra.

In some embodiments of the electroactive polymeric arylene copolymers of the present invention, the terminally capped copolymers of Formulas VI–VIII are preferably alternating or block copolymers, wherein $Ar^3$ and $Ar^4$ are independently selected from condensed polycyclic arylenes, heteroarylenes, and tertiary aromatic amino arylenes, wherein the condensed polycyclic arylenes, heteroarylenes, and tertiary aromatic amino arylenes are independently unsubstituted or substituted with one or more substituents ($R^x$) selected independently in each case from $C_{1-20}$ alkyl, $C_{6-20}$ aryl, $C_{3-20}$ heteroaryl, and $C_{1-30}$ hydrocarbyl containing one or more S, N, O, P, or Si atoms. In one embodiment the copolymers comprise at least 10% of the electroactive arylene units —$Ar^1(E_y)_a$- of Formula I, and at least 1% of comonomer units selected from electron rich heteroarylenes and tertiary aromatic amino arylenes; said electron rich heteroarylene or tertiary aromatic amino arylene units being unsubstituted or substituted with one or more substituents ($R^x$) as above. In another embodiment, the copolymers comprise at least 15% of the electroactive arylene units of Formula I, and at least 10% of electron rich heteroarylene or tertiary aromatic amino arylene units, unsubstituted or substituted as described above. In another embodiment, the copolymers comprise at least 20% of the electroactive arylene units of Formula I, and at least 20% of electron rich heteroarylene or tertiary aromatic amino arylene units, unsubstituted or substituted as described above. The ratios of different electroactive arylene units —$Ar^1(E_y)_a$- of Formula I may vary without limit and the ratio of different electron rich heteroarylene or tertiary aromatic amino arylene units may vary without limit. When the ratio varies without limit, one unit in the ratio may be absent while the other unit provides 100% of this type of unit. The above % values for each of the arylene units are based on the total number of repeat units in the copolymer. These polymers provide both hole and electron transport properties and optionally are electroluminescent. They serve as useful host materials for blended electroluminescent compositions.

In some embodiments of the electroactive polymeric arylene copolymers of the present invention, the terminally capped copolymers of Formulas VI–VIII are preferably block copolymers, wherein $Ar^3$ and $Ar^4$ are independently selected from electron rich heteroarylenes or tertiary aromatic amino arylenes, phenylene group arylenes and naphthalene group arylenes, wherein the electron rich heteroarylenes or tertiary aromatic amino arylenes, phenylene group arylenes and naphthalene group arylenes are unsubstituted or substituted with one or more substituents ($R^x$) selected independently in each case from fluoro, $C_{1-20}$ fluoroalkyl, $C_{1-20}$ perfluoroalkyl, $C_{1-20}$ alkyl, $C_{6-20}$ aryl, $C_{3-20}$ heteroaryl, and $C_{1-30}$ hydrocarbyl containing one or more S, N, O, P, or Si atoms. In one embodiment the copolymers comprise at least 5% of the electroactive arylene units —$Ar^1(E_y)_a$- of Formula I, at least 1% of electron rich heteroarylenes or tertiary aromatic amino arylenes, and at least 10% of phenylene group arylenes or naphthalene group arylenes, unsubstituted or substituted as above. In another embodiment, the copolymers comprise at least 10% of the electroactive arylene units of Formula I, at least 10% of the electron rich heteroarylenes or tertiary aromatic amino arylenes, unsubstituted or substituted as described above, and at least 15% of the phenylene group arylenes or naphthalene group arylenes, unsubstituted or substituted as described above. In another embodiment, the copolymers comprise at least 20% of the electroactive arylenes of Formula I, at least 20% of electron rich heteroarylenes or tertiary aromatic amino arylenes, unsubstituted or substituted as described above, and at least 30% of the phenylene group arylenes or naphthalene group arylenes, unsubstituted or substituted as described above. The ratios of different electroactive arylene units —$Ar^1(E_y)_a$- of Formula I may vary without limit; the ratio of different electron rich heteroarylene or tertiary aromatic amino arylene units may vary without limit; the ratio of different phenylene group arylene or naphthalene group units may vary without limit. When the ratio varies without limit, one unit in the ratio may be absent while the other unit provides 100% of this type of unit. The above % values for each of the arylene units are based on the total number of repeat units in the copolymer. The conjugated internal region (conjugated backbone) of these polymers supports electron delocalization required for electroluminescence, as well as electronically conjugated hole and electron transport functionality.

In some embodiments of the electroactive polymeric arylene copolymers of the present invention, the terminally capped copolymers of Formulas VI–VIII are preferably alternating copolymers, wherein $Ar^3$ and $Ar^4$ are independently selected from condensed polycyclic arylene, heteroarylene comprising imine linkage, electron rich heteroarylene, tertiary aromatic amino, phenylene group arylene, and naphthalene group arylene, each of which is independently unsubstituted or substituted with one or more substituents ($R^x$) selected independently in each case from fluoro, $C_{1-20}$ fluoroalkyl, $C_{1-20}$ perfluoroalkyl, $C_{1-20}$ alkyl, $C_{6-20}$ aryl, $C_{3-20}$ heteroaryl, and $C_{1-30}$ hydrocarbyl containing one or more S, N, O, P, or Si atoms. In one embodiment, the these copolymers comprise at least 5% of the electroactive arylene units —$Ar^1(E_y)_a$- of Formula I, at least 1% of condensed polycyclic arylene or heteroarylene comprising imine linkage, optionally at least 1% of electron rich heteroarylene or tertiary aromatic amino, and optionally at least 10% of phenylene group arylene or naphthalene group arylene. In another embodiment, the copolymers comprise at least 10% of the electroactive arylene units of Formula I, at least 5% of one or more condensed polycyclic arylene or heteroarylene comprising imine linkage, at least 10% of electron rich heteroarylene or tertiary aromatic amino arylene, and at least 15% of the phenylene group arylene or naphthalene group arylene. In another embodiment, the copolymers comprise at least 20% of the electroactive arylene units of Formula I, at least 10% of condensed polycyclic arylene or heteroarylenes comprising imine linkage, at least 20% of electron rich heteroarylene or tertiary aromatic amino arylene, and at least 30% of the phenylene group arylene or naphthalene group arylene. The ratios of different electroactive arylene units —$Ar^1(E_y)_a$- of Formula I may vary without limit; the ratio of different electron rich heteroarylene or tertiary aromatic amino arylene units may vary without limit; the ratio of different phenylene group arylene units or naphthalene group arylene units may vary without limit. When the ratio varies without limit, one unit in the ratio may be absent while the other unit provides 100% of this type of unit. The above % values for each of the arylene units are based on the total number of repeat units in the copolymer. These polymers have a conjugated backbone or conjugated internal region that supports delocalization required for electroluminescence and color shifting, as well as electronically conjugated hole and electron transport functionality.

Some examples of useful electroactive polymeric arylene copolymers comprising electroactive arylene units —$Ar^1(E_y)_a$- of Formula I and additional comonomers to fine tune the color and charge transport properties are those of Formulas CIII–CVII

CIII

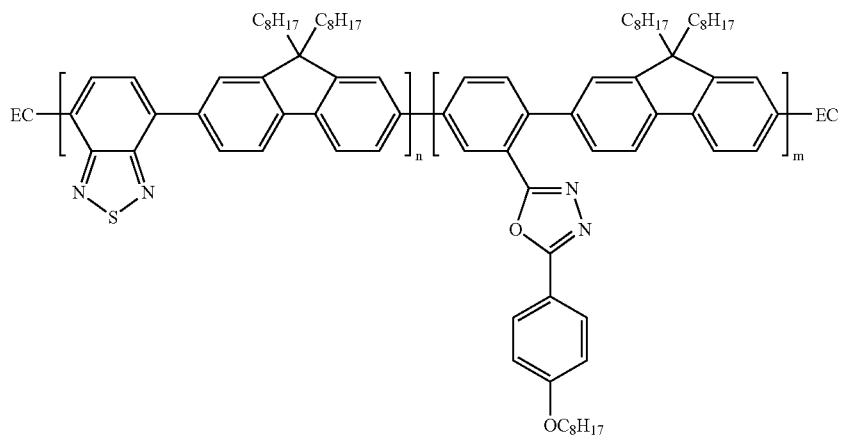

CIV

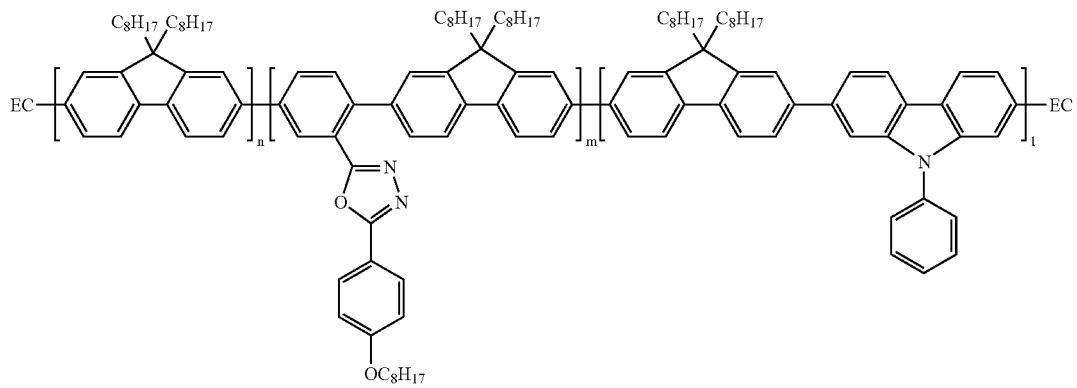

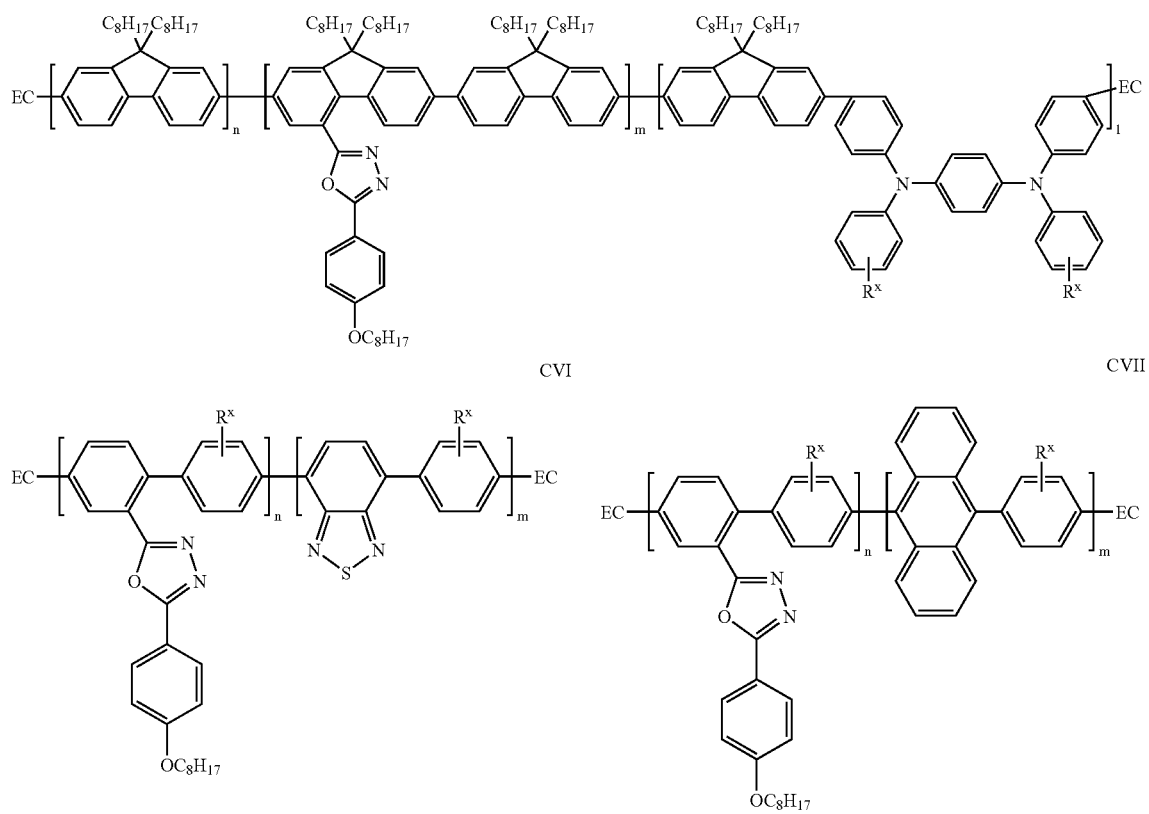

wherein R$^x$ and EC are as defined above in Formulas VI–VIII, and n, m, and l are integers in the range of 2 to 100,000.

In the copolymers of this invention, electroactive arylene units —Ar$^1$(E$_y$)$_a$- of Formula I, additional comonomers, and capping groups can be optionally substituted with additional substituents that modify the solubility parameter, ionization energy, electron affinity, or any combination of these.

In one particularly useful embodiment, one or more of Ar$^2$, EC, Ar$^3$, and Ar$^4$ are substituted with one or more groups independently selected from fluoro, fluoroalkyl, and perfluoroalkyl, with the provios that when EC is phenyl, the fluoro group is not in the para position. For example, the substituent groups R$^3$, R$^y$, R$^z$, and R$^x$ associated with —Ar$^1$(E$_y$)$_a$, the comonomer units, and end capping groups of polymers of Formulas V–VIII are independently selected from fluoro, fluoroalkyl, and perfluoroalkyl. Incorporation of these substitutents can improve the solubility and film forming properties of the polymer and at the same time increase the ionization potential and electron affinity of the polymer, thereby making it easier to inject electrons and block holes.

Among other difficulties, some polymers may generate undesirable emission through, for example, excimer formation, as described, for example, in Neher et al., *Macromol. Rapid Commun.* 22, 1365–1385 (2001). Substituents on —Ar$^1$(E$_y$)$_a$-, the comonomer units, and capping groups of polymer structures V–VIII can be selected which reduce excimer and exciplex formation, if desired. For example, the substitutents can include sterically hindering groups to reduce the formation of intermolecular or intramolecular configurations of the light emitting polymers that produce excimer or exciplex emission, which cause color shifting of the electroluminescence.

In another useful embodiment, one or more of the substituent groups R$^3$, R$^y$, R$^z$, and R$^x$ associated with the comonomer and end capping groups of the polymers of Formulas V–VIII have the general Formula IX

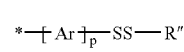

IX where Ar is carbocyclic arylene or heteroarylene, p is 0 or 1, R″ is a sterically hindering functional group such as an aryl, heteroaryl, or a branched alkyl, and SS is a soft segment moiety. Preferably, R″ is an aryl. The use of a sterically hindering functional group can reduce or prevent the formation of intermolecular or intramolecular excimer configurations. The soft segment moieties are divalent aliphatic groups which include two or more functional groups each independently selected from ethers, fluoroalkylenes, perfluoroalkylenes, teriary amines, thioethers, dialkylsiloxanes, and dialkoxysiloxanes. These functional groups can be the same or different. Suitable soft segment moieties include, for example, poly(oxyalkylene) groups (e.g., —O(C$_q$H$_{2q}$O)$_s$— where q is an integer in the range of 1 to 6 and s is an integer in the range of 2 to 20) and poly(dialkylsiloxanes) (e.g.,

[—Si(C$_r$H$_{2r+1}$)$_2$O—]$_n$, where r is an integer in the range of 1 to 10 and n is an integer in the range of 2 to 20). Preferably, SS is a poly(oxyalkylene) containing from 2 to 20 carbon atoms. In one embodiment, Ar is phenylene, p is 1, R" is C$_{6-20}$ carbocyclic aryl (more preferably, phenyl or biphenyl), and SS is a C$_{2-20}$ poly(oxyalkylene).

The electroactive polymeric arylenes of the present invention can be used alone or in combination with each other or with other electroactive or light emitting polymers or small molecule materials to form electroluminescent compositions. The soft segments in the electroactive polymeric arylenes can, if desired, provide better solubility parameter matching to a receptor substrate than a similar polymer without the soft segments. In addition or alternatively, the soft segments can alter other properties useful to thermal transfer and film stability such as, for example, melting temperature, glass transition temperature, percent crystallinity and tendency to crystallize or form aggregates, viscosity, thin film morphology, rheological properties such as melt viscosity and relaxation time, excimer and exciplex formation, cohesive strength, and light emission frequency, if desired. These soft segment substituents can improve thermal transfer and adhesion of the electroactive polymeric arylenes to commercially available conducting ionic polymers such as PEDT and PANI, which are commonly used as anode buffer layers in OLED device constructions.

Soft segments can also be incorporated in the backbone of the electroactive polymeric arylenes of the present invention, including the polymeric arylenes of Formulas V–VIII. One illustration of this is represented in Formula X

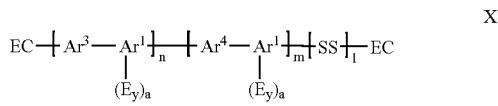

X wherein EC, Ar$^3$, —Ar$^1$(E$_y$)$_a$-, and Ar$^4$ are as defined in Formulas V–VIII, and SS is a divalent aliphatic group containing two or more functional groups each independently selected from ethers, fluoroalkylenes, perfluoroalkylenes, teriary amines, thioethers, dialkylsiloxanes, and dialkoxysiloxanes.

Incorporation of soft segments within the backbone of the polymer or as a pendant group and methods of making the soft segments are described in U.S. Ser. No. 60/374,044 filed on Apr. 19, 2002, incorporated herein by reference.

A number of methods may be used to make the electroactive polymeric arylenes of the present invention. For example, the terminally capped electroactive polymeric arylene homopolymers may be prepared by a process wherein a step includes reacting dihalide carbocyclic arylene intermediates with catalytic anhydrous nickel(II) bromide in the presence of triphenylphosphine and reducing metal (Zn) according to the methods of Yammamoto et al. (*Macromolecules*, 25, 1214–1223 (1992)) as modified by Colon et al. (*J. Polym. Sci., Polym. Chem.* 28, 367–383 (1990)), and applied successfully to fully conjugated polymers by Ueda et al. (*Macromolecules*, 24, 2694–2697 (1991)), all three references fully incorporated herein by reference. In another step the resulting halide terminated polymer may be capped with an electrochemically inert aryl group by reaction with an excess of a monofunctional aryl group (e.g. 4-bromophenylaniline, 2-bromo-9,9-dioctylfluorene) under standard conditions (i.e., reflux with monofunctional aryl group in toluene for about 16 hours using tetrakis(triphenylphosphine)palladium (0) catalyst).

Using the Yammamoto coupling methods, mixtures of monomers each bearing two halogen substituents (preferably bromine and chlorine) can be polymerized into copolymers of essentially random nature if the monomers are of about the same reactivity. If reactivities are significantly different, then the more reactive monomers would be polymerized preferentially over the less reactive ones, resulting in blocky copolymers.

Terminally capped electroactive polymeric arylene homopolymers and alternating copolymers may be prepared by a process wherein a step includes reacting arylene dibromide intermediates with arylene diboronic acid/ester intermediates under palladium catalyzed conditions using Suzuki coupling methods as taught by Miyaura and Suzuki (*Chemical Reviews*, 95, 2457–2483 (1995)) herein fully incorporated by reference. For example, an arylene dibromide (hereinafter referred to as a type A monomer) and an arylene diboronic acid/ester (hereinafter referred to as a type B monomer) may be reacted in nearly equal amounts to form desired alternating copolymers. In another step the resulting halide/boranyl terminated polymer may be capped with an electrochemically inert aryl group by reaction with an excess of a monofunctional aryl group (e.g. bromobenzene/boranylbenzene) under standard Suzuki coupling conditions.

Terminally capped electroactive arylene copolymers comprising hole transport, electron transport, and/or emissive monomer units may be made with the units in a random order using the Yammamoto coupling methods, or in an alternating order using Suzuki coupling methods. For Suzuki coupling, two or more type A monomers and two or more type B monomers may be reacted so long as the combined molar amount of the type A monomers is approximately equal to the combined molar amount of the type B monomers. Alternatively, an excess of type A or type B can be used to control molecular weight. A unique feature of copolymers from this process is that chain growth takes place exclusively via the formation of repeating A–B dyads. Such polymers are alternating copolymer. Monomers of more complex structure can be employed to yield copolymers of even higher degree of structural order. For example, an appropriately functionalized electroactive arylene unit —Ar$^1$(E$_y$)$_a$- of Formula I, may be reacted with two molecules of a carbocyclic arylene, heteroarylene, or tertiary aromatic amine (denoted here as monomer Ar$^5$) to yield a new monomer of the structure Br—Ar$^5$—Ar$^1$(E$_y$)$_a$-Ar$^5$—Br.

Block-copolymers comprising block segments of electroactive arylene units —Ar$^1$(E$_y$)$_a$- may also be formed by making reactive oligomers of these units, along with reactive oligomers of, for example hole transport monomers, electron transport monomers, soft segment monomers, high bandgap monomers(e.g., by Yammamoto or Suzuki coupling methods), optionally converting the terminal bromides of certain of the oligomers to terminal diboronic acid/ester, or vise versa to provide for both type A and type B reactive oligomers, and then coupling the resulting reactive oligomers together by Suzuki coupling methods. End capping can then be done as described above.

Reaction Scheme I depicts procedures to access representative examples of the block copolymer class of materials by first making two reactive oligomers. Block copolymers, which comprise a series of one type of arylene unit bonded to a series of another type of arylene unit, may be made by a polymer extension reaction of, for example, a hole transport oligomer with an electron transport oligomer comprising electroactive arylene units —Ar$^1$(E$_y$)$_a$- of Formula I.

This can be achieved by the reaction of two or more electroactive oligomers bearing complimentary reactive groups (e.g., dibromo and diboronic acid/ester). In step (1a) of Reaction Scheme I the hole transport oligomer is prepared by reaction of the dibromide of a representative tertiary aromatic amino unit, N,N'-bis(4-bromophenyl)-N,N'-bis(4-butylphenyl)benzene-1,4-diamine, with an excess of the diborolane of a representative electron rich heteroarylene, 9-phenyl-3,6-bis(4,4,5,5-tetramethyl-1,3,2-dioxaborolan-2-yl)-9H-carbazole, under Suzuki coupling conditions to give the borolane-capped hole transport oligomer $HT_B$ of Formula CVIII wherein n can vary depending on the ratio of borolane to bromide used. In one example, the weight average molecular weight of the oligomer of Formula CVIII is about 2,400 and the oligomer was made as follows. In a 50 mL round bottomed flask fitted with a rubber septum and reflux condenser were introduced 9-phenyl-3,6-bis(4,4,5,5-tetramethyl-1,3,2-dioxaborolan-2-yl)-9H-carbazole (0.79 g, 1.59 mmole, 5 equivalents) from Part A of Example 13 infra, N,N'-bis(4-bromophenyl)-N,N'-bis(4-butylphenyl)benzene-1,4-diamine (0.65 g, 0.952 mmole, 3 equivalents), Aliquat™ 336 (0.16 g, 0.405 mmole, 1.28 equivalents), 2M sodium carbonate solution (5.4 mL, 10.8 mmole, 34 equivalents) and 20 mL toluene. This was purged with a stream of nitrogen for 30 min. Under a nitrogen purge, tetrakis(triphenylphosphine) palladium (0) (10 mg, 0.0068 mmole, 0.02 equivalents) was added. The reaction mixture was then refluxed for 16 hrs to give the borolane capped poly {(9-phenyl-9H-carbazole-3,6-diyl)[N,N'-bis(phenyl-4-yl)-N,N'-bis(4-butylphenyl)benzene-1,4-diamine]} (the borolane capped hole transport agent $HT_B$ of Formula CVIII).

The molecular weight of the borolane capped poly {(9-phenyl-9H-carbazole-3,6-diyl)[N,N'-bis(phenyl-4-yl)-N,N'-bis(4-butylphenyl)benzene-1,4-diamine]} was verified in the following manner. A solution of 0.5 g bromobenzene in 5 mL nitrogen purged toluene was added followed by a further charge of tetrakistriphenylphosphine palladium (0) (10 mg). The resulting mixture was refluxed for 16 hours, and then cooled to room temperature, and 30 mL water added. The organic layer was separated and washed with water followed by brine. Precipitation into methanol, filtration and vacuum drying of the solid thus obtained gave 0.62 g of phenyl-capped poly{(9-phenyl-9H-carbazole-3,6-diyl)[N,N'-bis(phenyl-4-yl)-N,N'-bis(4-butylphenyl)benzene-1,4-diamine]}. Molecular weight determination by gel permeation chromatography versus polystyrene standards gave Mw $2.39 \times 10^3$, Mn $1.49 \times 10^3$ and PD 1.67.

In step (1b) of Reaction Scheme I the bromide capped electron transport oligomer $ET_A$ of Formula CIX is prepared separately by reaction of 1,4-benzenediboronic acid bis (neopentyl glycol) cyclic ester with a slight excess of 2-(2,5-dibromophenyl)-5-[4-(octyloxy)phenyl]1,3,4-oxadiazole under Suzuki coupling conditions. The value of m can vary depending on the ratio of borolane to bromide used, and in one example, the weight average molecular weight of the oligomer of Formula CIX is about 5,000. In step (2) of Reaction Scheme 1 the bromine capped electron transport oligomer $ET_A$ of Formula CIX and the borolane capped hole transport agent $HT_B$ of Formula CVIII are then reacted under Suzuki coupling conditions, followed by end capping with suitable end capping groups EC, in this case with phenyl, to give the HT-ET block copolymer of Formula CX. The value of p can vary depending on the ratio of borolane to bromide used, and the weight average molecular weight of the copolymer of Formula CX can be in the range of about 5,000 to 1,000,000.

Reaction Scheme I

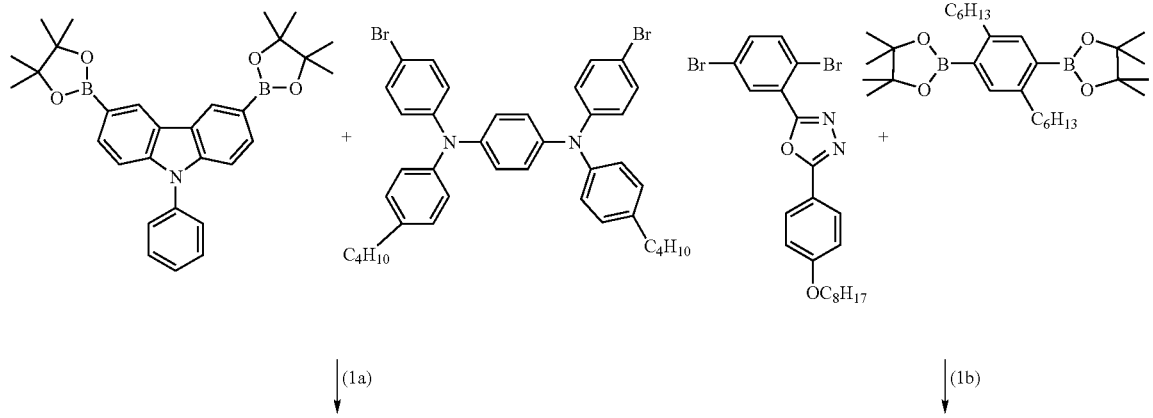

(1a)     (1b)

-continued

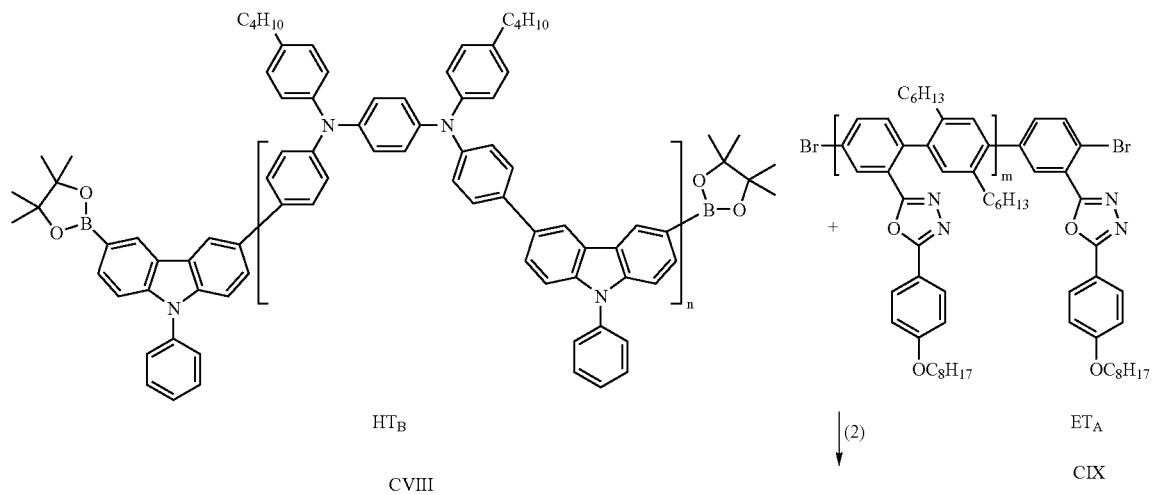

HT<sub>B</sub>
CVIII

ET<sub>A</sub>
CIX

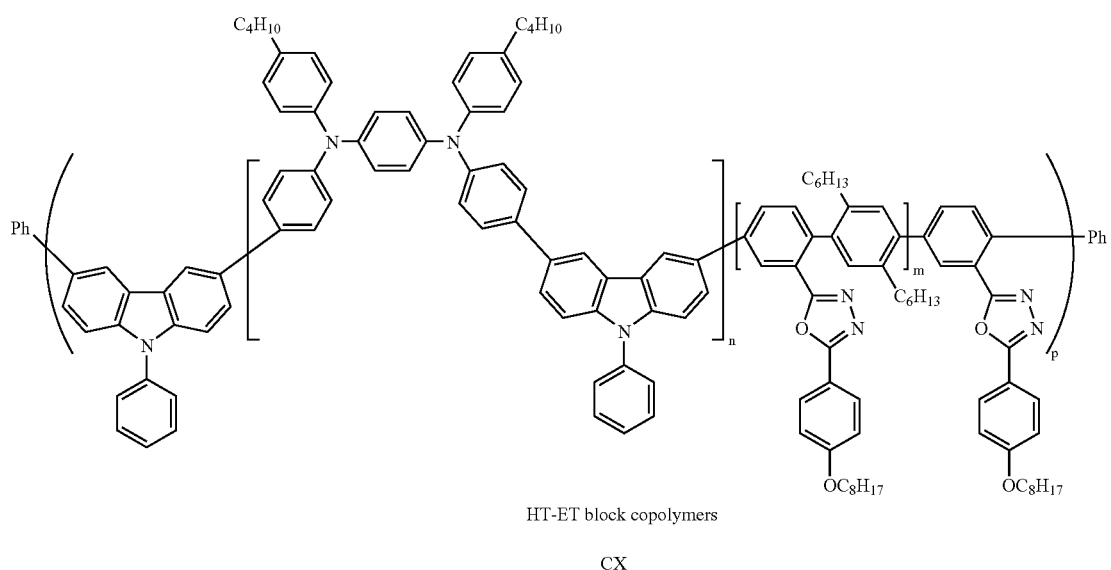

HT-ET block copolymers
CX

Reactive Monomers

In yet another broad aspect, this invention relates to novel intermediates useful for making polymeric arylenes, including the present electroactive polymeric arylenes. More specifically, this invention relates to polymerizable monomers having two reactive groups. More specifically, this invention relates to certain monomers having the structure of Formula IV

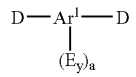

IV wherein each D is a reactive group independently selected from chlorine, bromine, iodine, boronic acid, and boronic ester; and wherein a, $E_y$ and $Ar^1$ are defined as in Formula I. Useful arylene groups and substitution patterns for —$Ar^1(E_y)_a$- are selected from Formulas XI–XLIII described supra. In one embodiment —$Ar^1(E_y)_a$- is selected from Formulas CXI–CXIII.

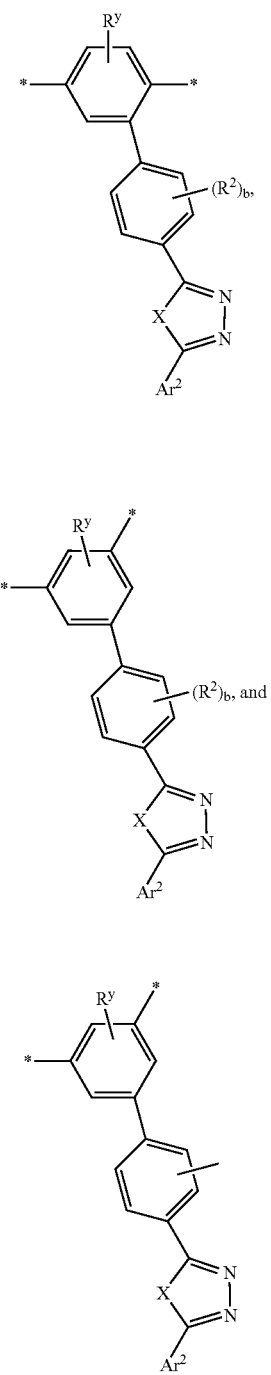

CXI

CXII

CXIII wherein X is selected from —O—, —S—, and —N(R$^1$)—, and R$^1$, R$^2$, b, Ar$^2$, and R$^y$ are as defined for Formulas XI–XLIII; and

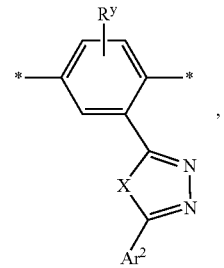

CXIV

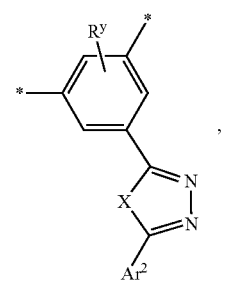

CXV

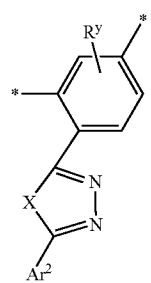

CXVI wherein X is selected from —S— and —N(R1)—, R$^y$ is as defined in Formulas XI–XLIII, and Ar$^2$ is a carbocyclic aryl group unsubstituted or substituted with one or more substituents selected from fluoro, $C_{1-20}$ fluoroalkyl, $C_{1-20}$ perfluoroalkyl, $C_{1-20}$ alkenyl, $C_{6-20}$ carbocyclic aryl, $C_{3-20}$ heteroaryl, $C_{1-30}$ hydrocarbyl containing one or more S, N, O, P, or Si atoms; $C_{3-20}$ alkyloxadiazolyl, $C_{3-30}$ aryloxadiazolyl, $C_{3-30}$ alkyltriazolyl, and $C_{3-30}$ aryltriazolyl.

In another embodiment, useful reactive monomers of Formula IV are selected from compounds of Formulas CXVII, CXVIII, and CXIX

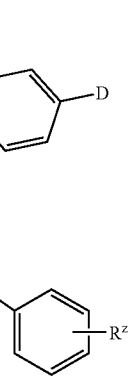

CXVII

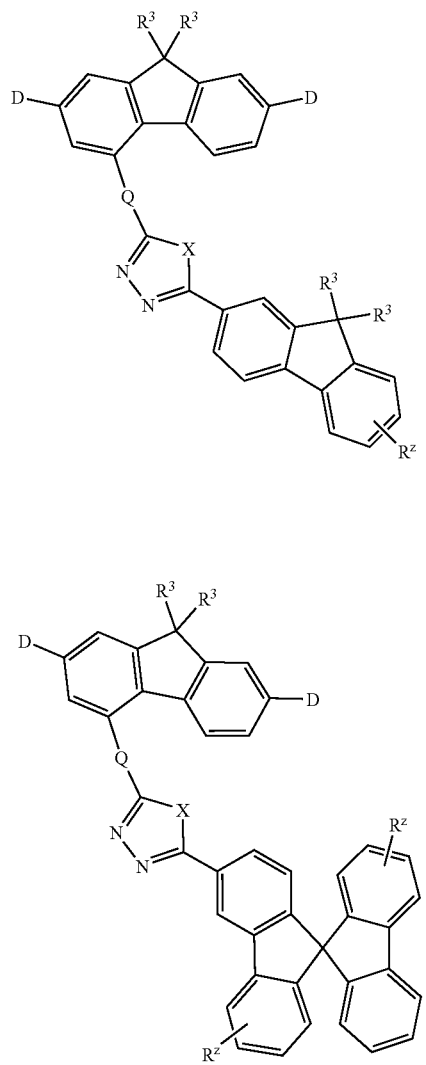

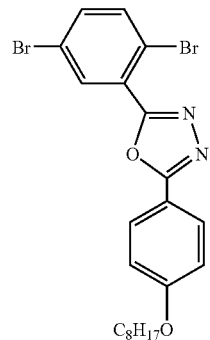

1

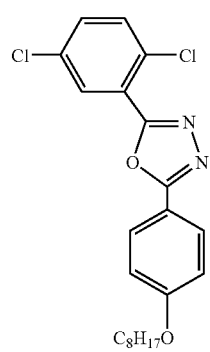

2

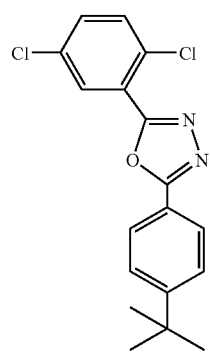

3

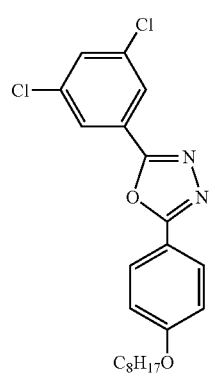

4 wherein D is chlorine, bromine, iodine, boronic acid, or boronic ester, Q is phenylene or a bond, X is selected from —O—, —S—, and —N(R$^1$)—, R$^1$ is aryl, alkyl, heteroaryl, or heteroalkyl, each R$^3$ is as described in Formulas XXVI-I–XLIII, and each R$^z$ when present is as described in Formulas II and III.

Polymerizable difunctional electroactive arylene monomers of the present invention provide a means for incorporating effective amounts of electron transporting monomers into light emitting polymers, including fluorene-containing polymers, without adversely affecting the emission characteristics of the polymers.

Examples of useful reactive monomers comprising electroactive arylene units —Ar$^1$(E$_y$)$_a$- include, but are not limited to the following difunctional electroactive arylene Compounds 1–15:

-continued
5
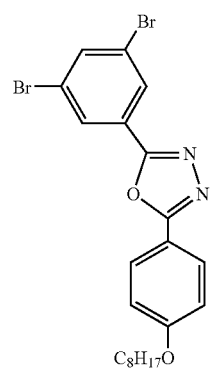
6
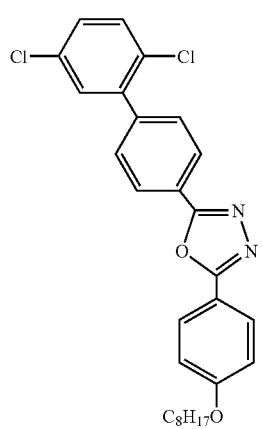
7
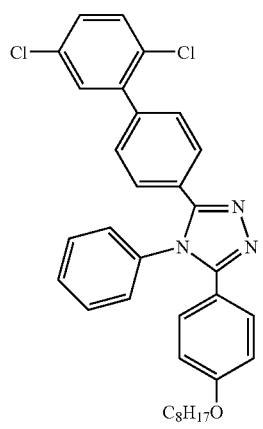
8
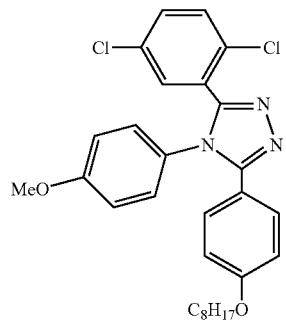
-continued
9
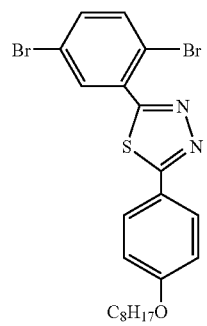
10
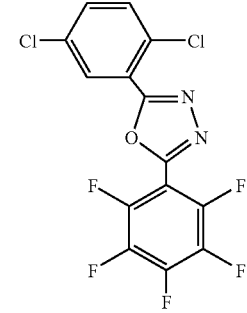
11
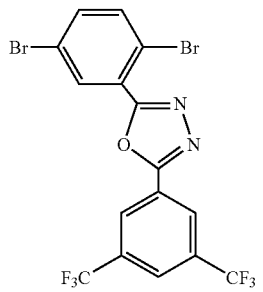
12
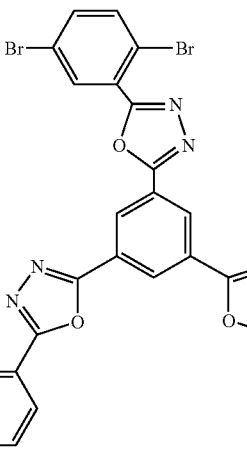

-continued

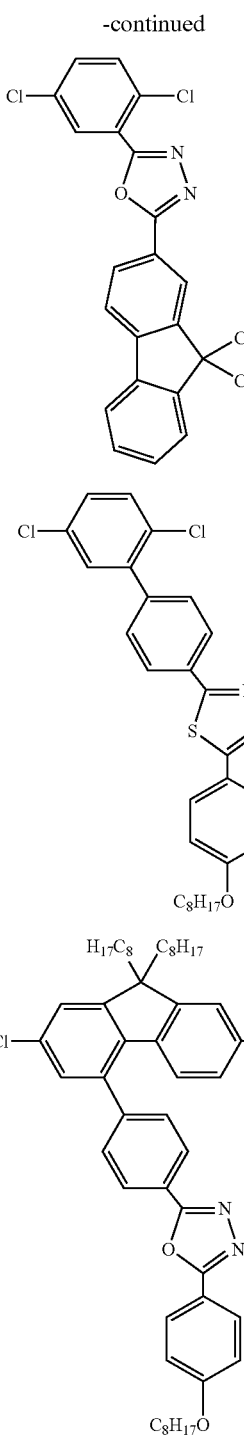

13

14

15

The C$_8$H$_{17}$— groups in the above Compounds can be linear or branched, for example, n-octyl, iso-octyl, and ethylhexyl.

Dihalogenated 1,3,4-oxadiazole monomers of Formula CXXII, which are a subgenus of Formula IV and are of the type Halo-Ar$^1$(E$_y$)-Halo where Ar$^1$ is as defined in Formula I, E$_y$ is Formula II, and Halo is bromo or chloro, can be synthesized by the acylation of substituted tetrazoles as shown in Reaction Scheme II. In Reaction Scheme II, where D$^1$ is Halo, and R$^z$ is as defined above, a dihaloaroyl chloride of Formula CXX is reacted with a substituted tetrazole of Formula CXXI with heating for about 12 hours in an inert solvent such as pyridine (Myznikov et al., *J. Ge. Chem. of USSR*, 62 (6), 1125–1128 (1992)) to form the dihalogenated oxadiazole monomer of Formula CXXII. The tetrazole of Formula CXXI can be prepared by reaction of the corresponding nitrile with NaN$_3$ and NH$_4$Cl in N,N-dimethylformamide (DMF) at reflux.

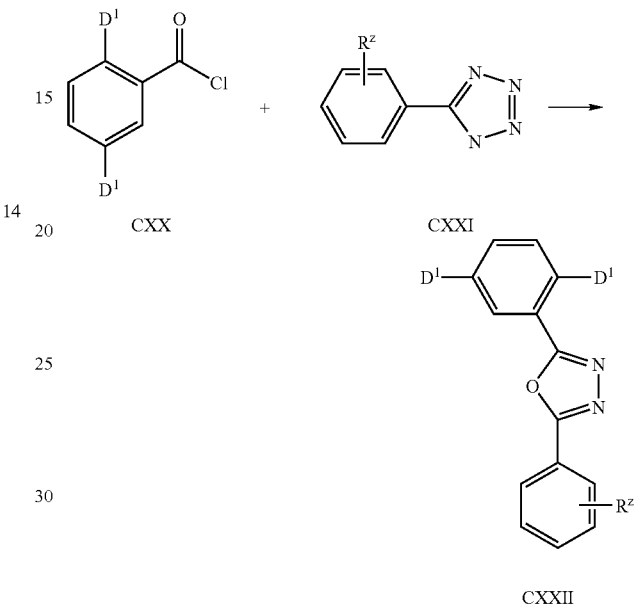

Alternatively, monomers of Formula CXXII can be prepared by cyclocondensation of benzoylaroylhydrazides as shown in Reaction Scheme III (Grekow et al., *J. Gen. Chem. USSR* (*Engl. Transl.*), 30, 3763–3766 (1960)) where D$^1$ and R$^z$ are as defined above. In step (1a) of Reaction Scheme III, a dihaloaroyl hydrazide of Formula CXXIII is reacted with a substituted benzoylchloride of Formula CXXIV at room temperature in dichloromethane (DCM) with one equivalent of triethylamine to form a benzoylaroylhydrazide of Formula CXXV. Alternatively, in step (1b) of Reaction Scheme III, a dihaloaroyl chloride of Formula CXX is reacted with a substituted benzoyl hydrazide compound of Formula CXXVI to form a benzoylaroylhydrazide of Formula CXXV. In step (2) the benzoylaroylhydrazide of Formula CXXV is reacted with phosphorus oxychloride at reflux to form the dihalogenated oxadiazole monomer of Formula CXXII.

Reaction Scheme III

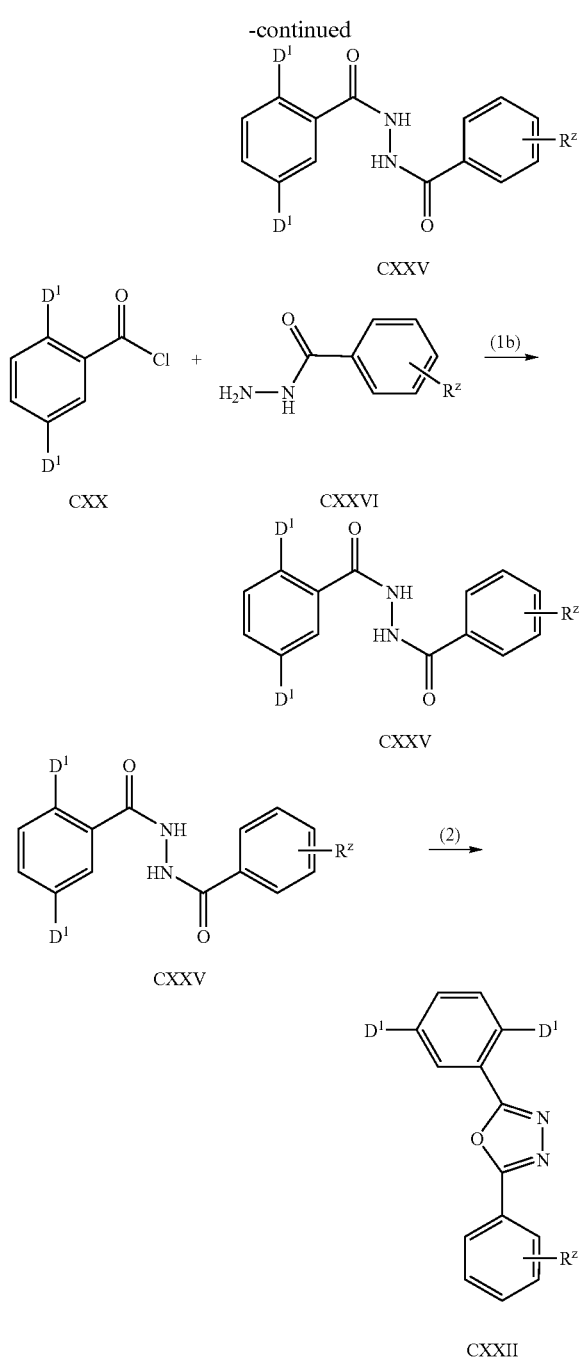

CXXV

CXX  CXXVI

CXXV

CXXV

CXXII

For example, electron transport monomers 1, 2, 3 and 10 were made by condensation of the correponding 2,5-dihalobenzoyl chloride with the appropriately substituted benzoyl hydrazide.

1,3-Dihalogenated monomers are similarly prepared. For example, the new electron transport monomers 2-(3,5-dichlorophenyl)-5-[4-(octyloxy)phenyl]-1,3,4-oxadiazole (4) and 2-(3,5-dibromophenyl)-5-[4-(octyloxy)phenyl]-1,3,4-oxadiazole (5) were prepared by condensation of the corresponding 3,5-dihalobenzoyl chloride with 4-octoxybenzoyl hydrazide, followed by cyclocondensation of the intermediate 3,5-dihalo-N'-[4-(octyloxy)benzoyl]-benzohydrazide. Monohalogenated 1,3,4-oxadiazole end capping group monomers were similarly prepared from the corresponding monohalogenated precursors as shown, for example, in Example 15.

Dihalogenated 1,3,4-thiadiazole monomers of Formula CXXVII, which are subgenus of Formula IV can be prepared by cyclocondensation of the benzoylaroylhydrazide intermediates as shown in Reaction Scheme IV (A. T. Prudchenko, *J. Gen. Chem. USSR (Engl. Transl.)*, 37, 2082–2084(1967)) where $D^1$ and $R^z$ are as defined in Reaction Scheme II. In Reaction Scheme IV the benzoylaroylhydrazide intermediate of Formula CXXV is reacted under metathesis conditions with $P_2S_5$ to provide the 1,3,4-thiadiazoles of Formula CXXVII.

Reaction Scheme IV

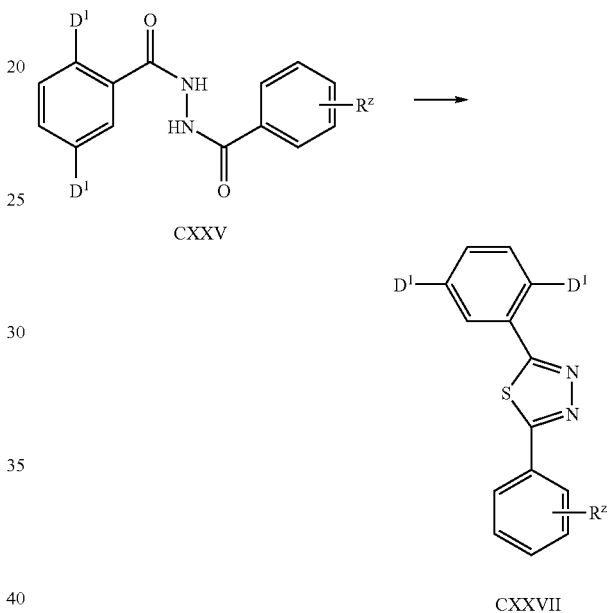

CXXV

CXXVII

For example, the corresponding 3-(2,5-dibromophenyl)-5-[4-(octyloxy)phenyl]-1,3,4-thiadiazole (9) may be made in this way. Monohalogenated 1,3,4-thiadiazole end capping group monomers are similarly prepared from the corresponding monohalogenated precursors.

Dihalogenated 1,3,4-triazole monomers of Formula CXXVIII, which are a subgenus of Formula IV, can be prepared by cyclocondensation of the benzoylaroylhydrazide intermediates as shown in Reaction Scheme V (E. Klingsberg, *J. Org. Chem.* 23, 1086(1958)) where $D^1$ and $R^z$ are as defined in Reaction Scheme II, and $R^1$ is aryl, alkyl, heteroaryl, or heteroalkyl. In step (1a) of Reaction Scheme V the benzoylaroylhydrazide intermediate of Formula CXXV is reacted with phosphorus trichloride at an elevated temperature, e.g., 150° C., in the presence of $R^1NH_2$, wherein $R_1$ is aryl or heteroaryl to provide the 1,3,4-triazole of Formula CXXVIII. Alternatively, in step (1b) of Reaction Scheme V, the benzoylaroylhydrazide is reacted with chlorine in glacial acetic acid (Moss et al., *J. Chem. Soc.* Perkin Trans. 1,9, 1999–2006 (1982)) or other non-reactive solvent to form the 1,4-dichloro-1,4-diphenyl compound of Formula CXXIX. In step (2b) of Reaction Scheme V, the 1,4-dichloro-1,4-diphenyl compound of Formula CXXIX is reacted with $R^1NH_2$ (Gautun et al., *Acta Chem. Scand.*

45(6), 609–615 (1991)), wherein $R_1$ is alkyl or arylalkyl, to provide the corresponding 1,3,4-triazoles of Formula CXXVIII.

Reaction Scheme V

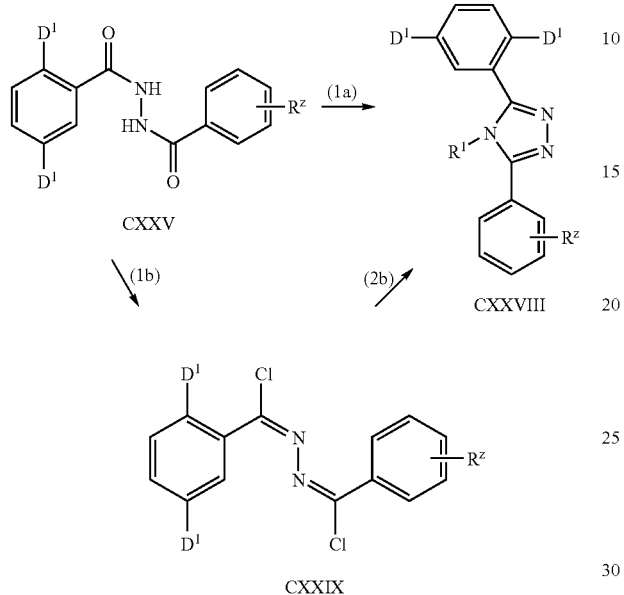

For example, the triazole derivative 3-(2,5-dichlorophenyl)-4-(4-methoxyphenyl)-5-[4-(octyloxy)phenyl]-4H-1,2,4-triazole (8) was made by this method. Monohalogenated 1,3,4-triazole end capping group monomers are similarly prepared from the corresponding monohalogenated precursors.

Dihalogenated 1,3,4-oxadiazole monomers of Formula CXXX, which are a subgenus of Formula IV and are of the type Halo-$Ar^1(E_y)$-Halo where $Ar^1$ is as defined in Formula I, $E_y$ is Formula III, and Halo is bromo or chloro, can be synthesized by Suzuki coupling of a monofunctional diaryloxadiazole with a monoboronic acid/ester of the dihaloarylene as shown in Reaction Scheme VI. In Reaction Scheme VI, where $R^z$ is as defined in Reaction Scheme II, 2,5-dichlorophenyl boronic acid is reacted with a monofunctional 2-(4-bromophenyl)-1,3,4-oxadiazole of Formula CXXXI in the presence of palladium bis(triphenylphosphine)dichloride and sodium carbonate in an inert solvent such as tetrahydrofuran with heat to form the dihalogenated 1,3,4-oxadiazole monomer of Formula CXXX. The 2,5-dichlorophenyl boronic acid can be prepared by reacting 1-bromo-2,5-dichlorobenzene with butyl lithium, then trimethyl borate followed by acidification.

Reaction Scheme VI

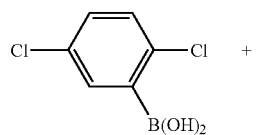

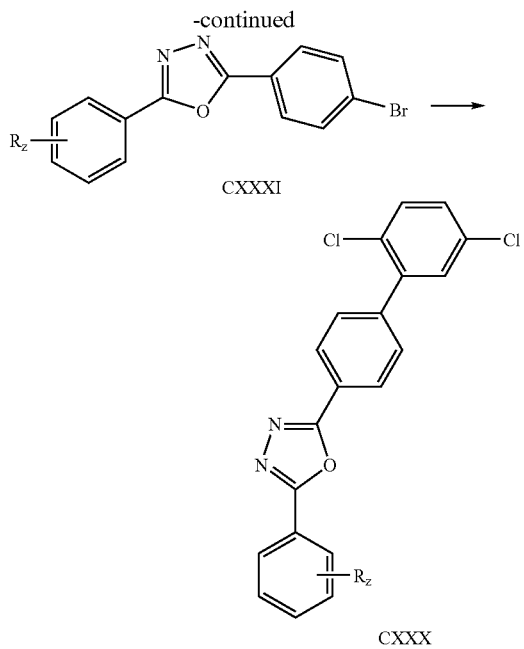

For example, the new electron transport monomer 2-(2', 5'-dichloro-1,1'-biphenyl-4-yl)-5-[4-(octyloxy)phenyl]-1,3,4-oxadiazole (6) can be prepared by reaction of 2,5-dichlorophenyl boronic acid with 2-(4-bromophenyl)-5-[4-(octyloxy)phenyl]-1,3,4-oxadiazole under standard Suzuki coupling conditions. The corresponding 1,3,4-thiadiazole (14) may be similarly prepared by reaction of 2,5-dichlorophenyl boronic acid with 2-(bromophenyl)-5-[4-(octyloxy)phenyl]-1,3,4-thiadiazole under standard Suzuki coupling conditions. Also, the corresponding triazole compound (7) may be similarly prepared by reaction of 2,5-dichlorophenyl boronic acid with the monofunctional 3-(4-bromophenyl)-4-(4-phenyl)-5-[4-(octyloxy)phenyl]-4H-1,2,4-triazole intermediate. The dichloro monomers of Formula CXXX can be converted to the corresponding dibromo monomers by a halogen exchange, for example, by reaction with hydrogen bromide in the presence of a catalytic amount of $FeBr_3$ (Yoon et al., *J. Chem. Soc., Chem. Commun.* 13, 1013–1014 (1987).

In one useful embodiment of Formula IV, —$Ar^1(E_y)$- is a fluorenylene of Formulas XXXI–XXXIII. These can be made, for example, using the diaroylhydrazide cyclocondensation route according to Reaction Scheme VII where $R^z$ is as defined in Reaction Scheme II and where $R^3$ is independently in each case hydrogen, $C_{1-30}$ alkyl, $C_{1-30}$ alkenyl, $C_{6-20}$ aryl, $C_{3-20}$ heteroaryl, or $C_{1-30}$ hydrocarbyl containing one or more S, N, O, P, or Si atoms. In step (1) of Reaction Scheme VII a 2,7-dibromofluorene of Formula CXXXII is converted to the 4-methyl ester of Formula CXXXIII by reaction with methoxycarbonyl chloride in the presence of aluminum chloride in an inert solvent such as carbon disulfide. In step (2), the 4-methyl ester of Formula CXXXIII is converted to the hydrazide of Formula CXXXIV by reaction with hydrazine with heating. In step (3) the hydrazide of Formula CXXXIV is converted to the benzoylaroylhydrazide of Formula CXXXV by condensation with an unsubstituted or substituted benzoyl chloride of Formula CXXIV in the presence of triethylamine. In step (4)

the benzoylaroylhydrazide of Formula CXXXV is cyclocondensed with phosphorus oxychloride at reflux to provide the dibromofluorenyl-1,3,4-oxadiazole of Formula CXXXVI.

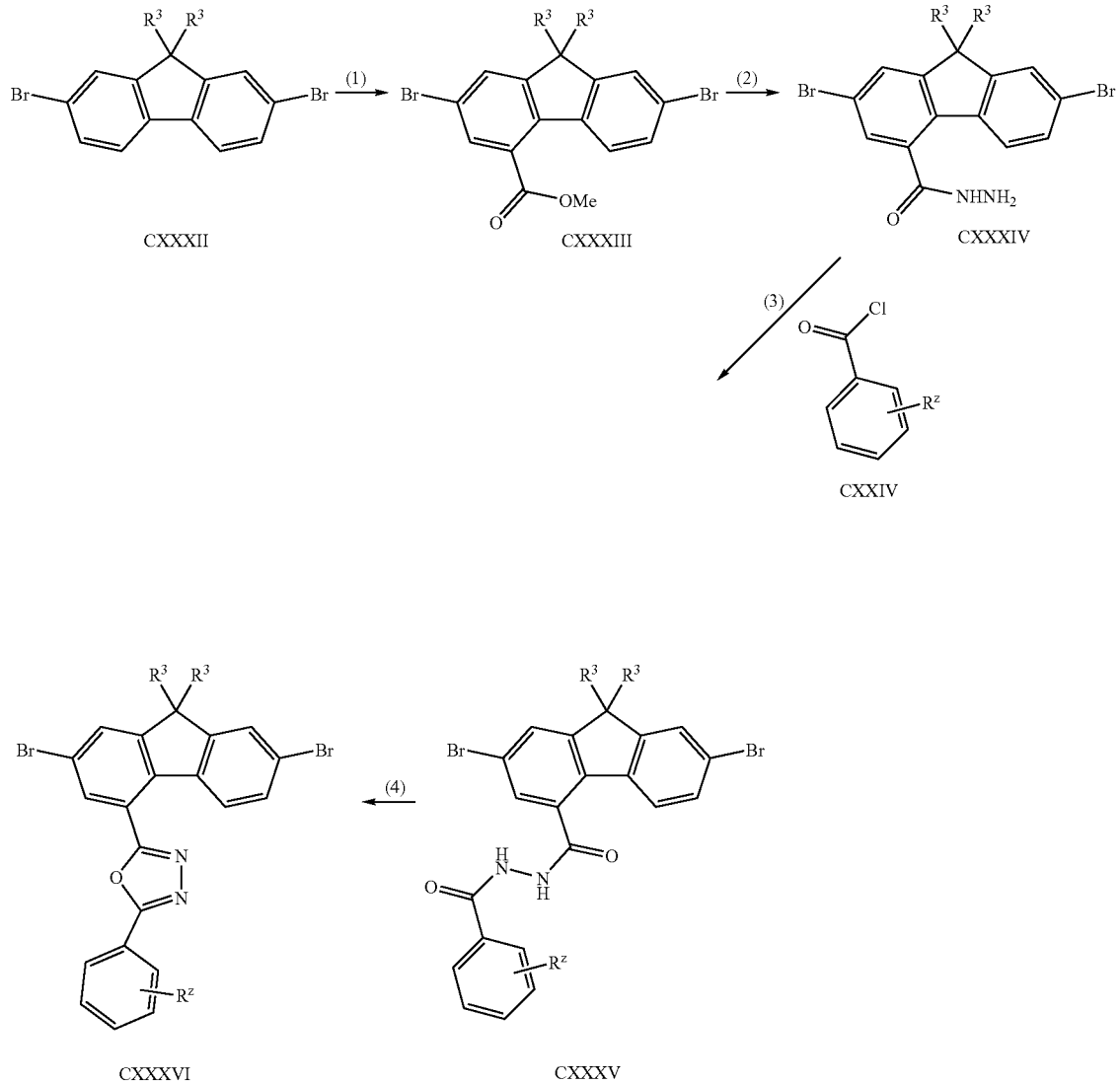

Reaction Scheme VII

For example, the novel electron transport monomer 2-(2,7-dibromo-9,9-dioctyl-9H-fluoren-4-yl)-5-[4-(octyloxy)phenyl]-1,3,4-oxadiazole can be made by this method. In this case, 2,7-dibromo-9,9-disubstituted fluorene monomer is converted to the 4-methyl ester (Bokova et al., *J. Org. Chem.* USSR (Engl.Transl.), 5, 1103–1106 (1969); Schidlo et al., *Chem Ber.*, 96, 2595–2600 (1963)), reacted with hydrazine, and then condensed with 4-(octyloxy)benzoylchloride to give the 2,7-dibromo-N'-[4-(octyloxy)benzoyl]-fluorenoyl hydrazide intermediate which upon cyclocondensation gives the desired monomer.

The corresponding thiadiazole and triazole may be made by reaction of the intermediate benzoylaroylhydrazide of Formula CXXXV with $P_2S_5$ under metathesis conditions as in Reaction Scheme IV to provide the 1,3,4-thiadiazole, and with $R_1NH_2$ as in Reaction Scheme V to provide the 1,3,4-triazole.

In Reaction Scheme VIII below, monomers of Formula IV, wherein —Ar$^1$(E$_y$)$_a$- is Formula XXXI, XXXII, or XXXIII, can also be constructed through an Ulmann self coupling reaction in step (1) of an iodo-substituted benzoyloxy ester of Formula CXXXVII (wherein A is H, Cl, or Br and R' is $C_{1-4}$ alkyl) with copper/bronze (see Rule et al., *J. Chem. Soc.* 1096–1101 (1937); Namkung et al., *J. Med. Chem. Soc.* 8, 551–554 (1965)) followed by acid promoted ring closure in step (2) of the resulting diphenic acid of Formula CXXXVIII (Huntress et al., *J. Am. Chem. Soc.* 55, 4262–4270 (1933)), for example, with sulfuric acid at 170°

C., to give the 9-fluorenone of Formula CXXXIX. Reduction of the 9-fluorenone with red phosphorus in step (3) provides the fluorene of Formula CXL, which can be alkylated at the 9-position in step (4) by reaction with butyl lithium followed by an $R^3$-halide or by phase transfer methods utilizing, for example, benzyltriethylammonium chloride in dimethylsulfoxide, followed by 50% aqueous sodium hydroxide and then $R^3$—Br. Halogenation of the resulting 9-alkylated fluorene of Formula CXLI, wherein A is H and R' is methyl, at the 2 and 7 positions can be done, for example, by reaction with chlorine in methyloxirane in step (5) to give the 2,7-dichloro fluorene of Formula CXLII, wherein R' is methyl (Schidlo et al., *Chem Ber.* 2595–2600 (1963)). Treatment of the 2,7-dichloro fluorene of Formula CXLII with thionyl chloride in step (6) gives the reactive acyl chloride intermediate of Formula CXLIII. The oxadiazole, thiadiazole, or triazole may then be formed at the acyl chloride group of the acyl chloride intermediate via a benzohydrazide intermediate as in Reaction Schemes III–V or by direct coupling with a tetrazole as in Reaction Scheme II.

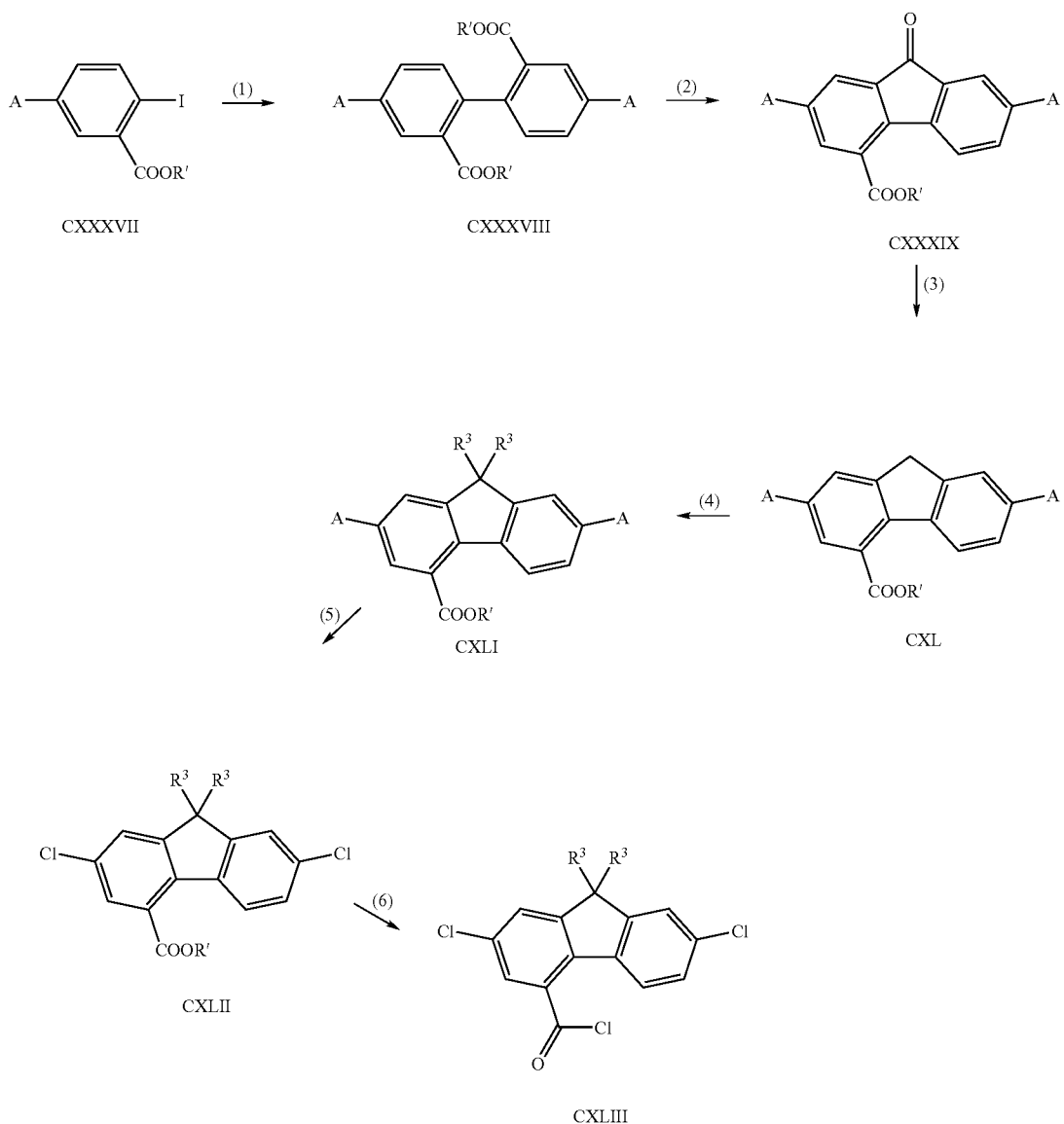

The novel electron transport monomer 2-[4-(2',7'-dichloro-9',9'-dioctyl-9'H-fluoren-4'-yl)phenyl]-5-[4-(octyloxy)phenyl]-1,3,4-oxadiazole (15)

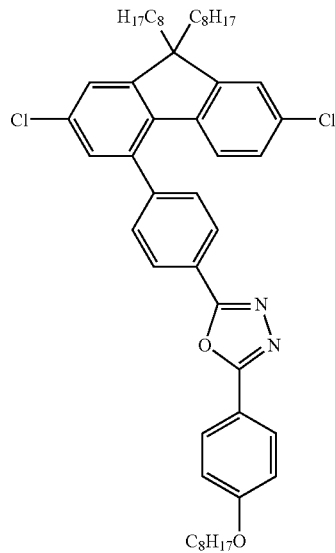

can be prepared by monobromination of 2,7-dichloro-9,9-dioctyl-9H-fluorene to give 4-bromo-2,7-dichloro-9,9-dioctyl-9H-fluorene, conversion to the corresponding dichloroboralane followed by reaction with 2-(4-bromophenyl)-5-[4-(octyloxy)phenyl]-1,3,4-oxadiazole under standard Suzuki coupling conditions.

Monomers of Formula IV, wherein —Ar$^1$(E$_y$)$_a$- is a 9,10-dihydrophenanthrene of Formula XXVII, XXVIII, or XXIX can be synthesized by the process shown in Reaction Scheme IX below. In step (1), Suzuki coupling of the phenylborolane of Formula CXLV with the methyl cyanobromobenzoate of Formula CXLIV provides the cyanodiphenic ester of Formula CXLVI. In step (2), acyloin reduction (Fritsch et al., Chem Ber. 125, 849–855 (1992) can provide the cyano-9,10-dihydrophenanthrene of Formula CXLVII. In step (3), dibromination with bromine, for example, in methylene choride at room temperature, of CXLVII provides the dibromo-cyano-9,10-dihydrophenanthrene of Formula CXLVIII, the cyano group of which can be converted to a carboxylic acid group by treatment with base or to a tetrazole group by treatment with NaN$_3$ and NH$_4$Cl in DMF at reflux. An oxadiazolyl, thiadiazolyl, or triazolyl group can be formed from the carboxylic acid group by first halogenation with thionyl chloride or chlorine in methyloxirane, followed by formation of the oxadiazole, thiadiazole, or triazole group as in Reaction Schemes III, IV, or V. The tetrazole can be reacted with an aryloyl chloride as shown in Reaction Scheme II to form an oxadiazole.

Reaction Scheme IX

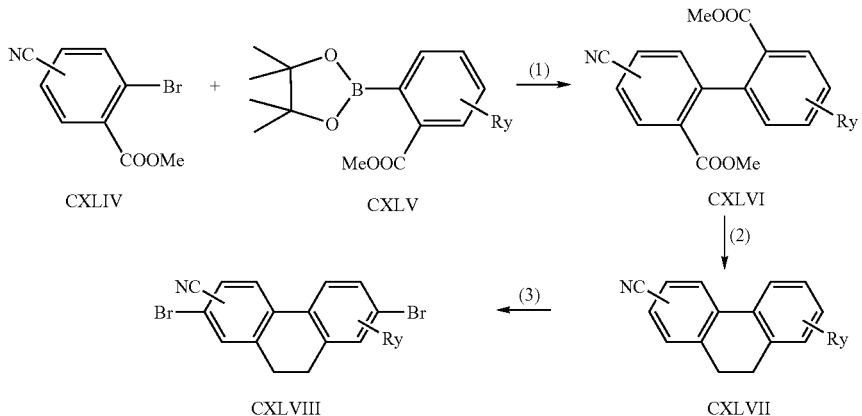

Monomers of Formula IV, wherein —Ar$^1$(E$_y$)$_a$- is Formula XXXV, XXXVI, XXXVII, or XXXVIII may be made as illustrated by the preparation of a 2,8-dibromo-6,12-dihydroindeno[1,2-b]fluorene using the process of Reaction Scheme X. In step (1), Suzuki coupling of 2-(2,5-dimethylphenyl)-4,4,5,5-tetramethyl [1,3,2]dioxaborolane with commercially available 2-bromo-9-fluorenone provides 2-(2,5-dimethylphenyl)fluoren-9-one. Commercially available 2-bromo-p-xylene is converted to 2-(2,5-dimethylphenyl)-4,4,5,5-tetramethyl[1,3,2]dioxaborolane by treatment with butyl lithium and reaction of the lithiated intermediate with 2-isopropoxy-4,4,5,5-tetramethyl[1,3,2]dioxaborolane. In step (2), 2-(2,5-dimethylphenyl)fluoren-9-one can be converted to 2-bromo-7-(4-bromo-2,5-dimethylphenyl)fluoren-9-one with bromine in chloroform at 0° C. Regiospecific bromination at the 4'-position of the phenyl ring is directed by the 5'-methyl and fluorene substituents. In step (3), 2-bromo-7-(4-bromo-2,5-dimethylphenyl)fluoren-9-one can undergo potassium permanganate oxidation to provide 2-bromo-5-(7-bromo-9-oxo-9H-fluoren-2-yl)-terephthalic acid. Ring closure, in step-(4), to 2,8-dibromo-6,12-dioxa-6,12-dihydroindeno[1,2-b]fluorene-3-carboxylic acid is effected by treatment with sulfuric acid. Reduction of 2,8-dibromo-6,12-dioxa-6,12-dihydroindeno[1,2-b]fluorene-3-carboxylic acid, in step (5), with red phosphorus provides 2,8-dibromo-6,12-dihydroindeno[1,2-b]fluorene-3-carboxylic acid. In step (6), alkylated by reaction with butyl lithium followed by an R$^3$-halide or by phase transfer methods utilizing, for example, benzyltriethylammonium chloride in dimethylsulfoxide, followed by 50% aqueous sodium hydroxide and then R$^3$—Br provides the indeno[1,2-b]fluorene derivative of Formula CXLIX. Treatment of the indeno[1,2-b]fluorene of Formula CXLIX with thionyl chloride gives the reactive acyl chloride intermediate of Formula CL. The oxadiazole, thiadiazole, or triazole may be formed at the acyl chloride group of the acyl chloride intermediate via a benzhydrazide intermediate as in Reaction Schemes III–V or by direct coupling with a tetrazole as in Reaction Scheme II. In step (8), for example, the oxadiazole of Formula CLI is provided by reaction of the acyl chloride intermediate of Formula CL with 5-(4-octyloxyphenyl)-1H-tetrazole as in Reaction Scheme II.

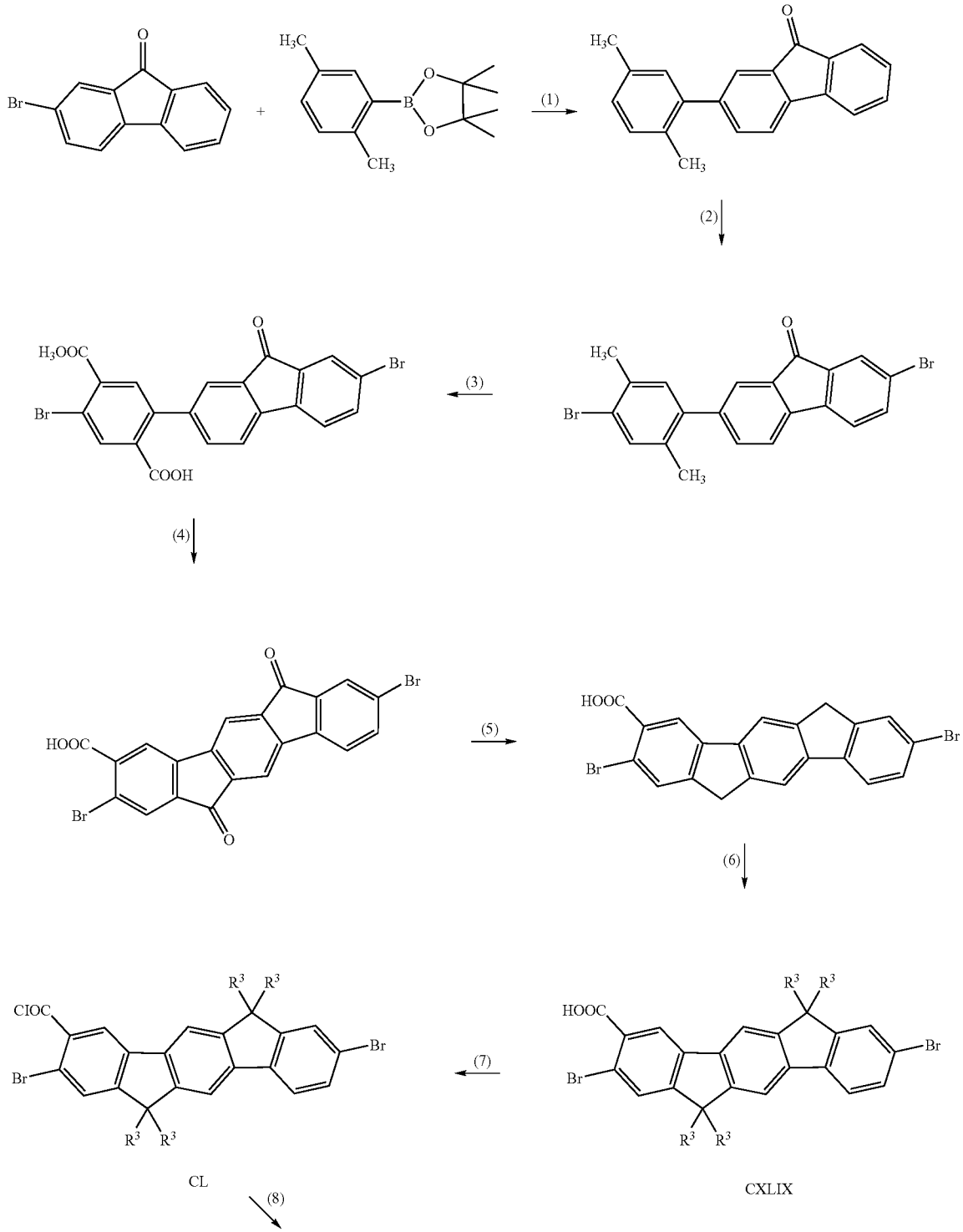

Reaction Scheme X

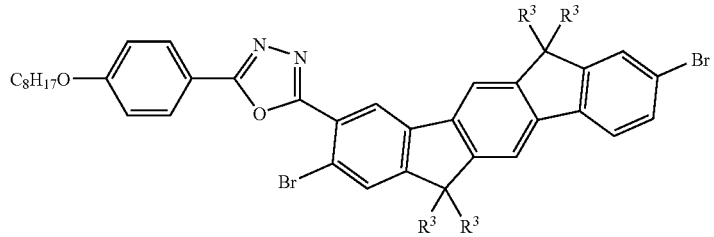

CLI

Monomers of Formula IV, wherein —Ar¹(E$_y$)$_a$- is Formula XLIII with one or both terminal rings substituted with E$_y$, may be made by first making a dicarboxylic acid of 3,10-dibromo-5,6,12,13-tetrahydrodibenzo[a,h]anthracene as illustrated in Reaction Scheme XI, below. In step (1), dimethyl 2,4-dibromoterephthalate (available from Maybridge Chemical Co., UK) is reacted with the cyanophenylborolane of Formula CLII (see Kristensen et al., Org. Lett. 10, 1435–1438 (2001)) to provide the cyano substituted triphenyl compound of Formula CLIII. Acyloin reduction (see Fritsch et al., Chem Ber. 125, 849–855 (1992)) of the compound of Formula CLIII, in step (2), can give the dicyano substituted 5,6,12,13-tetrahydrodibenzo[a,h]anthracene of Formula CLIV. Dibromination, for example, with bromine in chloroform at 0° C., in step (3), can provide the dicyano substituted 3,10-dibromo-5,6,12,13-tetrahydrodibenzo[a,h]anthracene of Formula CLV. Treatment of the compound of Formula CLV, in step (4), with base can give the dicarboxylic acid of Formula CLVI. In step (5), treatment of the compound of Formula CLVI with thionyl chloride can give the reactive acyl chloride intermediate of Formula CLVII.

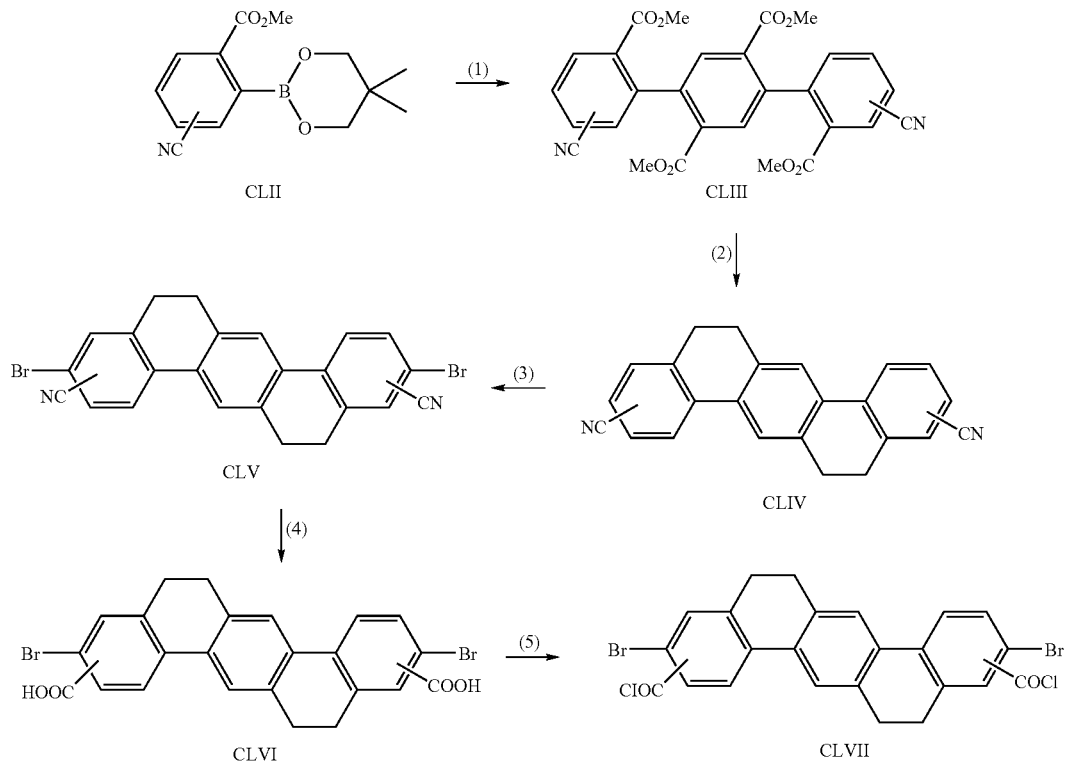

Reaction Scheme XI

The oxadiazole, thiadiazole, or triazole may be formed at the acyl chloride groups of the acyl chloride intermediate of Formula CLVII via a benzoylaroylhydrazide intermediate as in Reaction Schemes III–V or by direct coupling with a tetrazole as in Reaction Scheme II.

As an alternative, the cyano groups of the dicyano substituted 3,10-dibromo-5,6,12,13-tetrahydrobenzo[a,h]anthracene or Formula CLV can be converted to tetrazole groups by treatment with NaN$_3$ and NH$_4$Cl in DMF at reflux.

The tetrazole can be reacted with an aryloyl chloride as shown in Reaction Scheme II to form an oxadiazole.

The monocyano substituted 5,6,12,13-tetrahydrodibenzo[a,h]anthracene of Formula CLVIII can be made through a sequential Suzuki coupling shown in Reaction Scheme XII. In step (1), the phenylborolane of Formula CLIX is reacted with excess (typically 5 equivalents) dimethyl 2,4-dibromoterephthalate to give the 4-bromobiphenyl of Formula CLX as the major product. In step (2), after purification, the 4-bromobiphenyl of Formula CLX is reacted with the cyanophenylborolane of Formula CLII under similar Suzuki coupling conditions to give the monocyano substituted triphenyl of Formula CLXI. In step (3), acyloin reduction as in Reaction Scheme XI provides the monocyano substituted 5,6,12,13-tetrahydrodibenzo[a,h]anthracene of Formula CLVIII. Subsequent dibromination, for example, with bromine in chloroform at 0° C., in step (4), may give the dibromo monocyano compound of Formula CLXII. The dibromo monocyano compound of Formula CLXII may be reacted with with $NaN_3$ and $NH_4Cl$ in DMF at reflux, in step (5), to form the tetrazole of Formula CLXIII, which can be reacted with an aroyl chloride, $Ar^2C(O)Cl$, in step (6) to form the 5,6,12,13-tetrahydrodibenzo[a,h]anthracene bearing a pendant oxadiazole of Formula CLXIV. Alternatively, the cyano group on the compound of Formula CLXII can be hydrolyzed to form the carboxylic acid, which can in turn be treated with thionyl chloride to form the acyl chloride intermediate. The acyl chloride intermediate maybe reacted with an aroyl hydrazide as in Reaction Scheme III to form a benzoylaroylhydrazide, which can be converted to an oxadiazole, thiadiazole, or triazole as described in Reaction Schemes III–V, providing monomers of Formula IV, wherein —$Ar^1(E_y)_a$- is Formula XLIII with one terminal ring substituted with $E_y$.

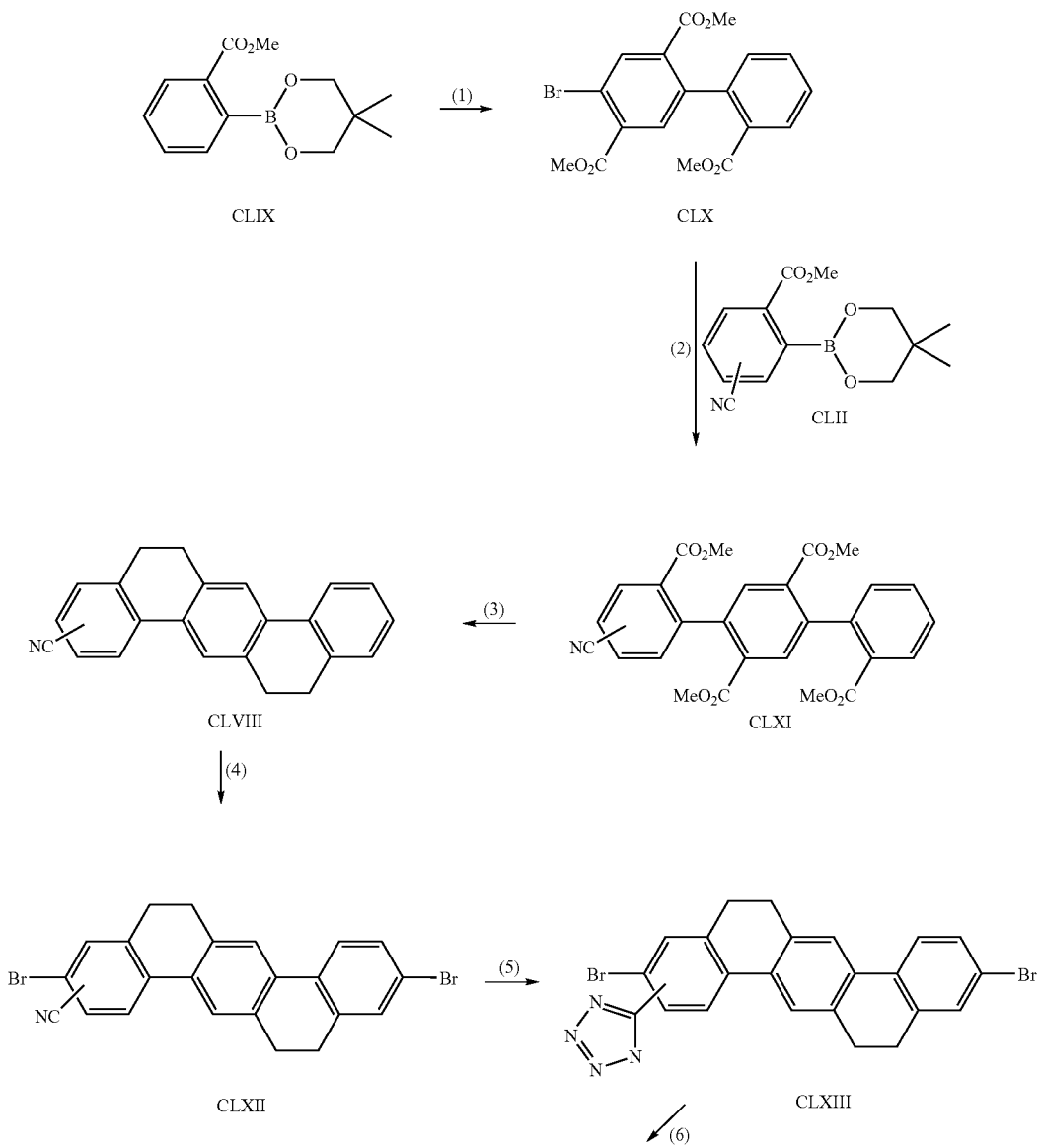

Reaction Scheme XII

-continued

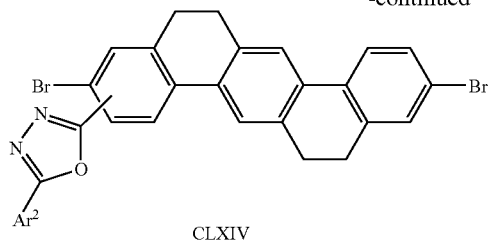

CLXIV

The dihalo monomers prepared as described in the above reaction schemes can be converted to the corresponding diborolane by treatment with bis(pinacolato)diboron and potassium acetate catalyzed by [1,1'-bis(diphenylphosphino) ferrocene]dichloropalladium in dimethyl sulfoxide (Meng et al., *J. Am. Chem. Soc.* 123(37), 9214–9215 (2001)) to give the diborolane derivative.

Electroactive Compositions

In another broad aspect, this invention provides electroactive compositions comprising an electroactive polymeric arylene of the invention.

There is a need in the art for solution processible electroluminescent compositions that can be uniformly coated or printed onto a substrate for the purpose of fabricating OLED devices. All the components of a solution processible composition are soluble in a common solvent or mixture of solvents, and the solution processible composition can be coated onto a substrate to form a continuous film, preferably free of pin holes. OLED devices prepared from these compositions preferably should provide low operating voltages, high external quantum efficiencies, proper color coordinates (e.g. red, green and blue for display applications, white for backlight applications), long operating lifetimes, and compatibility with the printing process (e.g. inkjet printing, thermal induced laser imaging, gravure printing, etc).

One particularly attractive approach has been to prepare blends of small molecule agents (hole transport agent, electron transport agent, and emissive molecular dopant) in an inert polymeric matrix such as polystyrene. This is referred to as a molecularly doped polymer composition. Such compositions are solution processible. However, the inert matrix does little to assist in the transport of charge carriers, leading to higher operating voltages and shorter device lifetimes. The voltage can be decreased by employing a charge carrier in the polymer host. For example, polyvinyl carbazole (a p-type, or hole transporting polymer) can be used as a host for molecular electron transport materials and emissive dopants to fabricate electroluminescent devices with lower operating voltages.

Low molecular weight emitting materials tend to be p-type (that is, they preferentially transport holes) due to their low electron affinities, which means that they require n-type electron-transport companions or companion layers in electroluminescent devices in order to show luminescence. There has been a shortage in the art of n-type electron transport polymers to serve as solution processible host materials for making blended emissive organic elements. The desired features of electron transport materials are (i) large electron affinity and high electron mobility for efficient injection and transport of electrons, and (ii) large band gap in order to prevent energy transfer of excitons, which are produced by charge recombination within the electroluminescent species, or from the electroluminescent species to the electron transport material.

In one useful embodiment, the electroactive composition is an electroluminescent composition comprising an electroactive polymeric arylene of the invention; said composition optionally includes other materials, such as, for example, hole transport material, electron transport material, binder, polymeric binder, molecular emitters, light emitting polymers (LEP's), waveguiding particles, phosphorescent compounds, and color conversion materials.

One embodiment relates to blends of two or more of the homopolymers or copolymers of the invention without limits on relative proportions of the individual components. Such blends may be prepared by solution blending, or blending in the melt state.

A second embodiment relates to blends containing at least 0.1 weight % of at least one electroactive polymeric arylene (homopolymer or copolymer) of the invention with a material selected from another electroactive polymer, an electroactive small molecule, an inert polymer binder, and combinations thereof. Such blends may be prepared by solution blending, or blending in the melt state.

These compositions can be useful for making organic electronic devices by thermal patterning of the materials onto a receptor. They can also be useful for non-thermal printing, patterning, and transfer methods including, for example, inkjet printing, screen printing, and photolithographic patterning.

Hole transport materials include hole transport monomers and polymers. Hole transport monomers useful in these blended systems are preferably selected from tertiary aromatic amine derivatives as defined above, electron rich heteroarylene derivatives as defined above, electron rich inorganic and organometallic complexes. Other examples include copper phthalocyanine (CuPC); and other compounds such as those described in H. Fujikawa et al., *Synthetic Metals*, 91, 161 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233–274 (2001), both of which are incorporated herein by reference.

Hole transport polymers useful in these blends include polymers derived from the hole transport monomers mentioned above, polyvinyl carbazoles, and triaryl amine based polymers of the types taught in DE 3610649, U.S. Pat. No. 5,681,664, WO 9932537 and WO 9806773, all of which are incorporated herein by reference.

Electron transport materials include electron transport monomers and polymers. Electron transport monomers useful in these blends are preferably selected from condensed polycyclic arylenes as defined above, heteroaromatic compounds comprising imine linkages as defined above, and electron deficient inorganic complexes. Exemplary electron transport monomers include oxadiazoles such as 2-(4-biphenyl)-5-(4-t-butylphenyl)-1,3,4-oxadiazole (also known as PBD) and 1,3-bis[5-(4-(1,1-dimethylethyl)phenyl)-1,3,4-oxadiazol-2-yl]benzene (known as PBD dimer) as well as starburst and dendrimeric derivatives of oxadiazoles (Bettenbhausen et al., *Synthetic Metals,* 91, 223 (1997)); N-substituted triazole derivatives such as 3-(4-biphenylyl)-4-phenyl-5-(4-tert-butylphenyl)1,2,4-triazole (also known as TAZ) as well as starburst and dendrimeric derivatives of triazoles; organometallic compounds such as tris(8-hydroxyquinolato) aluminum ($Alq_3$) and biphenylatobis(8-hydroxyquinolato)aluminum (BAlq); and other compounds described in C. H. Chen, et al., *Macromol. Symp.* 125, 1 (1997) and J. V. Grazulevicius, P. Strohriegl, "Charge-Transporting Polymers and Molecular Glasses", *Handbook of Advanced Electronic and Photonic Materials and Devices,* H. S. Nalwa (ed.), 10, 233 (2001), both of which are incorporated herein by reference.

Molecular emitters useful in these blends are preferably selected from, but not limited to, molecular emitters derived from fluorescent polynuclear carbocyclic arylene and heteroarylene derivatives, phosphorescent cyclometallated chelate complexes of Ir(III), Rh(III), Os(II), Ru(II), Ni(II) and Pt(II), and fluorescent chelate complexes of Zn(II) and Al(III). Examples of useful fluorescent polynuclear carbocyclic arylene emitters include molecules derived from perylene, benzo[g,h,i]perylene, anthracene, pyrene, decacyclene and fluorenes. Examples of useful fluorescent polynuclear heteroarylene derivatives include molecules derived from coumarins such as 10-(2-benzothiazolyl)-2,3,6,7-tetrahydro-1,1,7,7-tetramethyl-1H,5H,11H-[1]benzopyrano[6,7,8-i,j]quinolizin-11-one (also known as Coumarin C545T), 3-(2-benzothiazolyl)-7-diethylaminocoumarin (also known as Coumarin 6 or Coumarin 540), and 3-thiophenyl-7-methoxycoumarin. Examples of useful phosphorescent cyclometallated chelate complexes of Ir(III), Rh(III), Os(II), Ru(II), and Pt(II) include molecules derived from phosphorescent organometallic $L^1_3Ir(III)$, $L^1_3Rh(III)$, $L^1L^2Ir(III)X$, $L^1L^2Rh(III)X$, $L^1L^2Os(II)Y$, $L^1L^2Ru(II)Y$, $L^1L^2Pt(II)$ compounds where $L^1$ and $L^2$ can be the same or different in each instance and are optionally substituted cyclometallated bidentate ligands of 2-(1-naphthyl)benzoxazole, 2-phenylbenzoxazole, 2-phenylbenzothiazole, 2-phenylbenzimidazole, 7,8-benzoquinoline, coumarin, phenylpyridine, benzothienylpyridine, 3-methoxy-2-phenylpyridine, thienylpyridine, tolylpyridine; X is selected from the group consisting of acetylacetonate ("acac"), hexafluoroacetylacetonate, salicylidene, picolinate, and 8-hydroxyquinolinate; Y is selected from charge neutral chelating compounds such as optionally substituted derivatives of phenathroline or bipyridine. Useful cyclometallated Ir(III) chelate derivatives include those taught in WO 0070655 and WO 0141512 A1, both incorporated herein by reference, and useful cylcometallated Os(II) chelate derivatives include those taught in U.S. Ser. No. 09/935,183 filed Aug. 22, 2001, incorporated herein by reference. Platinum(II) porphyrins such as octaethyl porphyrin (also known as Pt(OEP)) are also useful. Examples of useful fluorescent chelate complexes of Zn(II) and Al(III) include complexes such as bis(8-quinolinolato) zinc(II), bis(2-(2-hydroxyphenyl)benzoxazolate) zinc(II), bis(2-(2-hydroxyphenyl)benzothiazolate) zinc(II), bis(2-(2-hydroxyphenyl)-5-phenyl-1,3,4-oxadiazole) zinc(II), bis(8-quinolinolato) aluminum(III), and biphenylatobis(8-hydroxyquinolato)aluminum (BAlq). Useful fluorescent Zn(II) chelates include those taught by Tokito et al., *Synthetic Metals,* 111–112, 393–396 (2000) and in WO 01/39234 A2, incorporated herein by reference. Useful Al(III) chelates include those taught in U.S. Pat. No. 6,203,933 B1, incorporated herein by reference.

Examples of LEPs for use in these blends are polymers and copolymers of the polyfluorenes (PFs), polyparaphenylenes (PPPs), and polyphenylenevinylenes (PPVs).

In one particularly useful embodiment, the electroactive polymeric arylene (homopolymer or copolymer) of the invention is blended with one or more materials selected from hole transport polymers, hole transport monomers, electron transport monomers, and inert polymer binders to provide a composition that supports transport of both holes and electrons. Optionally, this film is charge balanced by virtue of the blend ratio and components. Optionally, a light emitting polymer or molecular emitter is added to the blend to form a solution processable composition that can be formed into a light emitting element. One exemplary composition for this type of blend comprises (1) a homopolymer of Formula V or a copolymer of Formulas VI–VIII wherein greater than 25% of the monomer units in the electroactive polymeric arylene are arylene units $—Ar^1(E_y)_a-$ and at least 90% of the remaining monomer units are independently phenylene group arylene units or naphthalene group arylene units, (2) one or more hole transport monomers, preferably derived from the class of tertiary aromatic amines, in an amount that is 5%–50% by weight with respect to the polymer, and (3) one or more molecular emitters in an amount that is 0.05–10% by weight with respect to the polymer. The molecular weight of the host polymer is preferably in the range of Mw=2,000 to 100,000, more preferably in the range of Mw=3,000–50,000, even more preferably in the range of Mw=5,000–30,000. Exemplary molecular emitters include derivatives of perylene, benzo [g,h,i]perylene, t-butylated decacyclene, platinum(II) porphyrins, coumarins, styryl dyes, 8-quinolinolato zinc(II) complexes, 8-quinolinolato aluminum(III) complexes, and cyclometallated iridium(III) chelate derivatives. One exemplary host electroactive polymeric arylene is a homopolymer of Formula V wherein X=O and $Ar^1$ is phenylene or fluorenylene. Another exemplary host polymer is a copolymer of Formulas VI–VIII wherein $Ar^1$ is phenylene or fluorenylene and $Ar^3$ and $Ar^4$ are derived from phenylene or fluorenylene.

These types of compositions are solution processible, can be spin coated to provide thin films that are electroluminescent, can be thermally imaged to form pixilated arrays useful in OLED display manufacture, and can be optimized to give rise to high quantum efficiency electroluminescence by varying the thickness of the film and the ratio of components within the ranges specified. Operating voltages are significantly reduced relative to control lamps prepared by replacing the electroactive polymeric arylene host with a corresponding amount of polystyrene and a molecular electron transport agent of the same general structure as $Ar^1-(E_y)_a$. The emission color can be varied by choice of the emitter. For example, perylene, $Zn(ODZ)_2$, or 3-thienyl-7-methoxycoumarin give rise to blue emission, $Ir(bthpy)_2(acac)$ or platinum octaethylporphyrin gives rise to red emission, Coumarin 6, Coumarin C545T and $Ir(ppy)_3$ give rise to green emission, t-butylated decacyclene gives rise to white emission. In the case of electroluminescent host electroactive polymeric arylenes, especially those comprising fluorene monomer units, emission from both the polymer and from the molecular emitter can be achieved (e.g. blue emission from the polymer, green emission from the emitter). This provides a way to generate a white emissive film for backlight applications.

In a second particularly useful embodiment, an electroluminescent copolymer of the invention is blended with one or more materials selected from hole transport polymers, hole transport monomers, or electron transport monomers, and inert polymer binders to provide a solution processible composition that supports transport of both holes and electrons and can be formed into a light emitting element. Optionally, this film is charge balanced by virtue of the blend ratio and components. Optionally, a second light emitting polymer or a molecular emitter is added to the blend to form a modified light emitting composition. One exemplary composition for this type of blend comprises (1) less than 50% by weight, more preferably less than 25% by weight, based on the weight of the composition, of a copolymer of Formulas VI–VIII wherein 5–75% of the monomer units are electroactive arylene units $Ar^1\text{-}(E_y)_a$ and the polymer is electroluminescent by virtue of the choice of $Ar^1$ and the comonomers $Ar^3$ and $Ar^4$, (2) one or more hole transport monomers, preferably derived from the class of tertiary aromatic amines, and (3) one or more electron transport monomers, preferably derived from the class of heteroaryl compounds having imine linkages. These compositions are solution processible, can be spin coated to provide thin films that are electroluminescent, can be thermally imaged to form pixilated arrays useful in OLED display manufacture, and can be optimized to give rise to high quantum efficiency electroluminescence by varying the thickness of the film and the ratio of components within the ranges specified. Electroluminescence of these compositions derives principally from the light emitting polymer of Formula VI–VIII.

For this type of composition, the blending of the polymer with hole and electron transport monomers improves thermal transfer characteristics relative to the neat polymer. Incorporation of electroactive arylene units $\text{—}Ar^1(E_y)_a\text{-}$ into the polymer structure improves the efficiency for migration of charge carriers onto the polymer from the molecular host comprised of hole and electron transport monomers, when compared with blending of a corresponding light emitting polymer that does not comprise the $\text{—}Ar^1(E_y)_a\text{-}$. This has the effect of decreasing background current and exciton formation in the molecular host, while increasing the efficiency for exciton recombination on the emissive polymer. The emission color can be varied by choice of $Ar^1$, $Ar^3$, and $Ar^4$ in Formulas VI–VIII.

Organic Electronic Devices

In another broad aspect, the present invention provides organic electronic devices comprising one or both of the electroactive polymeric arylenes and electroactive compositions of the present invention.

Organic electronic devices are articles that include layers of organic materials, at least one of which can conduct an electric current. Examples of organic electronic devices that can be made using the polymers and electroactive compositions of this invention include organic transistors, photovoltaic devices, organic electroluminescent (OEL) devices such as organic light emitting diodes (OLEDs), and the like.

In one embodiment, this invention provides organic electroluminescent devices that comprise one or both of the electroactive polymeric arylenes and electroactive compositions of the present invention; wherein one or both are electroluminescent.

Organic electroluminescent (OEL) display or device refers to electroluminescent displays or devices that include an organic emissive material, whether that emissive material includes a molecular emitter, a small molecule (SM) doped polymer, a light emitting polymer (LEP), a doped LEP, a blended LEP, or another organic emissive material whether provided alone or in combination with any other organic or inorganic materials that are functional or non-functional in the OEL display or devices. OLEDs have potential use in applications such as backlighting of graphics, pixelated displays, and large emissive graphics.

In at least some instances, an OEL device includes one or more layers, of one or more suitable organic materials, referred to as the organic emissive element, sandwiched between a cathode and an anode. The emissive element must be capable of electron transport and hole transport as well as light emission. When activated, electrons are injected into the organic layer(s) from the cathode and holes are injected into the organic layer(s) from the anode. Electrons reside in the emissive element as radical anions and holes as radical cations. As the injected charges migrate towards the oppositely charged electrodes, they may recombine to form electron-hole pairs which are typically referred to as excitons. The region of the device in which the exitons are generally formed can be referred to as the recombination zone. These excitons, or excited state species, can emit energy in the form of light as they decay back to a ground state.

A light emitting layer in the emissive element includes a light emitting polymer or a molecular emitter and optionally includes other materials, such as, for example, hole transport material, electron transport material, binder, polymeric binder, waveguiding particles, phosphorescent compounds, and color conversion materials.

Electroluminescent polymers and electroluminescent compositions of this invention are particularly useful as organic emissive elements in OEL devices because they provide a high quantum efficiency and long service life from a solution processible and thermally printable composition.

Other layers can also be present in OEL devices such as hole transport layers, electron transport layers, hole injection layer, electron injection layers, hole blocking layers, electron blocking layers, buffer layers, and the like. In addition, photoluminescent materials can be present in the electroluminescent layer or other layers in OEL devices, for example, to convert the color of light emitted by the electroluminescent material to another color. These and other such layers and materials can be used to alter or tune the electronic properties and behavior of the layered OEL device, for example to achieve a desired current/voltage response, a desired device efficiency, a desired color, a desired brightness, and the like.

Electroactive polymeric arylenes of the present invention can also be particularly useful as a hole blocking layer and an electron transport layer in OEL devices.

A typical anode is indium-tin-oxide (ITO) sputtered onto a transparent substrate such as plastic or glass. Suitable OLED substrates include glass, transparent plastics such as polyolefins, polyethersulfones, polycarbonates, polyesters, polyarylates, and polymeric multilayer films, ITO coated barrier films such as the Plastic Film Conductor available from 3M Optical Systems Division (3M, St. Paul, Minn.), surface-treated films, and selected polyimides. It is highly desirable that the OLED substrate has barrier properties matching those of the protective (or counter electrode) film. Flexible rolls of glass may also be used. Such a material may be laminated to a polymer carrier for better structural integrity.

The anode material coating the substrate is electrically conductive and may be optically transparent or semi-transparent. In addition to ITO, suitable anode materials include indium oxide, fluorine tin oxide (FTO), zinc oxide, vanadium oxide, zinc-tin oxide, gold, platinum, palladium silver, other high work function metals, and combinations thereof.

In practice, the anode is optionally coated with 10–200 Å of an ionically conducting polymer such as PEDT or PANI to help planarize the surface and to modify the effective work function of the anode.

Typical cathodes include low work function metals such as aluminum, barium, calcium, samarium, magnesium, silver, magnesium/silver alloys, lithium, lithium fluoride, ytterbium, and alloys of calcium and magnesium.

As one embodiment of a device structure, FIG. 1 illustrates an OEL display or device 100 that includes a device layer 110, which includes the electroactive polymeric arylene of the present invention, and a substrate 120. Any other suitable display component can also be included with display 100. Optionally, additional optical elements or other devices suitable for use with electronic displays, devices, or lamps can be provided between display 100 and viewer position 140 as indicated by optional element 130.

In some embodiments like the one shown, device layer 110 includes one or more OEL devices that emit light through the substrate toward a viewer position 140. The viewer position 140 is used generically to indicate an intended destination for the emitted light whether it be an actual human observer, a screen, an optical component, an electronic device, or the like. In other embodiments (not shown), device layer 110 is positioned between substrate 120 and the viewer position 140. The device configuration shown in FIG. 1 (termed "bottom emitting") may be used when substrate 120 is transmissive to light emitted by device layer 110 and when a transparent conductive electrode is disposed in the device between the emissive layer of the device and the substrate. The inverted configuration (termed "top emitting") may be used when substrate 120 does or does not transmit the light emitted by the device layer and the electrode disposed between the substrate and the light emitting layer of the device does not transmit the light emitted by the device.

Device layer 110 can include one or more OEL devices or elements, for example, organic light emitting diodes, arranged in any suitable manner. For example, in lamp applications (e.g., backlights for liquid crystal display (LCD) modules), device layer 110 might constitute a single OEL device that spans an entire intended backlight area. Alternatively, in other lamp applications, device layer 110 might constitute a plurality of closely spaced OEL elements that can be contemporaneously activated. For example, relatively small and closely spaced red, green, and blue light emitters can be patterned between common electrodes so that device layer 110 appears to emit white light when the emitters are activated. Other arrangements for backlight applications are also contemplated.

In direct view or other display applications, it may be desirable for device layer 110 to include a plurality of independently addressable OEL devices or elements that emit the same or different colors. Each device might represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indicator applications).

Referring back to FIG. 1, device layer 110 is disposed on substrate 120. Substrate 120 can be any substrate suitable for OEL device and display applications. For example, substrate 120 can comprise glass, clear plastic, or other suitable material(s) that are substantially transparent to visible light. Substrate 120 can also be opaque to visible light, for example stainless steel, crystalline silicon, poly-silicon, or the like. Because some materials in OEL devices can be particularly susceptible to damage due to exposure to oxygen or water, substrate 120 preferably provides an adequate environmental barrier, or is supplied with one or more layers, coatings, or laminates that provide an adequate environmental barrier.

Substrate 120 can also include any number of devices or components suitable in OEL devices and displays such as transistor arrays and other electronic devices; color filters, polarizers, wave plates, diffusers, and other optical devices; insulators, barrier ribs, black matrix, mask work and other such components; and the like. Generally, one or more electrodes will be coated, deposited, patterned, or otherwise disposed on substrate 120 before forming the remaining layer or layers of the OEL device or devices of the device layer 110. When a light transmissive substrate 120 is used and the OEL device or devices are bottom emitting, the electrode or electrodes that are disposed between the substrate 120 and the emissive material(s) are preferably substantially transparent to light, for example transparent conductive electrodes such as indium tin oxide (ITO) or any of a number of other transparent conductive oxides.

Element 130 can be any element or combination of elements suitable for use with OEL display or device 100. For example, element 130 can be an LCD module when device 100 is a backlight. One or more polarizers or other elements can be provided between the LCD module and the backlight device 100, for instance an absorbing or reflective clean-up polarizer. Alternatively, when device 100 is itself an information display, element 130 can include one or more of polarizers, wave plates, touch panels, antireflective coatings, anti-smudge coatings, projection screens, brightness enhancement films, or other optical components, coatings, user interface devices, or the like.

FIGS. 4A to 4D illustrate examples of different OEL device (for example, an organic light emitting diode) configurations of the present invention. Each configuration includes a substrate 250, an anode 252, a cathode 254, and a light emitting layer 256, which can include an electroactive polymeric arylene of the present invention. The configurations of FIGS. 4C and 4D also include a hole transport layer 258 and the configurations of FIGS. 4B and 4D include an electron transport layer 260, which can include an electroactive polymeric arylene of the present invention. These layers conduct holes from the anode or electrons from the cathode, respectively. The OEL device of FIG. 4A includes an electroactive polymeric arylene in the light emitting layer 256. The OEL devices of FIGS. 4B–4D include an electroactive polymeric arylene in one or both of the light emitting layer 256 or the electron transport layer 260.

The anode 252 and cathode 254 are typically formed using conducting materials such as metals, alloys, metallic compounds, metal oxides, conductive ceramics, conductive dispersions, and conductive polymers, including, for example, gold, platinum, palladium, aluminum, calcium, titanium, titanium nitride, indium tin oxide (ITO), fluorine tin oxide (FTO), and polyaniline. The anode 252 and the cathode 254 can be single layers of conducting materials or they can include multiple layers. For example, an anode or a cathode may include a layer of aluminum and a layer of gold, a layer of calcium and a layer of aluminum, a layer of aluminum and a layer of lithium fluoride, or a metal layer and a conductive organic layer.

The hole transport layer 258 facilitates the injection of holes from the anode into the device and their migration towards the recombination zone. The hole transport layer 258 can further act as a barrier for the passage of electrons to the anode 252. The hole transport layer 258 can include, for example, a diamine derivative, such as N,N'-bis(3-methylphenyl)-N,N'-bis(phenyl)benzidine (also known as TPD) or N,N'-bis(3-naphthalen-2-yl)-N,N'-bis(phenyl)benzidine (NPB), or a triarylamine derivative, such as, 4,4',4"-Tris(N,N-diphenylamino)triphenylamine (TDATA) or 4,4',4"-Tris(N-3-methylphenyl-N-phenylamino)triphenylamine (mTDATA). Other examples include copper phthalocyanine (CuPC); 1,3,5-Tris(4-diphenylaminophenyl)benzenes (TDAPBs); and other compounds such as those described in H. Fujikawa, et al., *Synthetic Metals*, 91, 161 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233–274 (2001), both of which are incorporated herein by reference.

The electron transport layer 260 facilitates the injection of electrons and their migration towards the recombination zone. The electron transport layer 260, which can include an electroactive polymeric arylene of the present invention, can further act as a barrier for the passage of holes to the cathode 254, if desired. In some examples, the electron transport layer 260 can be formed using the organometallic tris(8-hydroxyquinolato) aluminum (Alq3). Other examples of electron transport materials useful in electron transport layer 260 include 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole (tBuPBD) and other compounds described in C. H. Chen et al., *Macromol. Symp.* 125, 1 (1997) and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233 (2001), both of which are incorporated herein by reference.

Figure 3:
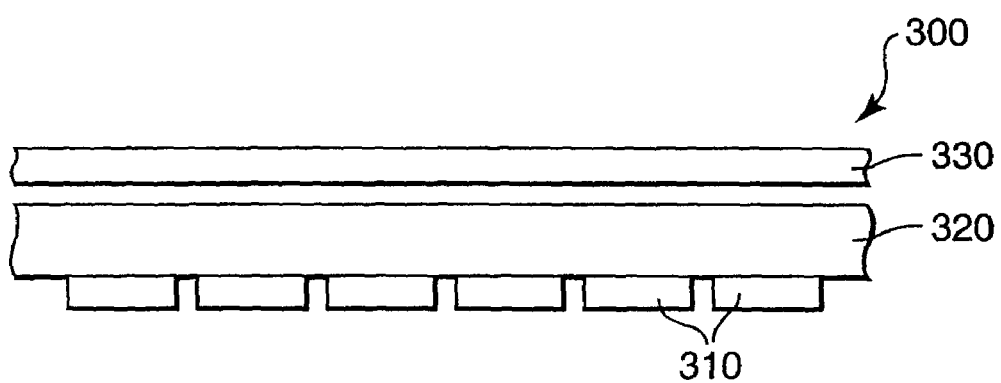
FIG. 3 is a schematic side view of an organic electroluminescent display of the present invention.
Figure 4A:
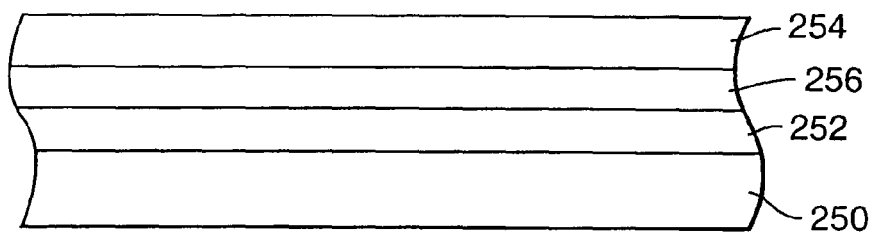
FIG. 4A is a schematic side view of a first embodiment of an organic electroluminescent device of the present invention.
Figure 4B:
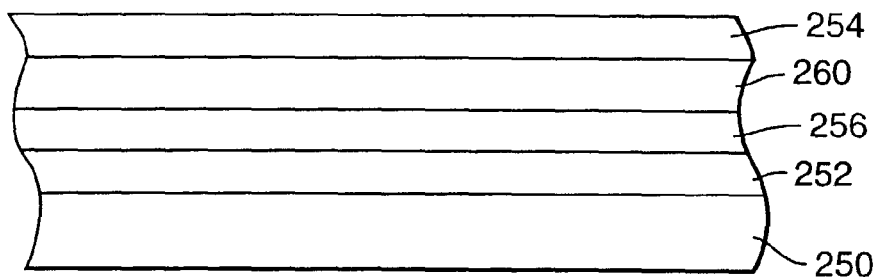
FIG. 4B is a schematic side view of a second embodiment of an organic electroluminescent device of the present invention.
Figure 4C:
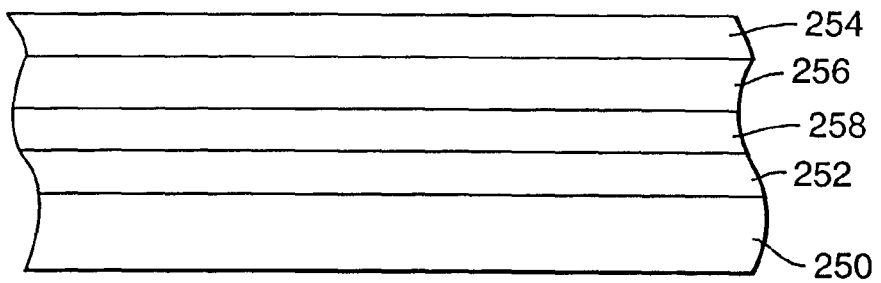
FIG. 4C is a schematic side view of a third embodiment of an organic electroluminescent device of the present invention.
Figure 4D:
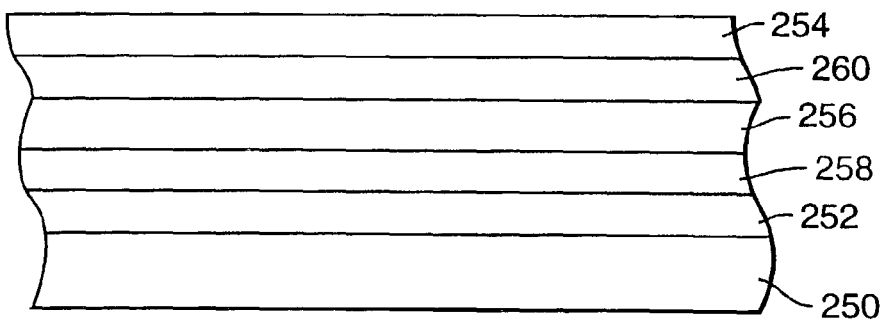
FIG. 4D is a schematic side view of a fourth embodiment of an organic electroluminescent device of the present invention.

The present invention contemplates light emitting OEL displays and devices which comprise an electroactive polymeric arylene. In one embodiment, OEL displays can be made that emit light and that have adjacent devices or elements that can emit light having different color. For example, FIG. 3 shows an OEL display 300 that includes a plurality of OEL elements 310 adjacent to each other and disposed on a substrate 320. Two or more adjacent elements 310 can be made to emit different colors of light, for example red, green, and blue. One or more of elements 310 include an electroactive polymeric arylene.

The separation shown between elements 310 is for illustrative purposes only. Adjacent devices may be separated, in contact, overlapping, etc., or different combinations of these in more than one direction on the display substrate. For example, a pattern of parallel striped transparent conductive anodes can be formed on the substrate followed by a striped pattern of a hole transport material and a striped repeating pattern of red, green, and blue light emitting LEP layers, followed by a striped pattern of cathodes, the cathode stripes oriented perpendicular to the anode stripes. Such a construction may be suitable for forming passive matrix displays. In other embodiments, transparent conductive anode pads can be provided in a two-dimensional pattern on the substrate and associated with addressing electronics such as one or more transistors, capacitors, etc., such as are suitable for making active matrix displays. Other layers, including the light emitting layer(s) can then be coated or deposited as a single layer or can be patterned (e.g., parallel stripes, two-dimensional pattern commensurate with the anodes, etc.) over the anodes or electronic devices. Any other suitable construction is also contemplated by the present invention.

In one embodiment, display 300 can be a multiple color display. In exemplary embodiments, each of the elements 310 emits light. There are many displays and devices constructions covered by the general construction illustrated in FIG. 3. Some of those constructions are discussed as follows.

OEL backlights can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include white or single color large area single pixel lamps, for example where an emissive material is provided by thermal stamp transfer, lamination transfer, resistive head thermal printing, or the like; white or single color large area single electrode pair lamps that have a large number of closely spaced emissive layers patterned by laser induced thermal transfer; and tunable color multiple electrode large area lamps.

Low resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

High resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); and security display applications.

One particularly useful embodiment for this type of thermally patterned construction comprises the high resolution transfer of red, green and blue emitting emissive layers onto a common substrate using an electroluminescent composition of the invention. High resolution transfer means that the rms (root mean square) edge roughness of the transferred material is 5 micrometers or less.

Methods for Fabricating OEL Layers

Light emitting layers based on LEP materials or molecularly doped polymer films comprising electroactive arylene polymers of this invention may be fabricated by solution coating a thin layer of the material. Such thin layer methods are described, for example, in U.S. Pat. No. 5,408,109, incorporated herein by reference.

In certain applications, it is desirable to pattern one or more layers of an organic electronic device onto a substrate, for example, to fabricate emissive displays. Methods for patterning include selective transfer, for example laser thermal transfer, photolithographic patterning, inkjet printing, screen printing, and the like.

In one aspect, the present invention provides methods and materials for making an organic electronic device comprising selectively transfering an electroactive composition from a donor sheet to a receptor substrate; wherein the electroactive composition includes an electroactive polymeric arylene. In one embodiment the present invention provides a donor sheet, comprising a transfer layer comprising the electroactive composition which includes the electroactive polymeric arylene.

A particularly useful method of forming organic electronic devices of the present invention, for example, organic electroluminescent devices, includes the transfer of one or more transfer layers by laser thermal patterning. This method is described in, for example, U.S. Pat. Nos. 6,358,664; 6,284,425; 6,242,152; 6,228,555; 6,228,543; 6,221,553; 6,221,543; 6,214,520; 6,194,119; 6,114,088; 5,998,085; 5,725,989; 5,710,097; 5,695,907; and 5,693,446, and in co-assigned U.S. patent application Ser. Nos. 09/853,062; 09/844,695; 09/844,100; 09/662,980; 09/451,984; 09/931,598; and 10/004,706, all of which are incorporated herein by reference. The effectiveness of the patterning process can depend upon the physical properties of the transfer layer.

One parameter is the cohesive, or film strength, of the transfer layer. During imaging, the transfer layer preferably breaks cleanly along the line dividing imaged and unimaged regions to form the edge of a pattern. Highly conjugated polymers which exist in extended chain conformations, such as polyphenylenevinylenes, can have high tensile strengths and elastic moduli comparable to that of polyaramide fibers. In practice, clean edge formation during the laser thermal imaging of light emitting polymers can be challenging. The undesired consequence of poor edge formation is rough, torn, or ragged edges on the transferred pattern. Another parameter is the strength of the bond formed between the transfer layer and the receptor surface. This strength may be influenced by the solubility parameter compatability of the transfer layer and the receptor surface.

In some instances, it is desirable to select the material on the substrate surface and the material to be transferred (e.g., the electroactive polymeric arylene material or a blend comprising such polymer) such that the solubility parameters are compatible to improve or even make possible thermal transfer or other patterning methods. As an example, the materials can be selected such that the difference in these solubility parameters is no more than 4 $J^{1/2}$ $cm^{-3/2}$ and, preferably, no more than 2 $J^{1/2}$ $cm^{-3/2}$ as determined according to "Properties of Polymers; Their Correlation with Chemical Structure; their Numerical Estimation and Prediction from Additive Group Contributions." third, completely revised edition by D. W. Van Krevelen; Elsevier Science Publishers B.V., 1990; Chapter 7, pp 189–225, incorporated herein by reference.

The solubility parameter of a polymer can be determined from measurements of the extent of equilibrium swelling of the polymer in a range of solvents of differing solubility parameters. The solubility parameters of the solvents themselves can be determined from their heats of evaporation. The solubility parameter $\delta$ is related to the cohesive energy $E_{coh}$ and the specific volume V by the relationship $\delta=(E_{coh}/V)^{1/2}$. For solvents of low molecular weight, the cohesive energy is closely related to the molar heat of evaporation $\Delta H_{vap}$ according to $E_{coh}=\Delta H_{vap}-p\Delta V=\Delta H_{vap}-RT$. Thus, $E_{coh}$ and $\delta$ can be calculated from the heat of evaporation of the solvent or from the course of the vapor pressure as a function of temperature.

Because polymers cannot be evaporated, indirect methods have to be used for determination of their solubility parameter. To determine the solubility parameter of the polymer, the equilibrium swelling of the polymer in a variety of solvents of differing $\delta$ is measured and a plot of equilibrium swelling of the polymer vs. the solubility parameter of the solvents is generated. The solubility parameter of the polymer is defined as the point on this plot where maximum swelling is obtained. Swelling will be less for solvents having solubility parameters that are less than or greater than that of the polymer. There are several methods for theoretically estimating the solubility parameter of a polymer based on the additive contributions of functional groups present in the polymer as outlined in the above-cited reference.

Organic electronic devices containing an electroactive composition comprising the electroactive polymeric arylene of the present invention and optionally other materials for light emission can be made at least in part by selective thermal transfer of the composition from a thermal transfer donor sheet to a desired receptor substrate. For example, light emitting polymer displays and lamps can be made by coating an LEP layer on a donor sheet and then selectively transferring the LEP layer alone or along with other device layers or materials to the display (receptor) substrate.

Figure 2:
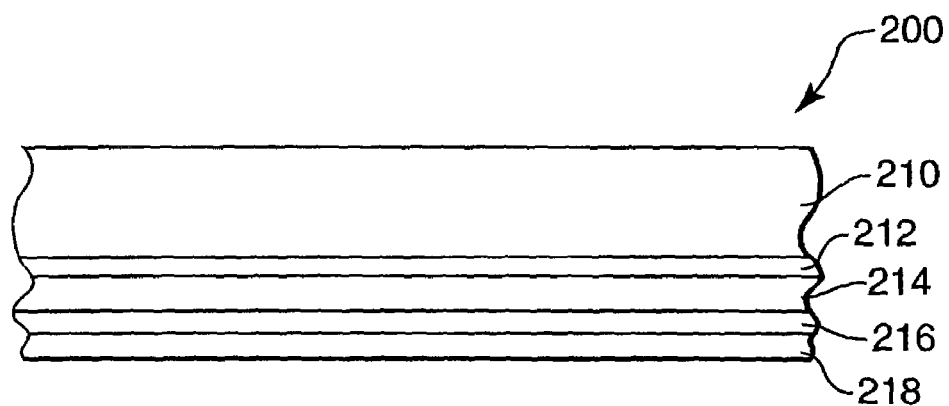
FIG. 2 is a schematic side view of a donor sheet for transferring materials of the present invention.

FIG. 2 shows an example of a thermal transfer donor sheet 200 suitable for use in the present invention. Donor element 200 includes a base substrate 210, an optional underlayer 212, an optional light-to-heat conversion layer (LTHC layer) 214, an optional interlayer 216, and a transfer layer 218 comprising an electroactive polymeric arylene of the present invention. Other layers can also be present. Examples of suitable donors or layers of donors are disclosed in U.S. Pat. Nos. 6,358,664; 6,284,425; 6,242,152; 6,228,555; 6,228,543; 6,221,553; 6,221,543; 6,214,520; 6,194,119; 6,114,088; 5,998,085; 5,725,989; 5,710,097; 5,695,907; and 5,693,446, and in co-assigned U.S. patent application Ser. Nos. 09/853,062; 09/844,695; 09/844,100; 09/662,980; 09/451,984; 09/931,598; and 10/004,706, all of which are incorporated herein by reference.

Emissive organic materials, including LEPs or molecularly doped polymer films comprising electroactive polymeric arylenes of this invention, can be transferred or selectively transferred in the transfer layer from a donor sheet to a receptor substrate by placing the transfer layer of the donor element adjacent to the receptor and selectively heating the donor element. Methods for the transfer or the selective transfer are described in, for example, U.S. Pat. No. 6,242,152. Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more donor sheets can be used to form a device, each donor sheet forming one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

In FIG. 2 the donor substrate 210 can be a polymer film. Suitable films are described in U.S. Pat. Nos. 6,242,152 and 6,228,555.

In FIG. 2 optional underlayer 212 may be coated or otherwise disposed between a donor substrate and the LTHC layer, for example to control heat flow between the substrate and the LTHC layer during imaging or to provide mechanical stability to the donor element for storage, handling, donor processing, or imaging. Examples of suitable underlayers and methods of providing underlayers are disclosed in U.S. Pat. No. 6,228,555 and in co-assigned U.S. patent application Ser No. 09/743,114, incorporated herein by reference.

The underlayer can include materials that impart desired mechanical or thermal properties to the donor element. For example, the underlayer can include materials that exhibit a low specific heat×density or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation or reflection of imaging radiation by the underlayer may be used to control heat generation during imaging.

In FIG. 2, an LTHC layer 214 can be included in donor sheets of the present invention to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor. Suitable LTHC layers are described in, for example, U.S. Pat. Nos. 6,242,152, and 6,228,555.

In FIG. 2, an optional interlayer 216 may be disposed between the LTHC layer 214 and transfer layer 218. The interlayer can be used, for example, to minimize damage and contamination of the transferred portion of the transfer layer and may also reduce distortion in the transferred portion of the transfer layer. The interlayer may also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers are described in, for example, U.S. Pat. Nos. 6,242,152, and 6,228,555.

In FIG. 2, a thermal transfer layer 218 is included in donor sheet 200. Transfer layer 218 includes an electroactive polymeric arylene of the present invention and can include any other suitable material or materials, disposed in one or more layers, alone or in combination with other materials. Transfer layer 218 is capable of being selectively transferred as a unit or in portions by any suitable transfer mechanism when the donor element is exposed to direct heating or to imaging radiation that can be absorbed by light-to-heat converter material and converted into heat.

The present invention further provides a light emitting transfer layer that comprises an electroactive polymeric arylene of Formulas V–VIII. One way of providing the transfer layer is by solution coating the light emitting material onto the donor substrate or any of the layers described supra, i.e., underlayer, interlayer, light-to-heat converting layer. In this method, the light emitting material can be solubilized by addition of a suitable compatible solvent, and coated onto the donor substrate or any one of the above layers by spin-coating, gravure coating, Mayer rod coating, knife coating and the like. The solvent chosen preferably does not undesirably interact with (e.g., swell or dissolve) any of the already existing layers in the donor sheet. The coating can then be annealed and the solvent evaporated to leave a transfer layer.

The transfer layer can then be selectively thermally transferred from the resulting donor sheet or element to a proximately located receptor substrate. There can be, if desired, more than one transfer layer so that a multilayer construction is transferred using a single donor sheet. Suitable receptor substrates are described, for example, in U.S. Pat. Nos. 6,242,152 and 6,228,555.

Receptor substrates can be pre-patterned with any one or more of electrodes, transistors, capacitors, insulator ribs, spacers, color filters, black matrix, hole transport layers, electron transport layers, and other elements useful for electronic displays or other devices.

The invention is further described by the following examples, which are provided for illustration only and are not intended to be limiting in any way.

EXAMPLES

All reagents were obtained from Aldrich Chemical Company, Milwaukee, Wis. unless otherwise stated. All compounds made were characterized by NMR spectroscopy.

Glossary 1,4-Benzenediboronic acid bis(neopentyl glycol) cyclic ester was obtained from Lancaster Synthesis Ltd., Windam, N.H.

N,N'-Bis(4-bromophenyl)-N,N'-bis(4-butylphenyl)benzene-1,4-diamine was obtained from American Dye Source, Baie D'Urfe, Quebec, Canada.

2,5-Bis(hexyl)-1,4-benzenebis(boronic acid) was obtained from Frontier Scientific Inc., Logan, Utah.

2,7-Bis(4,4,5,5-tetramethyl-1,3,2-dioxaborolan-2-yl)-9,9-dioctylfluorene can be made as described in Ranger et al., Chem. Commun. 1597–1598 (1997), incorporated herein by reference.

4-Bromo-N,N-diphenylaniline can be made as described in Creason et al., J. Org. Chem. 37, 4440–4446 (1972), incorporated herein by reference.

(bthpy)$_2$Ir(acac)—can be made as described in Lamansky et al., J. Am. chem. Soc. 123(18), 4304–4312 (2001), incorporated herein by reference.

CBP—a hole transporting agent, 4,4'-bis(carbazol-9-yl)biphenyl, available from H. W. Sands, Jupiter, Fla.

4,7-Dibromo-2,1,3-benzothiadiazole can be made as described in Pilgram et al., J. Heterocycl. Chem., 7, 629–633 (1970), incorporated herein by reference.

3,6-Dibromo-9-phenylcarbazole can be made as described in Park et al., Tetrahedron, 42, 12707–12714 (1998), incorporated herein by reference.

3,9-Dibromo-perylene and 3,10-dibromo-perylene can be made as described in Zinke et al., Chem. Ber. 74, 107–112 (1941), incorporated herein by reference.

2,7-Dibromo-9,9-dioctyl-fluorene can be made as described in Ranger et al., Can. J. Chem., 1571–1577(1998), incorporated herein by reference.

HT—a low molecular weight (Mw<1000), phenyl capped, hole transporting polymer, comprising poly(9-phenylcarbazol-3,6-diyl), which can be prepared by bis(1,5-cyclooctadiene)nickel (0) mediated polymerization of 3,6-dibromo-9-phenylcarbazole as described in Example 3 of Euopean Patent No. 1011154, incorporated herein by reference, for the polymerization of fluorene monomers.

Ir(ppy)3—a molecular emitter, tris(2-phenylpyridine) iridium(III), available from H. W. Sands, Jupiter, Fla.

NPB—N,N'-di(naphthalen-2-yl)-N,N'-diphenylbenzidine, available from H. W. Sands, Jupiter, Fla.

PBD—An electron transport agent, 2-(4-biphenyl)-5-(4-t-butylphenyl)-1,3,4-oxadiazole, available from H. W. Sands, Jupiter, Fla.

PEDT/PSS—copolymer (poly(3,4-ethylenedioxythiophene)/polystyrene sulfonate, available as Baytron™ P4083 from Bayer A G, Leverkusen, Germany.

PhO(CH$_2$)$_2$O(CH$_2$)$_2$I can be made as described in Otera et al., Bull. Chem. Soc. Jpn. 2964–2967 (1981), incorporated herein by reference.

PS-DPAS—a hole transporting polymer, polystyrene-diphenylaminostyrene copolymer prepared as follows.

p-Diphenylaminostyrene monomer was synthesized by a preparation similar to that described by Tew et al., Angew. Chem. Int. Ed. 39,517(2000). To a mixture of 4-(diphenylamino)benzaldehyde (20.06 g, 73 mmol, Fluka Chemicals, Milwaukee, Wis.), methyltriphenyl phosphonium bromide (26.22 g, 73 mmol) and dry tetrahydrofuran (450 mL) under nitrogen was added a 1M solution of potassium t-butoxide in tetrahydrofuran (80 mL, 80 mmol) over 5 minutes. The mixture was stirred for 17 hours at room temperature. Water (400 mL) was added and the tetrahydrofuran was removed under reduced pressure. The mixture was extracted with ether, and the combined organic layers were dried over MgSO$_4$ and concentrated under vacuum. The crude solid was purified by column chromatography on silica gel using a 50/50 mixture of methylene chloride and hexane to give a yellow solid that was further recrystallized once from hexane (15.37 g, 78%). 1H NMR (400 MHz, CDCl$_3$) (7.21–7.32 (m, 6H), 7.09 (d, J=7.6 Hz, 4H), 7.02 (m, 4H), 6.66 (dd, J=17.6 Hz, 11.0 Hz, 1H), 5.63 (dd, J=17.6, 1H), 5.15 (dd, J=11.0 Hz, 1H); 13C NMR (100 MHz, CDCl3) (147.5, 136.1, 131.8, 129.1, 126.9, 124.3, 123.5, 122.8, 112.0.

To synthesize the polymer, a round bottom glass reactor was baked out under vacuum at 200° C. for 2 hours, then allowed to cool. The reactor was filled with dry nitrogen. Subsequently, 71.8 g of cyclohexane and 4.4 mL of tetrahydrofuran (THF) were added to the reactor by syringe. The THF was distilled from sodium/benzophenone under nitrogen prior to use, in order to scavenge water and oxygen. The cyclohexane was dried by passage through activated basic alumina, followed by sparging with nitrogen gas for 30 minutes prior to use. After addition of the solvents, the reaction flask was cooled to 3° C. in an ice water bath, after which 0.02 mL of styrene was added to the reactor. The styrene had previously been passed through activated basic alumina to remove inhibitors and water, and sparged with nitrogen gas to remove oxygen. A solution of s-butyllithium in cyclohexane (0.4 mL, 1.3 mol/L) was subsequently added to the reactor. The solution immediately turned orange, characteristic of the formation of polystyryl anion. An additional 1.78 mL of styrene was subsequently added to the reactor. After stirring at 3° C. for 2 hours, a solution of p-diphenylaminostyrene (1.61 g) in cyclohexane (20 mL) was added to the reactor by cannula. This solution had previously been degassed by repeatedly freezing it with liquid nitrogen and exposing it to vacuum. The solution was stirred overnight while warming to room temperature. The reaction was then terminated by addition of methanol, precipitated into a mixture of methanol and isopropanol, and dried under in a vacuum oven overnight, yielding 3.2 g of polymer. The resulting PS-DPAS block polymer contained 74.1 mol % styrene and 25.9 mol % p-diphenylaminostyrene, based on $^{13}$C NMR. The molecular weight of the block copolymer was 7700 g/mol, based on gel permeation chromatography in THF against polystyrene standards.

Pt(OEP)—a molecular emitter, platinum(II) octaethyl porphyrin, available from H. W. Sands, Jupiter, Fla.

PVK—a hole transporting agent, poly(9-vinylcarbazole, available from Aldrich, Milwaukee, Wis.

Tetrakis(triphenylphosphine)palladium (0) was obtained from Strem Chemical, Newburyport, Mass.

4,4,5,5-Tetramethyl-2-phenyl-1,3,2-dioxaborolane can be made from bromobenzene following the general procedure of borolanation as reported in Ranger et al., Chem. Commun. 1597–1598 (1997), incorporated herein by reference.

TMC—a molecular emitter, 3-thienyl-7-methoxycoumarin can be prepared by methods outlined in Sreenivasulu, B.; Sundaramurthy, V.; Subba Rao, N. V. Proceedings of the Indan Academy of Sciences, Sect A, 78, 159–168 (1973), incorporated herein by reference.

TPD—A hole transporting agent, N,N'-bis(3-methylphenyl)-N,N'-bis(phenyl)benzidine, available from H. W. Sands, Jupiter, Fla.

Monomers

Example 1

Synthesis of 2-(2,5-Dichlorophenyl)-5-[4-(octyloxy)phenyl]-1,3,4-oxadiazole (2)

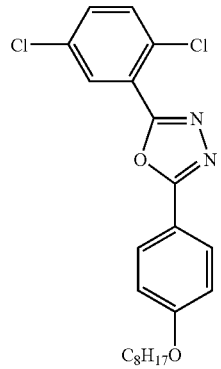

Part A

Synthesis of Methyl 4-octoxybenzoate

Into a flask was introduced 251.0 g (1.65 mol) of methyl 4-hydroxybenzoate, 276.37 g (1.99 mol) potassium carbonate and 1200 g of acetone. This was refluxed for 45 min followed by the dropwise addition of 386.17 g (1.99 mol ) of 1-octylbromide over a 1 hour period. The reaction mixture was refluxed for two days. Filtration of the cooled reaction mixture and evaporation of the filtrate gave an oil. This was taken up in ethyl acetate and extracted with 5% NaOH (2×100 ml) followed by water (2×100 ml). The organic layer was dried (MgSO$_4$), concentrated, and transferred to a 1L three necked flask. The contents of the flask was subjected to high vacuum distillation to remove the excess 1-octylbromide. The pot residue was essentially pure methyl 4-octoxybenzoate (376 g, 86%).

Part B

Synthesis of 4-Octoxybenzoyl Hydrazide

To the contents of the flask from Part A was added 387.14 g of 98% hydrazine. This was refluxed for 5 hours (106° C.). The cooled solution was poured into 3L of water and the precipitated solid filtered, washed with copious amounts of water and dried in vacuo to give 4-octylbenzoyl hydrazide (343 g, 91% yield, mp 90° C.).

Part C

Synthesis of 2,4-Dichlorobenzoyl Chloride

Into a 2 L flask fitted with a reflux condenser and magnetic stir-bar was introduced 150 g (0.785 mol) 2,5-dichlorobenzoic acid and 575 ml (7.85 mol) of thionyl chloride. The mixture was refluxed for 8 hours. Most of the thionyl chloride was distilled off followed by removal of the remainder by rotary evaporation. Distillation gave 130 g (79% yield) of 2,4-dichlorobenzoyl chloride (pot temperature 110° C.; distillation temp 70° C./0.70 mm Hg).

Part D

Synthesis of 2,5-Dichloro-N'-[4-(octyloxy)benzoyl]benzohydrazide

Under a blanket of nitrogen, 8.8 g (0.087 mol) 2,4-dichlorobenzoyl chloride was added to a solution of 23.0 g (0.087 mol) 4-octoxybenzoyl hydrazine and 12.13 ml (8.8 g, 0.087 mol) freshly distilled triethylamine in 348 ml dry chloroform. After about one hour of stirring a dense white precipitate of the required product was formed. Stirring was continued until the next day. The product was collected by filtration and recrystallized from ethanol/water to give 31 g (81.5% yield) of 2,5-dichloro-N'-[4-(octyloxy)benzoyl]benzohydrazide as a white solid.

Part E

Synthesis of 2-(2,5-Dichlorophenyl)-5-[4-(octyloxy)phenyl]-1,3,4-oxadiazole (2)

Into a 250 ml flask fitted with a mechanical stirrer and thermometer was introduced 30 g (0.0686 mol) 2,5-dichloro-N'-[4-(octyloxy)benzoyl]benzohydrazide and 181 ml phosphorus oxychloride. This was refluxed and stirred for 8 hrs. About 100 ml of phosphorus oxychloride was distilled off under reduced pressure. The cooled residue was poured onto water and crushed ice with manual stirring and allowed to stand until the ice had melted. The precipitated white solid was collected by filtration, dried and recrystallized from ethanol. There was obtained 25.7 g (89% yield, mp 86° C.) of 2-(2,5-dichlorophenyl)-5-[4-(octyloxy)phenyl]-1,3,4-oxadiazole (2). The structure was confirmed unambiguously by 1D and 2D NMR techniques and gave the following: $^1$H-NMR (500 MHz, CDCl$_3$) 0.89 (3H, t), 1.31 (8H, m), 1.46 (2H, q), 1.79 (2H, q), 6.97 (2H, d), 7.38 (1H, dd), 7.44 (1H, d), 8.01 (2H, d), 8.06 (1H, d); $^{13}$C-NMR (500 MHz, CDCl$_3$) 13.90 (C-28), 22.44, 25.79, 28.91, 29.01, 29.13, 31.59, 68.08 (C-21), 114.78 (C14 and C-16), 115.37 (C-12), 124.27 (C-6), 128.58 (C-13 and C-17), 130.23 (C-11), 130.87 (C-7), 131.75, 132.20, 132.87 (C-10), 161.03, 161.98 (C-15), 164.95 (C-5).

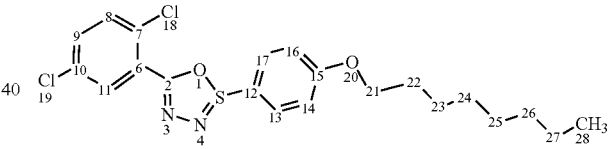

Example 2

Synthesis of 2-(4-tert-butylphenyl)-5-(2,5-dichlorophenyl)-1,3,4-oxadiazole (3)

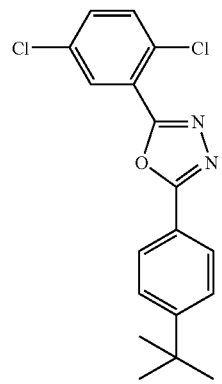

87

Part A

Synthesis of N-(4-tert-Butylbenzoyl)-2,5-dichlorobenzohydrazide 4-tert-Butylbenzoyl hydrazide (185 g, 0.96 mol) and triethylamine (97.37 g, 0.96 mol) freshly distilled from calcium hydride were added to 4L of dichloromethane in a 10L flask. To this was added with mechanical stirring 201.5 g of 2,4-dichlorobenzoyl chloride. No precipitation of the product was observed after three hours and the reaction was allowed to stir at room temperature until the next day. The product was precipitated by the addition of 4L hexane. Filtration, hexane washing and drying at 80° C. in a forced air oven gave the product in 99% yield.

Part B

Synthesis of 2-(4-tert-butylphenyl)-5-(2,5-dichlorophenyl)-1,3,4-oxadiazole (3)

Into a 2L flask was introduced 200 g N-(4-tert-butylbenzoyl)-2,5-dichlorobenzohydrazide (0.55 mol) and 1378 ml phosphorus oxychloride (2267 g, 14.78 mol). This was refluxed for 8 hrs and the solvent then evaporated under slight vacuum. The residue was poured onto crushed ice and allowed to stand until the next day. Filtration gave a sticky mass, which was dissolved in methanol, and solid material was obtained by addition of a little water. Filtration and drying gave 112 g of the required product as a white crystalline solid (59% yield).

Example 3

Synthesis of 2-(2,5-Dibromophenyl)-5-[4-(octyloxy)phenyl]1,3,4-oxadiazole (1)

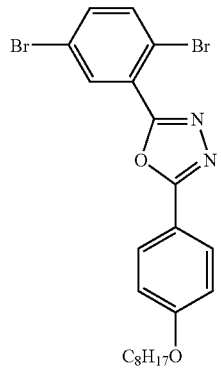

Part A

Synthesis of 2,5-Dibromobenzoyl Chloride

By the general method of Part C of Example 1, the reaction of 50.0 g (0.1786 mol) 2,5-dibromobenzoic acid with 150 mL thionyl chloride gave after distillation 40 g of 2,5-dibromobenzoyl chloride.

Part B

Synthesis of 2,5-Dibromo-N'-[4-(octyloxy)benzoyl]benzohydrazide

By the general method of Part A, Example 2, 2,5-dibromobenzoyl chloride (57.43 g, 0.11925 mol), 4-octoxybenzoyl hydrazide (50.88 g, 0.1925 mol), and triethylamine (27 ml, 19.48 g, 0.1925 mol) were reacted in 800 ml methylene chloride to give a product. Re-crystallization of the product from DMF/water gave 79.38 g (78% yield) 2,5-dibromo-N'-[4-(octyloxy)benzoyl]benzohydrazide.

Part C

Synthesis of 2-(2,5-Dibromophenyl)-5-[4-(octyloxy)phenyl]1,3,4-oxadiazole (1)

By the general method of Part B of Example 2, cyclocondensation of 39.1 g (0.0743 mol) of N-(2,5-dibromobenzoyl)-4-(octyloxy)benzohydrazide with 203 ml phosphorus oxychloride for 8 hrs gave, after recrystallizing from EtOH/water, 33.6 g (89% yield) 2-(2,5-dibromophenyl)-5-[4-(octyloxy)phenyl]1,3,4-oxadiazole (1).

Example 4

Synthesis of 2-(2,5-Dichlorophenyl)-5-(pentafluorophenyl)-1,3,4-oxadiazole (10)

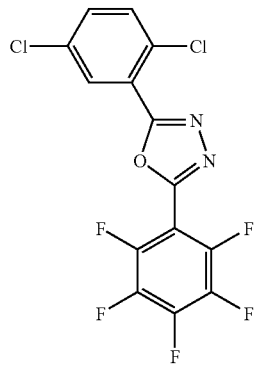

Part A

Synthesis of 2,5-Dichlorobenzohydrazide

Into a flask was introduced 30 g (0.1463 mol) methyl 2,5-dichlorobenzoate and 46.89 g (1.463 mol) hydrazine. This was refluxed for 5 hours. The cooled reaction mixture was poured into an excess of water, to precipitate an off-white solid. Filtration and drying under vacuum gave 30 g solid. A $^1$H-NMR showed that the material was fairly pure 2,5-dichlorobenzohydrazide and was therefore used without further purification.

Part B

Synthesis of 2,5-Dichloro-N'-(pentafluorobenzoyl)benzohydrazide

By the general method of Part A of Example 2, 21.0 g (0.1024 mol) 2,5-dichlorobenzohydrazide with 23.6 g (0.1024 mol) pentafluorobenzoyl chloride and 14.3 ml (0.1026 mol) triethylamine in methylene chloride/DMF (1L, 1:1) gave, after re-crystallizing from DMF/water, 22.51 g (55% yield, mp 227–232° C.) 2,5-dichloro-N'-(pentafluorobenzoyl)benzohydrazide.

Part C

Synthesis of 2-(2,5-Dichlorophenyl)-5-(pentafluorophenyl)-1,3,4-oxadiazole (10)

By the general method of Part B of Example 2, the reaction of 21.0 g (0.05377 mol) 2,5-dichloro-N'-(pentafluorobenzoyl)benzohydrazide in POCl$_3$ gave a product which was recrystallized from ethanol/water to give 16.59 g (81% yield) of 2-(2,5-dichlorophenyl)-5-(pentafluorophenyl)-1,3,4-oxadiazole (10).

Example 5

Synthesis of 2-(2,5-Dichlorophenyl)-5-(9,9-dioctyl-9H-fluoren-2-yl)-1,3,4-oxadiazole (13)

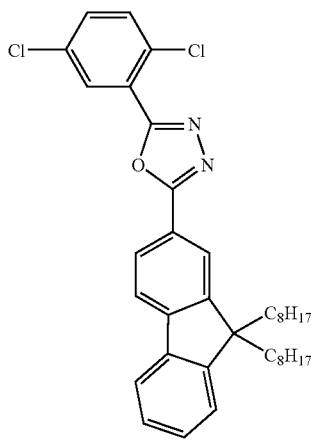

Part A

Synthesis of 2-Bromo-9,9-dioctylfluorene

A 3L flask fitted with a mechanical stirrer was charged with 2-bromofluorene (45 g, 183.6 mmole) and 150 mL DMSO. Under a $N_2$ atmosphere was added 80 mL of a 50% aqueous NaOH solution and 2.72 g of benzyltriethylammonium chloride (2.72 g, 11.98 mmole). This was stirred for 2 h at RT. With vigorous mechanical stirring, n-octylbromide (84.96 g, 440 mmole) was added via a dropping funnel (exotherm). Stirring was continued for 2 hours. To the reaction mixture was added 500 mL of a 1:1 mixture of water/ether, and the organic layer separated and was washed successively with brine and then water. Drying over magnesium sulfate and evaporation of the solvent gave an oil. Purification by column chromatography (silica gel; hexane as the mobile phase) gave 67 g (78% yield) of 2-bromo-9,9-dioctylfluorene as a pale oil.

Part B

Synthesis of 9,9-Dioctyl-9H-fluorene-2-carboxylic Acid

Into a flask fitted with a nitrogen inlet and rubber septum were introduced 2-bromo,-9,9-dioctylfluorene (34.18 g, 72.8 mmole) and dry tetrahydrofuran (300 mL). The solution was cooled to −60° C. and n-butyl lithium (29.1 mL, 2.5M in hexanes, 72.8 mmole) added via a syringe. The reaction mixture was observed to turn red. After stirring for 1 hour at −60° C., the reaction mixture was poured onto powdered dry-ice and left to stand overnight. The mixture was acidified with 1M HCl and extracted with chloroform. The chloroform extract was washed with water, dried over magnesium sulfate and concentrated to give the required acid as an oil.

Part C

Synthesis of 9,9-Dioctyl-9H-fluorene-2-carbonyl Chloride 9,9-Dioctyl-9H-fluorene-2-carboxylic acid (32.36 g, 74.5 mmole) was refluxed in thionyl chloride (93 g, 782 mmole) for 8 hrs. Unreacted thionyl chloride was distilled off and the residue material used without further purification.

Part D

Synthesis of 2,5-Dichloro-N'-[(9,9-dioctyl-9H-fluoren-2-yl)carbonyl]benzohydrazide 2,5-Dichlorobenzohydrazide (one equivalent) and triethylamine (one equivalent) were warmed in 500 mL of 1,2-dichloroethane until the solid material had dissolved. On cooling, 9,9-dioctyl-9H-fluorene-2-carbonyl chloride (one equivalent) was added and the mixture stirred at RT for two days. The insolubles were filtered off and the filtrate evaporated to give an oil. This was taken up in heptane and the precipitated solid filtered off. The remaining solution was dried (MgSO$_4$) and concentrated to give the desired intermediate.

Part E

Synthesis of 2-(2,5-Dichlorophenyl)-5-(9,9-dioctyl-9H-fluoren-2-yl)-1,3,4-oxadiazole (13)

2,5-Dichloro-N'-[(9,9-dioctyl-9H-fluoren-2-yl)carbonyl]benzohydrazide (20.0 g, 32.17 mmole) and phosphorus oxychloride (91 mL) were refluxed for 8 hrs. The reaction was distilled until about half the volume remained. The pot fraction was cooled and poured onto an ice/water mixture with constant stirring. The sticky paste that formed was extracted into hexane and the hexane extract dried and concentrated. Column chromatography (5% ethyl acetate in hexane) gave 14.98 g (77% yield) of the desired compound as an oil.

Example 6

Synthesis of 2-(3,5-Dichlorophenyl)-5-[4-(octyloxy)phenyl]-1,3,4-oxadiazole (4)

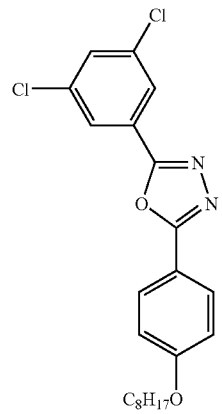

By the general method for the synthesis of 2-(2,5-dibromophenyl)-5-[4-(octyloxy)phenyl]-1,3,4-oxadiazole (1) in Example 3, the reaction of 3,5-dichlorobenzoyl chloride (20.0 g, 0.010 mole) with 4-octoxybenzoyl hydrazide (25.24 g, 0.010 mole) gave the intermediate 3,5-dichloro-N'-[4-(octyloxy)benzoyl]benzohydrazide (25 g, 60% yield). Cyclocondensation of the intermediate 3,5-dichloro-N'-[4-(octyloxy)benzoyl]-benzohydrazide (16.0 g) with POCl$_3$ (83 mL) gave the required 2-(3,5-dichlorophenyl)-5-[4-(octyloxy)phenyl]-1,3,4-oxadiazole (4) (11.16 g, 73% yield).

Example 7

Synthesis of 2-(3,5-Dibromophenyl)-5-[4-(octyloxy)phenyl]-1,3,4-oxadiazole (5)

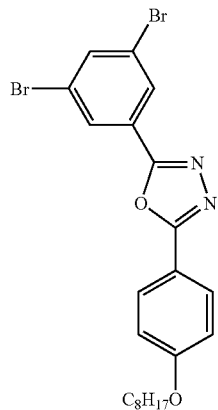

By the general method for the synthesis of 2-(2,5-dibromophenyl)-5-[4-(octyloxy)phenyl]-1,3,4-oxadiazole (1) in Example 3, the reaction of 3,5-dibromobenzoyl chloride (20.13 g, 0.06747 mole) with 4-octoxybenzoyl hydrazide (17 g, 0.06747 mole) gave the intermediate 3,5-dibromo-N'-[4-(octyloxy)benzoyl]benzohydrazide (12.87 g, 36% yield). Cyclocondensation of the intermediate 3,5-dibromo-N'-[4-(octyloxy)benzoyl]-benzohydrazide (12.17 g) with POCl$_3$ (63 mL) gave the required 2-(3,5-dibromophenyl)-5-[4-(octyloxy)phenyl]-1,3,4-oxadiazole (5) (6.12 g, 52% yield).

Example 8

Synthesis of 3-(2,5-Dichlorophenyl)-4-(4-methoxyphenyl)-5-[4-(octyloxy)phenyl]-4H-1,2,4-triazole (8)

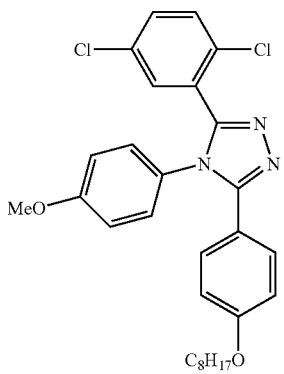

Into a 1L round-bottomed flask fitted with a mechanical stirrer, reflux condenser and nitrogen inlet were introduced 2,5-dichloro-N'-[4-(octyloxy)benzoyl]benzohydrazide (40 g, 0.09146 mole, 1 equivalent), p-anisidine (67.60 g, 0.5487 mole, 6 equivalents) and 300 mL 1,2-dichlorobenzene. Mechanical stirring resulted in partial solvation of the solids. Phosphorus trichloride (12.56 g, 0.0146 mole, 1 equivalent) was added and the contents of the flask heated at 180° C. for 12 hrs. The solvent was distilled off under a light vacuum and the residue transferred to a 2L flask with 1L of a 1:1 acetone/heptane mixture. The solid material was filtered off and dissolved in acetone. Enough heptane was added to precipitate a purple-colored oily sludge. Heptane dilution of a test sample of the acetone/heptane layer ensured that the oily sludge had been completely precipitated. The acetone/heptane layer was decanted off and diluted further with a large excess of heptane to precipitate a white solid. This was filtered off, dissolved in acetone and re-precipitated with heptane. Filtration and drying gave 3-(2,5-dichlorophenyl)-4-(4-methoxyphenyl)-5-[4-(octyloxy)phenyl]-4H-1,2,4-triazole (8) (16.25 g, 34% yield).

Example 9

Synthesis of 2,7-Dibromo-9,9-bis(3,6-dioxaheptyl)-fluorene

Benzyltriethylammonium chloride (3.19 g, 14 mmole, 0.077 eq) and 2,7-dibromofluorene (59 g, 182 mmole, 1 eq) were suspended in 178 mL DMSO. 50% aqeous NaOH (80 mL) was added. 1-Bromo-2-(2-methoxyethoxy)ethane (80 g, 437 mmole, 2.4 eq) was then added in small portions. The reaction was stirred at room temperature for 2 hours before it was stopped and the aqueous layer was extracted with ether. The combined ether layers were washed with water five times and dried over Na$_2$SO$_4$. The organic layer was filtered, evaporated to dryness, and the residual was flash chromatographed on a silica-gel column to give 73 g of the pure compound in a yield of 86%.

Example 10

Synthesis of 2,7-Dibromo-9,9-bis(3,6-dioxahexyl-6-phenyl)-fluorene 2,7-Dibromo-9,9-bis(3,6-dioxahexyl-6-phenyl)-fluorene was synthesized from PhO(CH$_2$)$_2$O(CH$_2$)$_2$I and 2,9-dibromofluorene following the procedure essentially as described in Example 9.

End Capping Groups

Example 11

Synthesis of N,N-diphenyl-4-(4,4,5,5-tetramethyl-1,3,2-dioxaborolan-2-yl)aniline

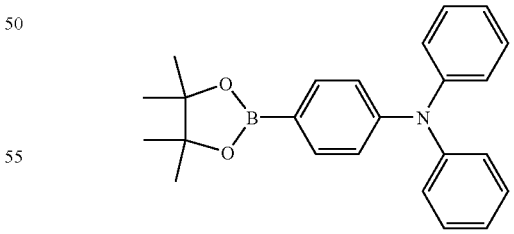

n-Butyllithium was added dropwise via syringe to a −78° C. (acetone-dry ice cooling bath) solution of 4-bromo-N,N-diphenylaniline (24 g, 0.074 mole) in 175 ml dry THF. Stirring was continued at −78° C. for an hour and then at −50° C. for an hour. The mixture was cooled to −78° C. and 2-isopropoxy-4,4,5,5-tetramethyl-1,3,2-dioxaborolane (17.22 g, 0.0925 mole) added via syringe in one portion. The temperature was maintained at −78° C. for three hours. The cooling bath was removed and the reaction left to warm to room temperature while standing for 12 hours. The reaction mixture was poured into saturated ammonium acetate and extracted with ether. The ether layer was dried over magnesium sulfate and concentrated to give a viscous oil. Purification by column chromatography (silica gel eluting with hexane:toluene mixtures of increasing gradient from 100% hexane to 40% hexane) gave N,N-diphenyl-4-(4,4,5,5-tetramethyl-1,3,2-dioxaborolan-2-yl)aniline as an oil (19.9 g, 72.8% yield), which slowly crystallized to a solid on standing.

Example 12

Synthesis of 4-[9,9-Dioctyl-7-(4,4,5,5-tetramethyl-1,3,2-dioxaborolan-2-yl)-9H-fluoren-2-yl]-N,N-diphenylaniline

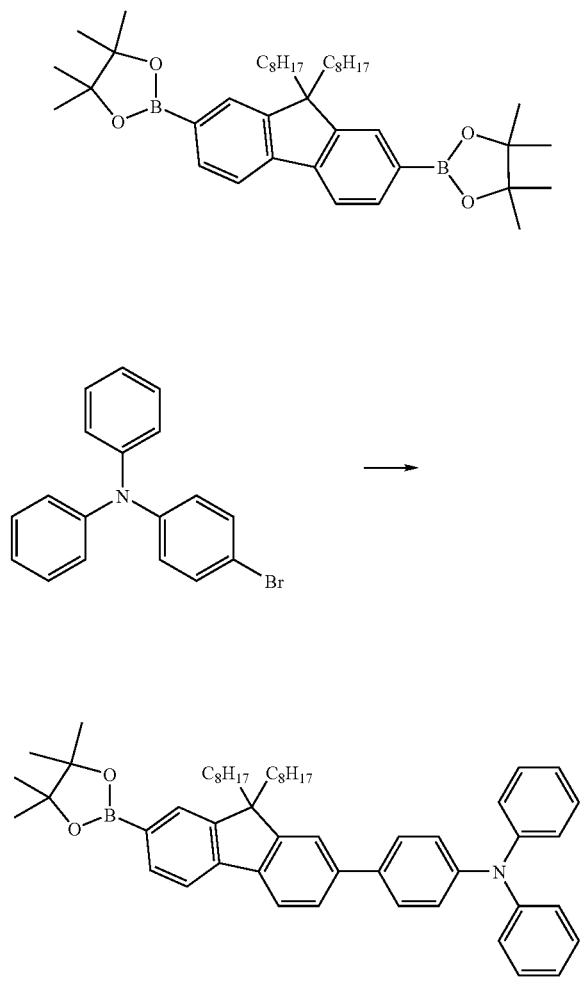

4-Bromo-N,N-diphenylaniline (19.44 g, 60 mmole, 1 equiv), 2-[9,9-dioctyl-7-(4,4,5,5-tetramethyl-1,3,2-dioxaborolan-2-yl)-9H-fluoren-2-yl]-4,4,5,5-tetramethyl-1,3,2-dioxaborolane (76.9 g, 120 mmole, 2 equiv), Aliquat™ 336 (tricaprylylmethylammonium chloride) (6 g, 15 mmole, 0.25 equiv) and 2M sodium carbonate solution (75 mL, 150 mmole, 2.5 equiv) were added to 600 mL of toluene. This was purged with a stream of nitrogen for about 30 min. Under a nitrogen purge, tetrakis(triphenylphosphine palladium (0) (348 mg, 0.30 mmole, 0.005 equiv) was added. The reaction mixture was then refluxed for 16 hrs. The reaction was cooled to room temperature and water added. The organic layer was separated and washed with water followed by brine. Drying of the organic layer over $Na_2SO_4$ and evaporation of the solvent gave a light yellow solid. This was suspended in acetone and the mixture brought to reflux and then allowed to stand at room temperature overnight. Filtration of the solid and concentration of the filtrate gave a solid that was subjected to column chromatography (toluene:hexane 3:7) to give 4-[9,9-dioctyl-7-(4,4,5,5-tetramethyl-1,3,2-dioxaborolan-2-yl)-9H-fluoren-2-yl]-N,N-diphenylaniline.

Example 13

Synthesis of 2-{7-[3,5-Bis(trifluoromethyl)phenyl]-9,9-dioctyl-9H-fluoren-2-yl}-4,4,5,5-tetramethyl-1,3,2-dioxaborolane and 2,7-Bis[3,5-bis(trifluoromethyl)phenyl]-9,9-dioctyl-9H-fluorene

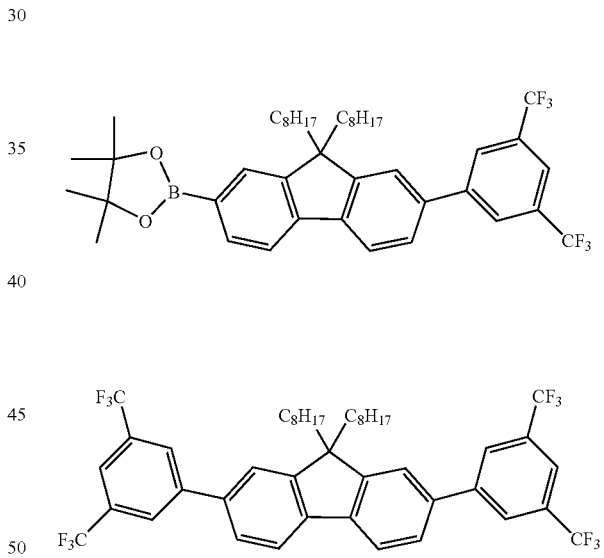

3,5-Bistrifluoromethylbromobenzene (0.293 g, 1 mmole, 1 equiv), 2-[9,9-dioctyl-7-(4,4,5,5-tetramethyl-1,3,2-dioxaborolan-2-yl)-9H-fluoren-2-yl]-4,4,5,5-tetramethyl-1,3,2-dioxaborolane (1.28 g, 2 mmole, 2 equiv), Aliquat™ 336 (tricaprylylmethylammonium chloride) (0.15 g, 0.375 mmole, 0.25 eq) and 2M sodium carbonate solution (1.25 mL, 2.5 mmole, 2.5 eq) were added to 10 mL of toluene. This was purged with a stream of nitrogen for about 30 min. Under a nitrogen purge, tetrakis(triphenylphosphine)palladium (0) (14 mg, 0.012 mmole, 0.012 eq) was added. The reaction mixture was then refluxed for 16 hrs. The reaction was cooled to room temperature and water added. The organic layer was separated and washed with water, followed by brine. Drying of the organic layer over $Na_2SO_4$ and evaporation of the solvent gave a light yellow solid. The solid was dissolved in ether, and a small portion of it was applied on a silica thin layer chromatography (TLC) plate. The TLC plate was eluted with 1:1 toluene:hexane to give three distinctive bands. The middle band was collected and was determined to be 2-{7-[3,5-bis(trifluoromethyl)phenyl]-9,9-dioctyl-9H-fluoren-2-yl}-4,4,5,5-tetramethyl-1,3,2-dioxaborolane obtained as a light yellow oil (28 mg). $^1$H NMR: δ0.53–0.69 (m, 4H), 0.78 (t, 6H), 0.96–1.29 (m, 20H), 1.40 (s, 12H), 1.97–2.11 (m, 4H), 7.52, (s, 1H), 7.56 (d, 1H), 7.72–7.80 (m, 2H), 7.80–7.88 (m, 3H), 8.05 (s, 2H). The band having the greatest elution distance was collected and was determined to be the by-product 2,7-bis[3,5-bis(trifluoromethyl)phenyl]-9,9-dioctyl-9H-fluorene obtained, as a light yellow oil (8 mg). $^1$H NMR: δ0.51–0.65 (m, 4H), 0.70 (t, 6H), 0.91–1.26 (m, 20H), 1.98–2.11 (m, 4H), 7.49,(s, 2H), 7.56 (d, 2H), 7.80 (d, 4H), 8.00 (s, 4H).

Example 14

Synthesis of 2-Bromo-9,9-bis(3,6-dioxahexyl-6-phenyl)-fluorene

2-Bromo-9,9-bis(3,6-dioxahexyl-6-phenyl)-fluorene was synthesized from PhO(CH$_2$)$_2$O(CH$_2$)$_2$I and 2-bromofluorene following the procedure essentially as described in Example 9.

Example 15

Synthesis of 2-(4-Chlorophenyl)-5-(2-methoxyphenyl)-1,3,4-oxadiazole

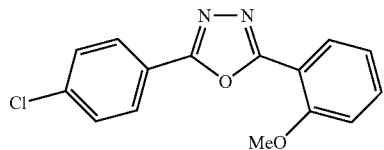

By the general method for the synthesis of 2-(2,5-dibromophenyl)-5-[4-(octyloxy)phenyl]-1,3,4-oxadiazole (1) in Example 3, the reaction of 4-chlorobenzoyl chloride (43.22 g, 0.247 mole) with 2-methoxybenzoyl hydrazide (41.10 g, 0.247 mole) gave the intermediate N'-(4-chlorobenzoyl)-2-methoxybenzohydrazide (54.38 g, 72% yield). Cyclocondensation of N'-(4-chlorobenzoyl)-2-methoxybenzohydrazide (30.0 g, 0.098 mole) with POCl$_3$ (250 mL) gave 2-(4-chlorophenyl)-5-(2-methoxyphenyl)-1,3,4-oxadiazole (23.44 g, 82% yield).

Electroactive Polymeric Arylenes

Example 16

Polymerization and End Capping of 2-(2,5-Dichlorophenyl)-5-[4-(octyloxy)phenyl]-1,3,4-oxadiazole Into a flask fitted with a septum and nitrogen purge was introduced 4.10 g (9.77 mmol) of 2-(2,5-dichlorophenyl)-5-[4-(octyloxy)phenyl]-1,3,4-oxadiazole (2) from Example 1, 2.85 g (10.89 mmol) of triphenylphosphine, and 0.31 g (1.421 mmol) of anhydrous nickel(II) bromide. To this was added 75 ml dry DMF and 25 ml dry toluene. This was azeotroped with the use of a Dean-Stark condenser followed by distilling off much of the toluene. To the cooled reaction solution was added a further 0.31 g (1.421 mmol) of anhydrous nickel(II) bromide under a strong nitrogen purge. This was heated at 80° C. for 30 minutes followed by the addition of 1.0 g chlorobenzene as end-capping agent. The reaction was allowed to proceed for 8 hours at 80° C. The cooled reaction mixture was poured into about 500 ml acetone and filtered. The solid cake was taken up in methylene chloride and 1N HCl added and the two phase system stirred for about an hour. The resulting solids were filtered off and the filtrate transferred to a separatory funnel. The lower organic layer was separated and poured into an excess of methanol. The solid was collected, washed with methanol and dried to give 2.8 g of polymer. Gel permeation chromatograpy (GPC) was run on this polymer and on polymers made in succeeding Examples as follows.

GPC sample was prepared by the addition of 10.0 ml of tetrahydrofuran to approximately 25.0 mg of sample. After shaking overnight, the solution was filtered (ACRODISC CR 25 mm poly(tetrafluoroethylene) syringe filter with 25 micron pores, Gelman Laboratory, Ann Arbor, Mich.). 150 Microliters of the solution was injected into a two column set (mixed bed and 500A columns, Jordi Associates, Bellingham, Mass.) by a Waters 150-C chromatograph (Waters Corp., Milford, Mass.). The 150-C operated at room temperature using tetrahydrofuran as the eluent, flowing at a rate of 1.0 min. Changes in concentration were detected by the 150-C's internal refractive index detector. The molecular weight calculations were based upon a calibration made of narrow dispersity polystyrenes ranging in molecular weight from 7.5×10$^6$ to 580. The actual calculations were completed with CALIBER software from Polymer Laboratories, Amherst, Mass.

GPC analysis gave a weight average molecular weight (Mw) of 2.49×10$^4$, a number average molecular weight (Mn) of 8.40×10$^3$ and a polydispersity (PD) of 2.97.

A MALDI/TOF mass spectrum was obtained by using the PerSeptive Biosystems DE-STR MALDI/TOF mass spectrometer (matrix ssisted laser desorption ionization time-of-flight mass spectrometer) (available from PerSeptive Biosystems, Inc., Framingham, Mass.) in both the linear and reflectron detection modes. The sample was prepared in 10 mg/ml tetrahydrofuran solvent solution. Dithranol (1,8,9-anthracenetriol) was utilized as the MALDI matrix. Approximately 40 microliters of matrix was mixed with 10 microliters of analyte solution. The positive-ion MALDI/TOF mass spectrum contained a series of peaks separated by 348 Daltons and with an absolute molecular weight that corresponded to polymer termination by phenyl groups. Close examination of the narrow mass range clearly showed the presence of two other series of peaks from sequential replacement of the phenyl group with hydrogen. The following products were found:

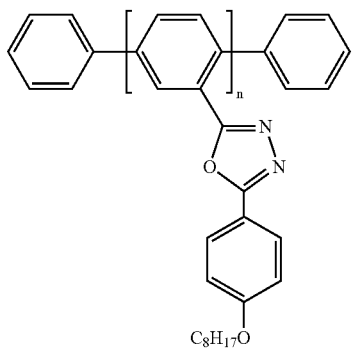

A

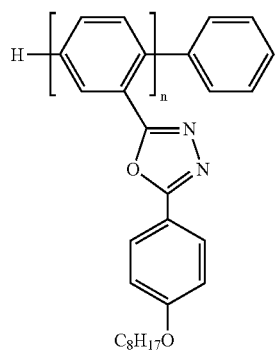

B

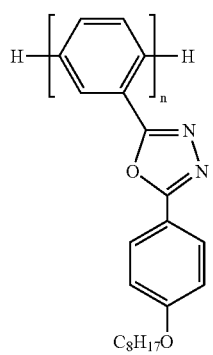

C

The reflection detector was able to observe an oligomer distribution were n was up to 15, and the linear detector was able to observe an oligomer distribution were n was from 2 to 22.

Figure 5:
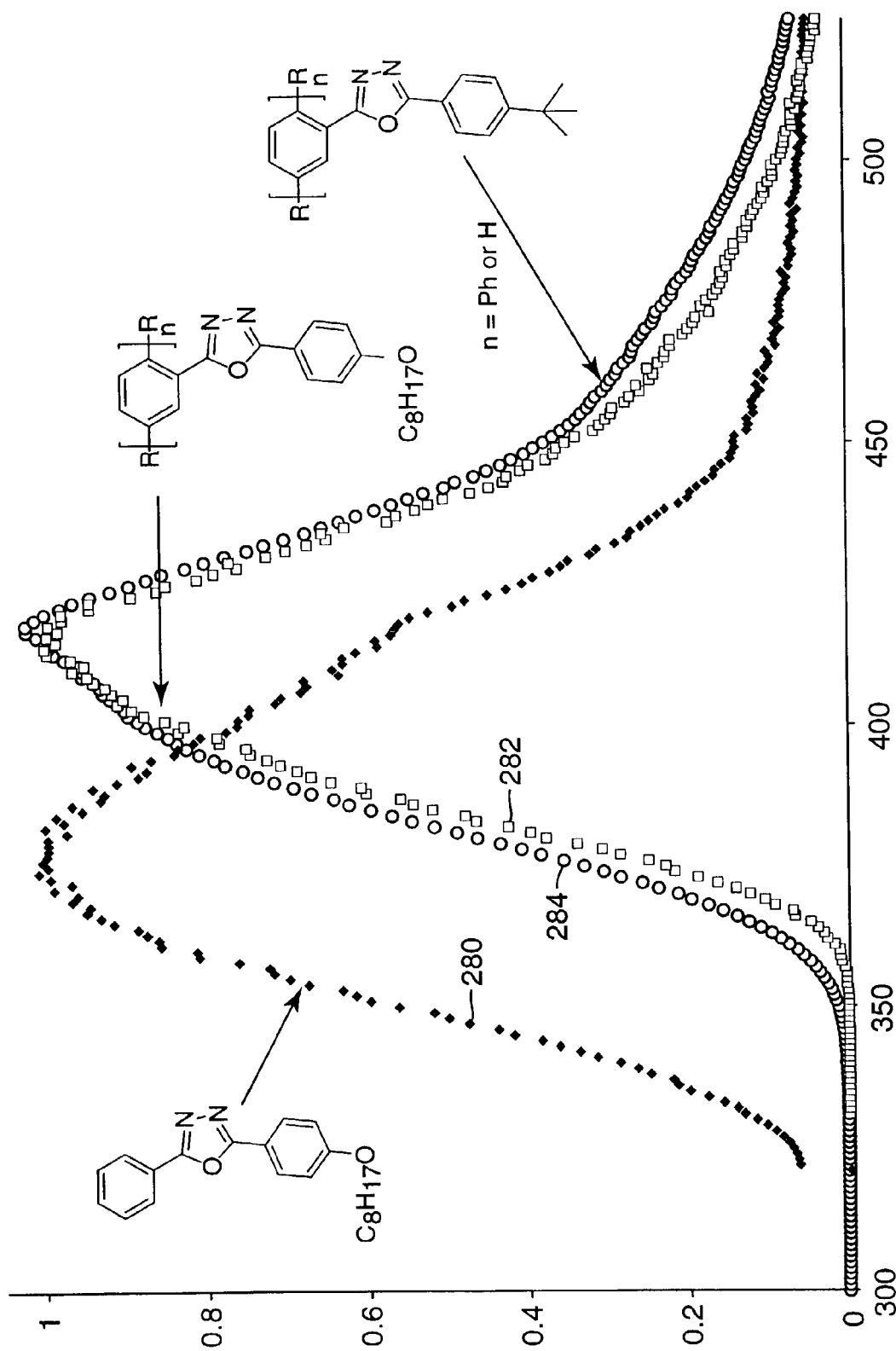
FIGS. 5 and 6 are emission spectra of polymers of the present invention.

The emission spectrum of the above polymer was run and compared to that of the corresponding monomer, 2-(phenyl)-5-[4-(octyloxy)phenyl]-1,3,4-oxadiazole. The results in FIG. 5 show that the emission maximum of the polymer at 419 nm was significantly red-shifted relative to the emission maximum of the monomer at 376 nm.

Example 17

Polymerization and End Capping of 2-(2,5-Dibromophenyl)-5-[4-(octyloxy)phenyl]1,3,4-oxadiazole A 500 ml round bottomed flask fitted with a magnetic stir-bar and rubber septum was put in a nitrogen filled glove box and was charged with 7.47 g (0.0272 mol) of bis(1,5-cyclooctadiene)nickel(0) and 4.24 g (0.0272 mol) 2,2'-bipyridyl. The sealed flask was then transferred to a fume hood and 26 ml of dry DMF and 65 ml toluene added via a cannula. The flask was then heated at 80° C. for 30 min. in an oil bath. A solution of 6.0 g (0.0118 mol) 2-(2,5-dibromophenyl)-5-[4-(octyloxy)phenyl]-1,3,4-oxadiazole (1) from Example 3 in about 15 ml toluene was added via a cannula. The sealed flask was heating for five minutes at 80° C., followed by the addition of 1.74 ml (1.53 g; density 0.882 g/ml; 0.0142 mol) of 1,5-cyclooctadiene. Heating was continued at 80° C. for 24 hrs. To the reaction flask was then added 1 mL of dry bromobenzene and heating continued at 80° C. for 24 hrs.

To the warm mixture was added 150 ml of chloroform and stirring continued for 30 min. The content of the flask was then extracted with 2N HCl (2×200 mL). The organic layer was washed with sodium carbonate solution and dried with magnesium sulfate. The product was precipitated into methanol and dried to give 3.0 g of a fibrous polymer. GPC analysis of the polymer gave a weight average molecular weight (Mw) of $9.1 \times 10^4$, a number average molecular weight (Mn) of $1.02 \times 10^4$, and a polydispersity (PD) of 8.93.

Example 18

Polymerization and End Capping of 2-(4-tert-Butylphenyl)-5-(2,5-dichlorophenyl)-1,3,4-oxadiazole Into a flask fitted with a septum and nitrogen purge was introduced 2.50 g (7.2 mmol) of 2-(4-tert-butylphenyl)-5-(2,5-dichlorophenyl)-1,3,4-oxadiazole (3) from Example 2, 0.81 g (7.2 mmol) chlorobenzene, 2.90 g (11.03 mmol) of triphenylphosphine, and 0.31 g (1.421 mmol) of anhydrous nickel(II) bromide. To this was added 75 ml dry DMF and 25 ml dry toluene. This was azeotroped with the use of a Dean-Stark condenser followed by distilling off much of the toluene. To the cooled reaction solution under a strong nitrogen purge was added a further 0.31 g (1.421 mmol) of anhydrous nickel(II) bromide. This was heated at 80° C. for 12 hours. The cooled reaction mixture was diluted with methylene chloride and filtered. The filtrate was stirred with 1N HCl for about an hour and then transferred to a separatory funnel. The lower layer was separated, washed with water and then poured into an excess of methanol. The solid was collected, washed with methanol and dried to give the required product. GPC analysis gave a Mw of $1.70 \times 10^4$, a Mn of $1.50 \times 10^3$, and a PD of 1.11. The positive ion MALDI/TOF mass spectrum obtained from this sample showed an oligomer distribution range from n=3 to n=32 around 6500 daltons. Close examination of the narrow mass range showed that the end-groups included some hydrogen as well as phenyl groups.

The emission spectrum of the above polymer was run and compared to that of a similar monomer, 2-(phenyl)-5-[4-(octyloxy)phenyl]-1,3,4-oxadiazole. The results in FIG. 5 show that the emission maximum of the polymer at 419 nm was significantly red-shifted relative to the emission maximum of the monomer at 376 nm.

Example 19

Polymerization and End Capping of 2-(2,5-Dichlorophenyl)-5-(9,9-dioctyl-9H-fluoren-2-yl)-1,3,4-oxadiazole

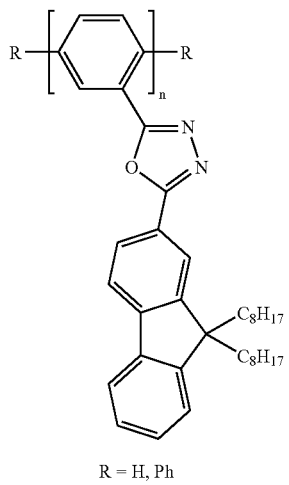

R = H, Ph

Into a 500 mL flask was charged 2-(2,5-dichlorophenyl)-5-(9,9-dioctyl-9H-fluoren-2-yl)-1,3,4-oxadiazole (13) from Example 5, nickel(II) bromide (0.67 g, 3.05 mmole), triphenylphosphine 6.14 g, 23.4 mmole), dry toluene and DMF. This was heated at 80° C. under nitrogen for 30 min. Zinc (6.19 g, 94.7 mmole) and nickel(II) bromide (0.67 g, 3.05 mmole) were added under a nitrogen purge. Heating was continued for 12 hours at 80° C. Bromobenzene (2 mL) was added as a capping agent and heating continued for two days. The cooled reaction mixture was diluted with methylene chloride and filtered. The filtrate was stirred with 1N HCl and the organic layer separated. Precipitation into methanol gave the desired polymer as a fibrous white solid. GPC analysis gave: Mw=$1.03 \times 10^5$, Mn=$3.8 \times 10^4$, PD=2.67.

Example 20

Copolymerization of 1,4-Bis(4,4,5,5-tetramethyl-1,3,2-dioxaborolan-2-yl)-phenyl and 2-(2,5-Dibromophenyl)-5-[4-octyloxy)phenyl]-1,3,4-oxadiazole

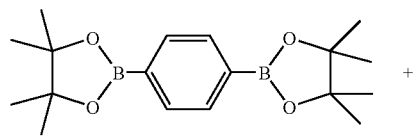 +

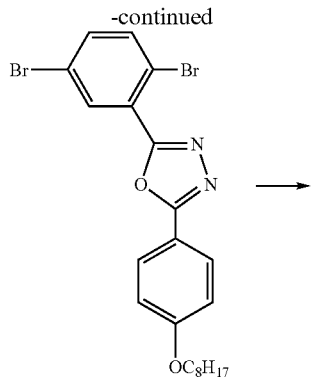

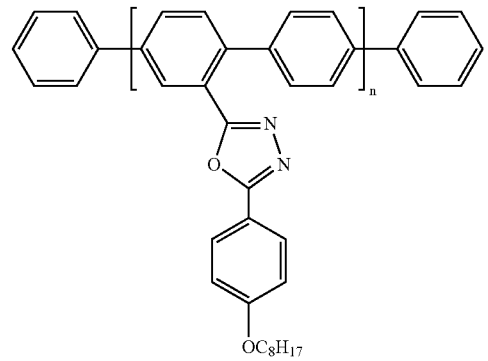

1,4-Bis(4,4,5,5-tetramethyl-1,3,2-dioxaborolan-2-yl)-phenyl (6.6g, 20 mmole), made by reaction of benzene-1,4-bis(boronic acid) with pinacol, and 2-(2,5-dibromophenyl)-5-[4-octyloxy)phenyl]-1,3,4-oxadiazole (1) (8.856g, 18 mmole) from Example 3 are mixed together with Aliquat™ 336 (tricaprylylmethylammonium chloride) (2.02 g, 5 mmole) in 212 mL toluene. To the resulting suspension is added 36 mL of 2M aqueous $Na_2CO_3$ solution and the mixture is then purged with nitrogen for one hour. Tetrakis (triphenylphosphine)palladium (0) (0.232g, 0.2 mmole) is then added under nitrogen. The reaction is refluxed under nitrogen for 3 days. 1 mL of bromobenzene is added and the reaction further refluxed for 18 hours. After the reaction is cooled down, it is poured to 500 mL of methanol and water (9:1). The polymer precipitates out as rubbery glue-like semi solid. The solid is filtered and dried under suction. The cake is redissolved in chloroform and precipitated from methanol. The precipitate is filtered and washed with methanol to give a solid.

Example 21

Preparation of a Poly(carbazole-co-phenylene) Block-Copolymer

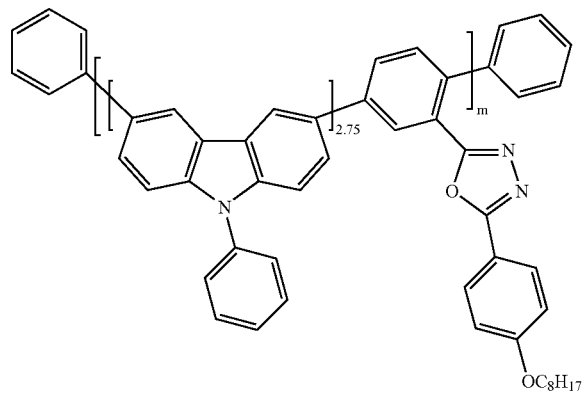

Part A

Synthesis of 9-Phenyl-3,6-bis(4,4,5,5-tetramethyl-1,3,2-dioxaborolan-2-yl)-9H-carbazole A 2L flask was charged with 600 mL dry THF and 3,6-dibromo-9-phenylcarbazole (60 g, 0.15 mole). This was cooled to −78° C. with an acetone-dry ice bath. n-Butyllithium (138 mL of a 2.5M solution in hexanes, 0.34 mole) was added drop-wise via syringe. The reaction was stirred for 20 minutes and then warmed to −50° C. The temperature was reduced to −78° C. and 2-isopropoxy-4,4,5,5-tetramethyl-1,3,2-dioxaborolane (64 g, 0.34 mole) added via syringe at such a rate as to maintain the temperature below −60° C. The temperature was maintained at −78° C. for two hours and then poured into an aqueous solution of ammonium acetate (90 g in 2100 mL water). The layers were phase separated and the aqueous phase extracted with methy tert-butyl ketone (2×200 mL). The combined organic phase and extracts were washed with brine (2×200 mL) and dried over magnesium sulfate. Concentration and re-crystallization of the resulting solid from acetone gave pure 9-phenyl-3,6-bis(4,4,5,5-tetramethyl-1,3,2-dioxaborolan-2-yl)-9H-carbazole (PBTDC).

Part B

Preparation of Borolane Terminated Poly(9-phenylcarbazole) Pre-polymers

The reaction of PBTDC from Part A, 2M $Na_2CO_3$ (42.4 g), Aliquat™ 336 (tricaprylylmethylammonium chloride) (1.28 g) and 3,6-dibromo-9-phenylcarbazole (DBPC) in 100 mL toluene under standard Suzuki coupling conditions using the amounts of PBTDC and DBPC shown in Table 1 gave oligomers with 8.75 and 2.75 repeat units, respectively, as determined by NMR spectroscopy. Standard Suzuki coupling conditions and work-up included a nitrogen purge, addition of tetrakis(triphenylphosphine)palladium (0) (0.06 g), refluxing for 12 hours, pouring the resulting cooled reaction mixture into water, separating and extracting the organic layer with methylene chloride, and pouring the combined orgainic layers into about 500 mL of methanol to precipitate the solid product.

TABLE 1

Oligomer Repeat Units as a Function of Reactant Amounts.

| PBTDC monomer (g) | DBPC monomer (g) | PBTDC/DBPC molar ratio | Pre-polymer Yield (g) | Number of Repeat Units |
|---|---|---|---|---|
| 7.41 | 3.0 | 2:1 | 2.05 | 8.75 |
| 11.1 | 3.0 | 3:1 | 3.82 | 2.75 |

Part C

Preparation of a Poly(carbazole-co-phenylene) Block-Copolymer

Into a 250 mL flask fitted with a reflux condenser, nitrogen inlet and rubber septum was added the pre-polymer of Part B (2.72 g, 2.9 mmole, 3 equiv), 2-(2,5-dibromophenyl)-5-[4-(ocyloxy)phenyl]-1,3,4-oxadiazole (1) (2.50 g, 4.92 mmole, 5 equiv), sodium carbonate (16.72 mL of a 2M aqueous solution, 33.4 mmole), Aliquat™ 336 and toluene. The stirred mixture was purged with a stream of nitrogen for an hour and then for 30 minutes at 50° C. Under a nitrogen purge, tetrakis(triphenylphosphine) palladium (0) (0.0244 g, 0.0211 mmole) was added. The content of the flask was refluxed for 12 hrs. The cooled reaction mixture was poured into water, and the organic layer was separated. The aqueous layer was extracted with methylene chloride. The combined orgainic layers were poured into about 500 mL of methanol to precipitate a solid. This was filtered off, washed with methanol and dried to give 1.21 g of the desired polymer.

Part D

The polymer from Part C is combined successively with an excess of phenyl boronic acid under standard Suzuki coupling conditions (refluxing toluene/2M aqueous sodium carbonate) and then an excess of bromobenzene with heating to provide the phenyl capped polymer.

Example 22

Polymerization of 2-(2,5-Dibromophenyl)-5-[4-(octyloxy)phenyl]1,3,4-oxadiazole and End Capping with Fluorene

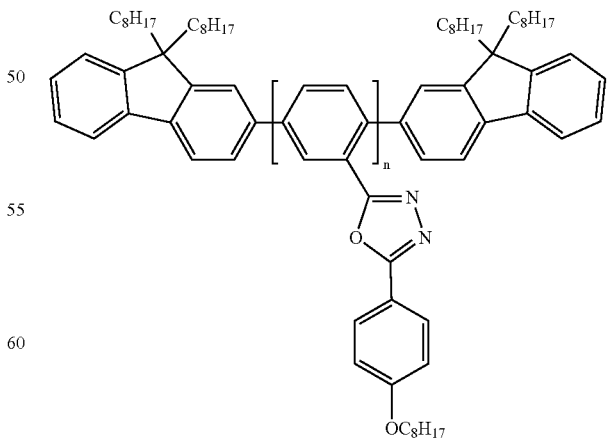

The polymerization is carried out as in Example 17. A 500 ml round bottomed flask fitted with a magnetic stir-bar and rubber septum was put in a nitrogen filled glove box and is charged with 7.47 g (0.0272 mol) of bis(1,5-cyclooctadiene) nickel(0) and 4.24 g (0.0272 mol) 2,2'-bipyridyl. The sealed flask is then transferred to a fume hood and 26 ml of dry DMF and 65 ml toluene added via a cannula. The flask is then heated at 80° C. for 30 min. in an oil bath. A solution of 6.0 g (0.0118 mol) 2-(2,5-dibromophenyl)-5-[4-(octyloxy)phenyl]-1,3,4-oxadiazole (1) from Example 3 in about 15 ml toluene is added via a cannula. The sealed flask is heating for five minutes at 80° C., followed by the addition of 1.74 ml (1.53 g; density 0.882 g/ml; 0.0142 mol) of 1,5-cyclooctadiene. Heating is continued at 80° C. for 24 hrs. To the reaction flask is then added 1 g of dry 2-bromo-9,9-dioctylfluorene and heating continued at 80° C. for 24 hrs.

To the warm mixture is added 150 ml of chloroform and stirring continued for 30 minutes. The content of the flask is then extracted with 2N HCl (2×200 mL). The organic layer is washed with sodium carbonate solution and dried with magnesium sulfate. The product is precipitated into methanol and dried to give 3.0 g of polymer. GPC analysis of the polymer gives a weight average molecular weight (Mw) of about $1 \times 10^5$.

Example 23

Preparation of a Blue-Emitting Polyfluorene Containing 30 Mole Percent of Electron Transport Oxadiazole

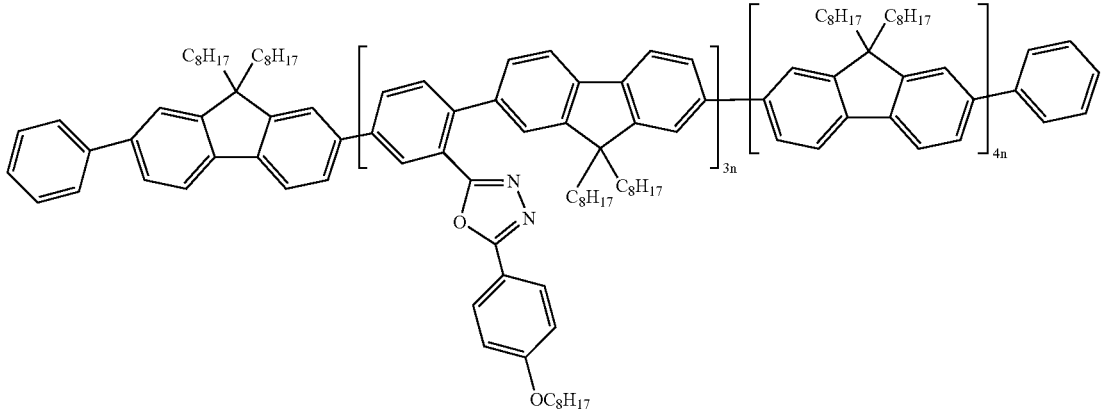

2,7-Bis(4,4,5,5-tetramethyl-1,3,2-dioxaborolan-2-yl)-9,9-dioctyl-fluorene (5.38 g, 8.37 mmole), 2,7-dibromo-9,9-dioctylfluorene (1.80 g, 3.28 mmole) and 2-(2,5-dibromophenyl)-5-[4-(octyloxy)phenyl]-1,3,4-oxadiazole (1) from Example 3 (2.50 g, 4.92 mmole) were mixed together with Aliquat™ 336 (tricaprylylmethylammonium chloride) (0.0.85 g, 2.09 mmole,) in 150 mL toluene. To this was added 28 mL of an aqueous 2M $Na_2CO_3$ solution, and the resulting mixture was then degassed with nitrogen for 2 hours at room temperature and then at 50° C. for a further 2 hours. Tetrakis(triphenylphosphine)palladium (0) (0.04 g, 0.035 mmole) was then added to the mixture. The resulting mixture was heated at reflux under nitrogen for 16 hours. A nitrogen purged solution of 1 mL bromobenzene in toluene was added followed by a further charge of 0.04 g of tetrakis(triphenylphosphine)palladium (0), and the resulting mixture was then refluxed for another 16 hrs. After the reaction mixture was cooled to room temperature, it was poured into 2L methanol and the precipitate collected by filtration. The precipitate was purified by repeated dissolution in methylene chloride and then precipitation in methanol. The product was obtained as 5.4 g of a light powder. Gel permeation chromatography analysis of the product gave: Mw=$7.30 \times 10^4$, Mn=$2.36 \times 10^4$, and PD=3.09. Proton NMR of the polymer supported the expected 30 mole percent content of the oxadiazole-containing monomer unit.

To provide a lower molecular weight polymer the above was repeated except that amount of 2,7-bis(4,4,5,5-tetramethybyl-1,3,2-dioxaborolan-2-yl)-9,9-dioctyl-fluorene used was increased to 5.85 g. The product, obtained as 4.8 g of powder, was analyzed by gel permeation chromatography and differential scanning calorimetry (DSC), and the results are given in Table 2.

Example 24

Preparation of a Green-Emitting Polymer Containing 10 Mole Percent of Electron Transport Oxadiazole

Example 25

Preparation of a Terpolymer Containing Hole and Electron Transport Functionality

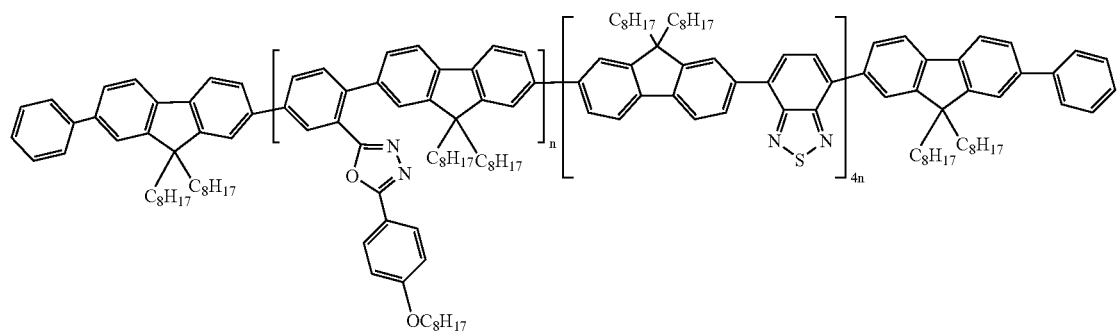

2,7-Bis(4,4,5,5-tetramethyl-1,3,2-dioxaborolan-2-yl)-9,9-dioctyl-fluorene (4.84 g, 7.53 mmole, 5.1 eq), 4,7-dibromo-2,1,3-benzothiadiazole (1.74 g, 5.90 mmol) and 2-(2,5-dibromophenyl)-5-[4-(octyloxy)phenyl]-1,3,4-oxadiazole (1) from Example 3 (0.75 g, 1.48 mmole) were mixed together with Aliquat™ 336 (tricaprylylmethylammonium chloride) (0.76 g, 1.86 mmole) in 150 mL toluene. To this was added 28 mL of an aqueous 2M $Na_2CO_3$ solution, and the mixture was then degassed with nitrogen for 2 hours at room temperature and then at 50° C. for a further 2 hours. Tetrakis(triphenylphosphine)palladium (0) (0.04 g, 0.035 mmole) was then added to the mixture. The resulting mixture was heated at reflux under nitrogen for 16 hours. A nitrogen purged solution of 1 mL bromobenzene in toluene was added followed by a further charge of 0.04 g of tetrakis(triphenylphosphine)palladium (0), and the resulting mixture was refluxed for another 16 hrs. After the reaction mixture was cooled to room temperature, it was poured into 2L methanol, and the resulting precipitate was collected by filtration. The precipitate was purified by repeated dissolution in methylene chloride and precipitation in methanol. The product was obtained as 3.95 g of a light yellow-green powder. Gel permeation chromatography analysis of the product gave: Mw=$2.19 \times 10^4$, Mn=$7.49 \times 10^3$, PD=2.93.

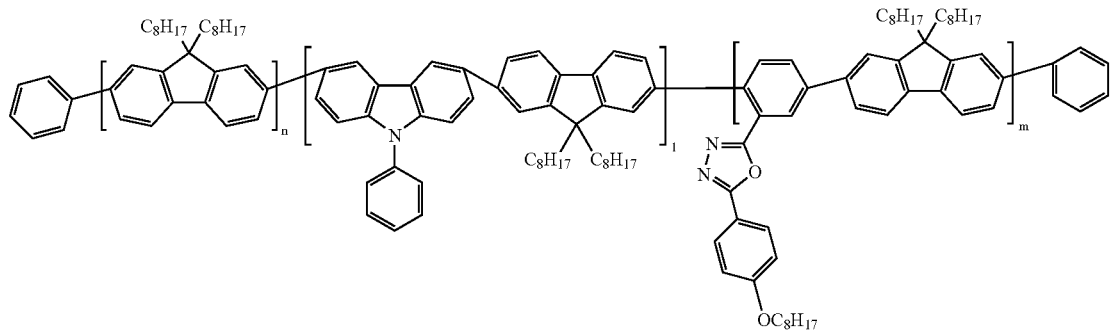

2,7-Dibromo-9,9-dioctylfluorene (1.00 g, 1.82 mmole, 1 eq), 2,7-bis(4,4,5,5-tetramethyl-1,3,2-dioxaborolan-2-yl)-9,9-dioctyl-fluorene (5.98 g, 9.30 mmole, 5.1 eq), 3,6-dibromo-9-phenylcarbazole (1.46 g, 3.65 mmole, 2 equiv) and 2-(2,5-dibromophenyl)-5-[4-(octyloxy)phenyl]-1,3,4-oxadiazole (1) from Example 3 (1.85 g, 3.65 mmole, 2 eq) were mixed together with Aliquat™ 336 (tricaprylylmethylammonium chloride) (0.94 g, 2.32 mmole, 1.275 equiv) in 150 mL toluene. To this was added 31.5 mL of an aqueous 2M Na$_2$CO$_3$ (62 mmole, 34 equiv) solution and the mixture then degassed with nitrogen for 2 hrs at room temperature and then at 50° C. for a further 2 hours. Tetrakis(triphenylphosphine)palladium (0) (0.05 g, 0.039 mmole) was then added to the mixture. The resulting mixture was heated at reflux under nitrogen for 16 hours. A nitrogen purged solution of 1 mL bromobenzene in toluene was added followed by a further charge of 0.039 g of tetrakis(triphenylphosphine) palladium (0), and the resulting mixture was then refluxed for another 16 hrs. After the reaction mixture was cooled to room temperature, it was poured to 2L methanol, and the precipitate was collected by filtration. The precipitate was purified by repeated dissolution in methylene chloride and precipitation in methanol. The resulting product was obtained as 5.2 g of a grayish powder. GPC and DSC data are given in Table 2.

Example 26

Preparation of a Blue-Emitting Polyfluorene Containing 10 Mole Percent of Electron Transport Oxadiazole Comparative Example C1

Synthesis of a Medium Molecular Weight Phenyl Capped 9,9'-Dioctylfluorene Homopolymer A medium molecular weight 9,9'-dioctylfluorene homopolymer was prepared by Suzuki coupling methods according to the literature procedures outlined in J. Chem. Soc. *Chem. Commun.* 1597–1598 (1997). The polymer was then capped by reaction with bromobenzene as in Example 23. Gel permeation chromatogrpy of the resulting polymer gave: Mw=44,900, Mn=17,400, and PD=2.58. GPC and DSC data are given in Table 2.

Comparative Example C2

Synthesis of a High Molecular Weight Phenyl Capped 9,9'-Dioctylfluorene Homopolymer This polymer was prepared by Yammamoto coupling as follows. A 1L round bottomed flask fitted with a magnetic stir-bar and rubber septum in a nitrogen glove box was charged with 28.84 g (0.1048 mol) of bis(1,5-cyclooctadiene)nickel(0) and 16.37 g (0.1484 mol) 2,2'-bipyridyl. The

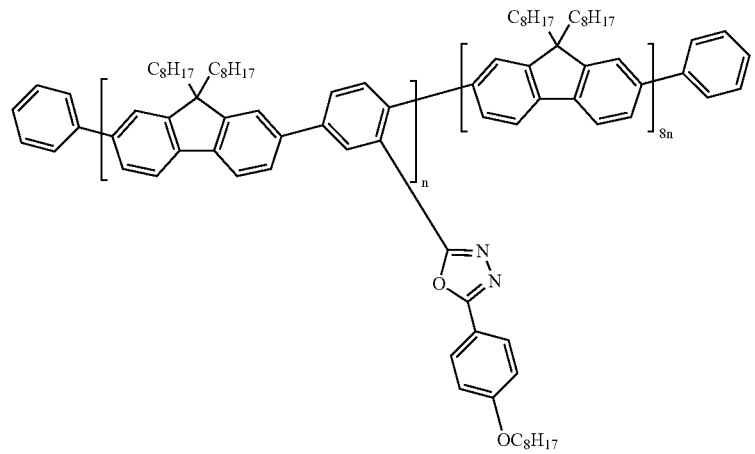

A blue-emitting polyfluorene containing 10 mole percent of electron transport oxadiazole was prepared essentially as described in Example 23. Thus, the polymerization of the monomers 2,7-dibromo-9,9-dioctylfluorene (6.0 g, 10.94 mmol, 0.8 equiv), 9,9-dioctyl-2,7-bis(4,4,5,5-tetramethyl-1,3,2-dioxaborolan-2-yl)-fluorene (8.83 g, 14.003 mmol, 1.024 equiv), 2-(2,5-dibromophenyl)-5-[4-(octyloxy)phenyl]-1,3,4-oxadiazole (1.39 g, 2.735 mmol, 0.2 equiv), in toluene (112 ml) with and 2M Na$_2$CO$_3$ (27.35 ml, 54.7 mmol) and Aliquat™ 336 (tricaprylylmethylammonium chloride) for about 24 hours gave, after phenyl-capping, a polymer for which gel permeation chromatogaraphy gave: Mw=9.0×10$^4$, Mn=2.65×10$^4$, and PD=3.40.

sealed flask was then transferred to a fume hood and 103 ml of dry DMF and 250 ml toluene added via a cannula. The flask was then heated at 80° C. for 30 min. in an oil bath. A solution of 25.0 g (0.04558 mol) 2,7-dibromo-9,9-dioctylfluorene in about 40 ml toluene was added via a cannula. The sealed flask was heating for five minutes at 80° C. followed by the addition of 6.7 ml (5.92 g; density 0.882 g/ml; 0.0186 mol) of 1,5-cyclooctadiene. Heating was continued at 80° C. for 4 days. To the reaction flask was added 3 ml of dry bromobenzene and heating continued at 80° C. for 24 hours.

To the warm mixture was added 300 ml of chloroform and stirring continued for 30 min. The content of the flask was then extracted with 2N HCl (2×200 ml). The organic layer was washed with sodium carbonate solution and dried with magnesium sulfate. The product was precipitated in methanol and dried to give 15.8 g of phenyl capped poly(9,9-di-n-octylfluorene-2,7-diyl). GPC analysis gave: Mw=374,000, Mn=127,000, and PD=2.94. GPC and DSC data are given in Table 2.

TABLE 2

DSC and GPC Data for Polyfluorenes and Fluorene-Oxadiazole Copolymers.

| Polymer | $M_w$ (×10⁻³) | $M_n$ (×10⁻³) | PD | $T_g$ (° C.) | $T_c$ (° C.) | $T_m$ (° C.) |
|---|---|---|---|---|---|---|
| Comp. Ex. C1 | 44.9 | 17.4 | 2.58 | 59.2 | 76.4 | 146.6 |
| Comp. Ex. C2 | 374 | 127 | 2.94 | 75.6 | 90.1 | 150 |
| Example 23 | 21.3 | 8.51 | 2.50 | 62 | none | none |
| Example 25 | 30.9 | 10.5 | 2.95 | 106.1 | none | none |
| Example 26 | 90.0 | 26.5 | 3.40 | 68.3 | none | none |

$M_w$ = weight average molecular weight.
$M_n$ = number average molecular weight.
PD = polydispersity.
$T_g$ = glass transition temperature.
$T_c$ = crystallization transition temperature.
$T_m$ = melt transition temperature.

Table 2 shows Differential Scanning Calorimetry (DSC) and Gel Permeation Chromatography (GPC) data for the two comparative 9,9'-dioctylfluorene homopolymers of Comparative Examples C1 and C2, the 9,9'-dioctylfluorene-phenyl oxadiazole copolymers having 10% phenyl oxadiazole monomer units (Example 26) and having 30% phenyl oxadiazole monomer units (Example 23), as well as the 9,9'-dioctylfluorene-phenyl oxadiazole-phenyl carbazole terpolymer (Example 25).

The 9,9'-dioctylfluorene homopolymers of Comparative Examples C1 and C2 exhibited glass transition temperatures of $T_g$=59.2 and 75.6° C., respectively. On heating above the glass transition temperature, both polymers exhibit crystallization and melt transitions, as shown in Table 2. These types of transitions indicated a thermal instability of amorphous films of these polymers (i.e. a propensity to undergo formation of crystalline domains that can lead to excimer formation and color shifting). Both of these polymers exhibited color shifting from blue to green in both the photoluminescence and electroluminescence spectrum upon accelerated thermal aging of thin spin cast films of the polymers.

Table 2 shows that the phenyl oxadiazole containing polymers of Examples 23, 25, and 26 have molecular weights of Mw=21,300, Mw=30,900, Mw=90,000, respectively, and polydispersities that are comparable to those obtained for the 9,9'-dioctylfluorene homopolymers of Comparative Examples C1 and C2. The glass transition temperatures of the copolymers of Examples 23 and 26 (Tg=62° C. and Tg=68.3° C., respectively) suggested that incorporation of the phenyl oxadiazole comonomer into the polyfluorene polymer did not greatly affect the Tg compared with those obtained for the 9,9'-dioctylfluorene homopolymers. The glass transition temperature for the terpolymer of Example 25 (Tg=106.1° C.) suggested that incorporation of the phenyl carbazole comonomer into the polymer increased Tg considerably.

Table 2 also shows that none of the phenyl oxadiazole-containing polymers of Examples 23, 25, and 26 exhibited crystallization and melt transitions, which were observed for the 9,9'-dioctylfluorene homopolymers. Instead, the phenyl oxadiazole containing polymers remained amorphous above the glass transition temperature. This is an important discovery, especially since these new phenyl oxadiazole-containing polymers do not exhibit excimer emission (color shifting) during accelerated aging, as described in Example 27.

Example 27

Accelerated Aging Studies for Polyfluorene-Phenyl Oxadiazole Copolymers and Comparison to Polyfluorene Homopolymers Polyfluorene-phenyl oxadiazole copolymers of Examples 23, 25, and 26 were separately dissolved in dry toluene to final concentrations of 1% by weight of the solution. These solutions were spin coated onto separate 2 cm×2 cm quarts slides at a spin rate of 2500 rpm. Photoluminescence spectra for each the thin films were measured in a front face mode on a Spex Fluorolog fluorimeter (Spex Industries, Edison, N.J.). Each slide was then placed face up on a heating plate and covered with a nitrogen purged glass dome that maintained a steady flow of nitrogen gas over the samples. The samples were heated under nitrogen to 200° C. for 15 hours. The photoluminescence spectrum for each film was then remeasured.

Figure 6:
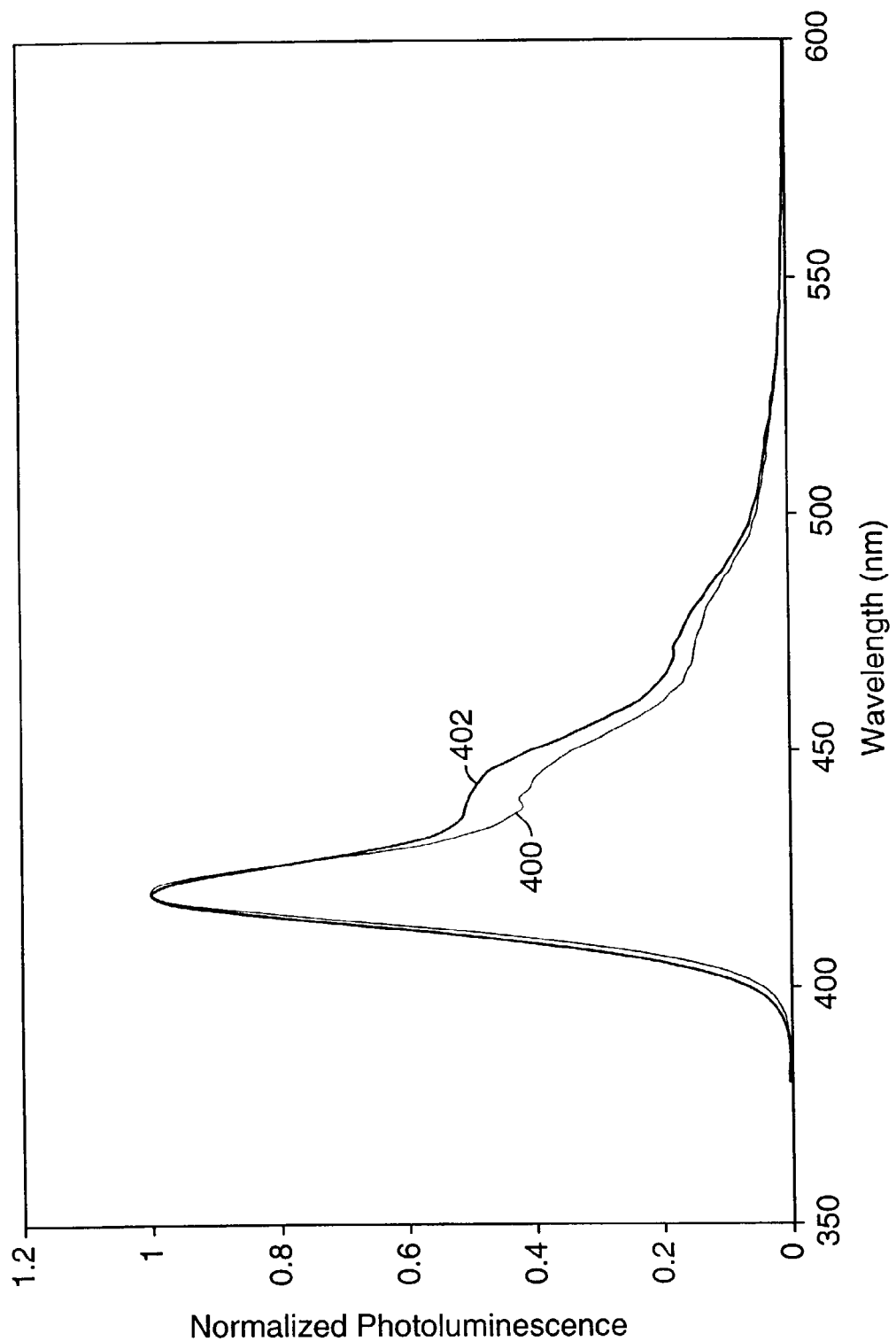

FIG. 6 shows the photoluminescence as a function of wavelength of spin coated thin films of the copolymer of Example 23 (polyfluorene containing 30 mole percent of phenyl oxadiazole units) before (emission spectum 402) and after (emission spectrum 400) thermal annealing under a nitrogen purge at 200° C. for 15 hours. The same tests were run on the copolymers of Examples 25 and 26 The intensity and wavelength of the emission was substantially the same before and after annealing. This contrasts the blue to green color shifting observed for corresponding films of the phenyl capped 9,9'-dioctylfluorene of Comparative Examples C1 and C2. For these polymers, annealing of thin films gives rise to growth of strong green emission centered at 520 nm. These results indicate that incorporation of the phenyl oxadiazole comonomer into poly(9,9'-dioctylfluorenes) stabilized the polymers with respect to crystallization and/or excimer formation. This is important, especially for achieving a stable blue light emitting OLED device.

Electroactive Compositions and Organic Electroluminescent Devices

Examples 28–46

Compositions and Electoluminescent Devices Based on Phenyl Oxadiazole Homopolymers Electroactive compositions were prepared as follows: The polymers of Examples 16, 18, and 19 were independently dissolved at 1–3 wt/wt % into dichloroethane or toluene (HPLC grade obtained from Aldrich Chemical, Milwaukee, Wis.). A hole transporting agent (HTA) selected from TPD, NPB, CBP, and HT were added in a ratio of polymer/HTA=10:3; in some cases 10:6, 10:12 or 10:18. Molecular emitters perylene, TMC, Ir(ppy)$_3$, (bthpy)$_2$Ir(acac), and Pt(OEP) were introduced in amounts of 0.01–0.5 wt/wt % by addition of small aliquots of a 10 mM solution of the emitter in dichloroethane (DCE). Each coating solution was filtered through a 0.45 μm polypropylene syringe filter before application.

Organic electroluminescent devices were constructed as follows: Glass squares of 2 cm×2 cm having on one side a vapor deposited coating of indium tin oxide (ITO) were obtained from Thin Film Devices (Anaheim, Calif.). The ITO coated sides were cleaned with ethanol, treated with an O$_2$ plasma etch (4 min at 50 W and 200 mTorr), treated by spin coating (2500 rpm for 30 sec) of an aqueous solution of PEDT/PSS copolymer and dried under nitrogen purge at 115° C. Next, the coating solutions prepared above were each spin coated on top of a PEDT/PSS coated substrate (2500 rpm for 30 sec). The glass squares were then mounted into an aluminum frame, introduced into a vacuum deposition chamber, and pumped to 10$^{-6}$ torr for about 1 hour. Cathodes were applied by vapor depositing about 10 Å of LiF and about 2000 Å of aluminum.

The resulting organic electroluminescent lamps were evaluated for drive voltages (V), external percent quantum efficiencies (% Q.E.), luminescence intensities (cd/m$^2$), and emission maxima ($\lambda_{max}$ nm) for blue, green, and red lamps operating at 20 mA/cm$^2$ drive current.

Table 3 summarizes the electroactive compositions and results of the respective lamp evaluations. The materials in the electroactive compositions are recorded in Table 3 as the number of parts (p) by weight added to 1000 parts (1000 p) DCE to make the spin coating solution used in preparing the lamps.

TABLE 3

Electroactive Compositions and Lamp Evaluation Results

| Example | p Polymer/ 1000 p DCE (Polymer) | p HTA/ 1000 p DCE (HTA) | p Emitter/ 1000 p DCE (Emitter) | Electroluminescence data at 20 mA/cm$^2$ | | |
|---|---|---|---|---|---|---|
| | | | | voltage (V) | % Q.E. | cd/m$^2$ | $\lambda_{max}$ nm |
| 28 | 10 (Ex. 18) | 3 (TPD) | 0.085 (Ir(ppy)$_3$) | 4.9 | 0.84 | 590 | 513 |
| 29 | 10 (Ex. 18) | 3 (TPD) | 0.094 (Pt(OEP)) | 5.1 | 0.37 | 42 | 650 |
| 30 | 10 (Ex. 16) | 3 (TPD) | 0.094 (Pt(OEP)) | 7.7 | 1.1 | 92 | 648 |
| 31 | 10 (Ex. 16) | 3 (CBP) | 0.094 (Pt(OEP)) | 9.7 | 1.0 | 92 | 650 |
| 32 | 10 (Ex. 16) | 3 (TPD) | 0.085 (Ir(ppy)$_3$) | 7.4 | 2.0 | 1400 | 513 |
| 33 | 10 (Ex. 16) | 3 (CBP) | 0.085 (Ir(ppy)$_3$) | 6.2 | 2.7 | 1900 | 513 |
| 34 | 10 (Ex. 16) | 3 HT | 0.085 (Ir(ppy)$_3$) | 8.3 | 1.42 | 1040 | 514 |
| 35 | 10 (Ex. 16) | 12 (CBP) | 0.085 (Ir(ppy)$_3$) | 7.1 | 3.4 | 2300 | 513 |
| 36 | 10 (Ex. 16) | 18 (CBP) | 0.085 (Ir(ppy)$_3$) | 8.1 | 5.3 | 3700 | 513 |
| 37 | 10 (Ex. 16) | 3 (CBP) | none | 12.4 | 0.38 | 73 | 444 |
| 38 | 10 (Ex. 16) | 6 (CBP) | none | 8.8 | 0.26 | 37 | 437 |
| 39 | 10 (Ex. 16) | 12 (CBP) | none | 5.5 | 0.11 | 7.3 | 414 |
| 40 | 10 (Ex. 16) | 3 (CBP) | 0.033 (TMC) | 7.9 | 0.42 | 64 | 435 |
| 41 | 10 (Ex. 16) | 3 (CBP) | 0.039 (perylene) | 5.0 | 0.28 | 72 | 455, 482 |
| 42 | 10 (Ex. 16) | 6 (CBP) | 0.078 (perylene) | 5.8 | 0.39 | 98 | 455, 482 |
| 43 | 10 (Ex. 16) | 3 (CBP) | 0.085 (bthpy)$_2$Ir(acac) | 6.1 | 0.43 | 88 | 615, 669 |
| 44 | 10 (Ex. 19) | 3 (CBP) | 0.085 (Ir(ppy)$_3$) | 9.1 | 0.39 | 152 | 515 |
| 45 | 10 (Ex. 19) | 3 (HT polymer) | 0.085 (Ir(ppy)$_3$) | 8.4 | 0.30 | 207 | 516 |
| 46 | 10 (Ex. 19) | 3 (TPD) | 0.085 (Ir(ppy)$_3$) | 6.7 | 0.21 | 152 | 513 |

(Ex. 18) means the polymer of Example 18.
(Ex. 16) means the polymer of Example 16.
(Ex. 19) means the polymer of Example 19.

The results in Table 3 show that light was observed from each of the organic electroluminescent lamp devices of Examples 28–46, and each device provided diode type behavior. The polymer of Example 16 in conjunction with the hole transport agent CBP yielded blue emission in the absence of added emitter (Example 37). Increasing the CBP content lead to a larger background current and a decline in external quantum efficiency (Examples 37–39). Doping of the polymer/HTA blends with various blue emitters such as perylene and 3-thienyl-7-methoxycoumarin (TMC) gave blue emission. Doping with Ir(ppy)3 gave green emission. Doping with Pt(OEP) or with (bthpy)$_2$Ir(acac) gave red emission. In all compositions, low operating voltages and acceptable quantum efficiencies were achieved.

While not wishing to be bound by theory, the high quantum efficiencies of the Ir(ppy)$_3$ doped lamps (Examples 32–36) can be understood in terms of the HOMO and LUMO energy matching of the electroactive polymeric arylene of Example 16, CBP, and Ir(ppy)$_3$. The polymer of Example 16 is an efficient electron transport polymer with a LUMO level that matches up well with the LUMO for Ir(ppy)$_3$. Likewise, CBP is an efficient hole transport agent with a HOMO that matches well with the HOMO of Ir(ppy)$_3$. Finally, the polymer of Example 16 has such a deep HOMO at 6.3 eV that it cannot readily transport holes or serve as a site for exciton formation. Energetically, CBP can support exciton formation and emission, as seen in lamps having no dopant, but the strong match of both the HOMO and LUMO levels of both CBP and Ir(ppy)$_3$ allows efficient formation or migration of excitons to Ir(ppy)$_3$. Also, emission from CBP overlaps the absorption band of Ir(ppy)$_3$ leading to efficient energy transfer and reemission from Ir(ppy)$_3$.

Example 47

Composition and Electroluminescent Device Comprising Poly{2-(5-[4-(octyloxy)phenyl]-1,3,4-oxadiazol-2-yl)phenyl-2,5-diyl}/TPD/Ir(ppy)$_3$ 10:3:0.085

A molecularly doped polymer composition (MDPC) comprising 1000 parts toluene (HPLC grade obtained from Aldrich Chemical, Milwaukee, Wis.), 10 parts polymer of Example 16, 3 parts TPD, and 0.085 parts Ir(ppy)$_3$ (all parts by weight) was prepared by combining the components and stirring for 1–2 hours at room temperature. The resulting solution was filtered through a 0.45 μm polypropylene (PP) syringe filter before application.

An OLED lamp was constructed from a portion of this composition as in Example 32. The lamp construction was: glass/ITO/PEDOT/MDPC/LiF/Al. The lamp exhibited a green electroluminescence centered at 513 nm. At a drive current of 20 mA/cm$^2$, the lamp exhibited an external quantum efficiency of 1.99%, a drive voltage of 7.67 V, and a lamp intensity of 1390 cd/m$^2$.

Examples 48–74

Compositions and Electoluminescent Devices Based on Phenyl Oxadiazole—9,9-Dioctyl Fluorene Copolymers Electroluminescent compositions were prepared as follows: The polymers of Example 23 (30% oxadiazole monomer units, Mw=21.3×10$^3$) and Example 26 (10% oxadiazole monomer units, Mw=90×10$^3$) were independently dissolved at 1 weight percent in toluene (HPLC grade obtained from Aldrich Chemical, Milwaukee, Wis.). A hole transporting agent (HTA) selected from TPD, CBP, PVK, HT, TPD-HT, and PS-DPAS was added to some compositions in a ratio of polymer/HTA=10:0.4, 10:0.8, 10:1.5, 10:3, 10:6, or 10:9. The electron transport agent (ETA), PBD, was added to some compositions in a ratio of polymer/ETA=10:3 or 10:6. Each coating solution was filtered through a 0.45 μm polypropylene (PP) syringe filter before application. Specific compositions are shown in Table 4.

Lamps were constructed as follows: Glass squares of 2 cm×2 cm having on one side a vapor deposited coating of indium tin oxide (ITO) were obtained from Thin Film Devices (Anaheim, Calif.). The ITO coated sides were cleaned with ethanol, treated with an O$_2$ plasma etch (4 min at 50 W and 200 mTorr), spin coated (2500 rpm for 30 sec) with an aqueous solution of PEDT/PSS, and dried under nitrogen purge at 115° C. Each of the coating solutions prepared above was spin coated on top of a resulting PEDT/PSS coated substrate (2500 rpm for 30 sec). The glass squares were then mounted into an aluminum frame, introduced into a vacuum deposition chamber, and pumped to 10$^{-6}$ torr for about 1 hour. Cathodes were applied by vapor depositing about 10 Å of LiF and about 2000 Å of aluminum. The resulting organic electroluminescent lamps were evaluated for drive voltages (V), external percent quantum efficiencies (% Q.E.), luminescence intensities (cd/m$^2$), and emission maxima ($\lambda_{max}$ nm) for blue, green, and red lamps operating at 20 mA/cm$^2$ drive current.

Tables 4 and 5 summarize these compositions along with the results of the corresponding lamp performance evaluations. Table 4 shows lamp performance data for the LEP of Example 26 (10% oxadiazole monomer units, Mw=90×10$^3$). Table 5 shows lamp performance data for the LEP of Example 23 (30% oxadiazole monomer units, Mw=21.3×10$^3$). The polymers, hole transport agents (HTA), and electron transport agents (ETA) are recorded in Tables 4 and 5 as the number of parts (p) by weight added to 1000 parts (1000 p) toluene to make the spin coating solution used in preparing the lamps.

TABLE 4

Electroactive Compositions and OLED Device Data for Neat and Blended Films Containing the Copolymer of Example 26 (Polyfluorene with 10 Mole Percent of Electron Transport Oxadiazole Units).

| Example | p Polymer/ 1000 p Toluene | p ETA/ 1000 p Toluene | p HTA/ 1000 p Toluene | voltage (V) | % Q.E. | cd/m$^2$ | $\lambda_{max}$ nm |
|---|---|---|---|---|---|---|---|
| 48 | 10 | none | none | 4.56 | 0.03 | 2.5 | 422, 447 |
| 49 | 10 | none | 3 TPD | 6.70 | 0.47 | 36 | 424, 448sh |
| 50 | 10 | none | 3 HT | 6.73 | 0.84 | 42 | 424, 447sh |
| 51 | 10 | none | 3 TPD and HT* | 6.40 | 0.63 | 37 | 420, 447 |
| 52 | 10 | none | 3 CBP | 5.37 | 0.06 | 3.8 | 426, 448 |
| 53 | 10 | none | 3 PS-DPAS | 6.47 | 0.13 | 7.9 | 426, 447sh |
| 54 | 10 | none | 3 PVK | 5.31 | 0.04 | 2.6 | 423, 445sh |
| 55 | 10 | none | 6 TPD | 5.31 | 0.14 | 7.2 | 424, 448sh |
| 56 | 10 | none | 9 TPD | 4.61 | 0.03 | 1.2 | 424, 448sh |

TABLE 4-continued

Electroactive Compositions and OLED Device Data for Neat and Blended Films Containing the Copolymer of Example 26 (Polyfluorene with 10 Mole Percent of Electron Transport Oxadiazole Units).

| Example | p Polymer/ 1000 p Toluene | p ETA/ 1000 p Toluene | p HTA/ 1000 p Toluene | Electroluminescence data at 20 mA/cm² | | | |
|---|---|---|---|---|---|---|---|
| | | | | voltage (V) | % Q.E. | cd/m² | $\lambda_{max}$ nm |
| 57 | 10 | none | 0.4 TPD | 7.83 | 0.29 | 17 | 424, 448sh |
| 58 | 10 | none | 0.8 TPD | 8.75 | 0.35 | 23 | 424, 448sh |
| 59 | 10 | none | 1.5 TPD | 7.34 | 0.45 | 29 | 424, 448sh |
| 60 | 10 | 3 PBD | 3 TPD | 5.96 | 0.63 | 50 | 424, 450sh |
| 61 | 10 | 3 PBD | 3 HT | 5.90 | 0.71 | 47 | 424, 446sh |
| 62 | 10 | 6 PBD | 3 HT | 9.97 | 0.64 | 81 | 425, 445sh | sh = shoulder.
*HT was applied in a separate layer on the PEDT/PSS coated substrate by spin coating a solution of 18 mg HT in 6 g DCE at 2000 rpm. The composition containing the TPD and the copolymer of Example 26 was then applied by spin coating as described above.

TABLE 5

Electroactive Compositions and OLED Device Data for Neat and Blended Films Containing the Copolymer of Example 23 (Polyfluorene with 30 Mole Percent of Electron Transport Oxadiazole Units).

| Example | p Polymer/ 1000 p Toluene | p ETA/ 1000 p Toluene | p HTA/ 1000 p Toluene | Electroluminescence data at 20 mA/cm² | | | |
|---|---|---|---|---|---|---|---|
| | | | | voltage (V) | % Q.E. | cd/m² | $\lambda_{max}$ nm |
| 63 | 10 | none | none | 5.85 | 0.14 | 7 | 423 |
| 64 | 10 | none | 3 TPD | 6.43 | 0.29 | 23 | 424 |
| 65 | 10 | none | 6 TPD | 5.31 | 0.37 | 39 | 425, 447sh |
| 66 | 10 | none | 9 TPD | 5.59 | 0.25 | 35 | 426, 451sh |
| 67 | 10 | none | 1.5 HT | 6.65 | 0.39 | 32 | 420, 445sh |
| 68 | 10 | none | 3 HT | 5.44 | 0.87 | 54 | 416, 429sh |
| 69 | 10 | none | 6 HT | 5.46 | 0.82 | 53 | 425, 447sh |
| 70 | 10 | none | 9 HT | 6.00 | 0.67 | 46 | 427, 448sh |
| 71 | 10 | none | 3 CBP | 5.98 | 0.25 | 16 | 425, 447sh |
| 72 | 10 | none | 6 CBP | 6.80 | 0.43 | 30 | 424, 447sh |
| 73 | 10 | 3 PBD | 3 TPD | 5.96 | 0.71 | 95 | 420, 445sh |
| 74 | 10 | 3 PBD | 3 HT | 7.80 | 1.03 | 89 | 420, 445sh | sh = shoulder.

Tables 4 and 5 show that the neat copolymers of Examples 23 and 26 exhibit blue electroluminescence (422 nm, 447 sh) (Examples 48 and 63, respectively). At an operating current density of 20 mA/cm², the external quantum efficiency for the copolymer of Example 26 was only 0.03%, the luminance was only 2.5 cd/m², and the operating voltage was 4.6 volts. The copolymer of Example 23 exhibited similar performance. These results are attributed to the absence of a hole transport agent (i.e. lack of charge transport balance).

Table 4 shows that blending of the copolymer of Example 26 in a 10:3 ratio with the hole transport agents TPD, HT, or TPD-HT (Examples 49–51) led to improved quantum efficiencies, while emission remained blue. Green excimer was not observed even after extended operation. Blending of the copolymer of Example 26 with the hole transport agents CBP, PVK, and PS-DPAS (Examples 52–54) did not result in significant improvements to the quantum efficiency when compared with the neat polymers.

Table 4 also shows that the quantum efficiency dropped off quickly as the TPD content was increased in the amounts LEP/TPD=10:3, 10:6, 10:9. Conversely, as the TPD content was decreased below LEP/TPD=10:3 the operating voltages began to rise and the efficiencies began to drop off somewhat. The 10:3 LEP/TPD ratio in the composition with the copolymer of Example 26 (Example 49) corresponded to approximately a 1:3 ratio of oxadiazole functionality to hole transport material.

Table 4 shows that electron transport properties of the films were improved by blending in both hole and electron transport agents with the copolymer of Example 26. In Examples 60 and 61, blending of the copolymer of Example 26 with a 1:1 mixture of PBD and either TPD or HT resulted in decreased operating voltages and increases in quantum efficiencies when compared with blends comprising only TPD or HT alone.

By comparison, when the 9,9-dioctylfluorene homopolymer (Comparative Examples C1 and C2) were blended with a combination of hole and electron transport agents, quantum efficiencies were comparatively quite poor (for example, 0.059 with 3 parts TPD and 0.037 with 3 parts CBP). The presence of the oxadiazole in the LEP of Example 26 lead to an unexpected improvement in the efficiency of exciton recombination for the blended systems. This result revealed an important element of strategy, useful when attempting to blend commercial LEPs with molecular hole and electron transport materials. The molecular host materials may be effective at transporting carriers in a blended film, yet be ineffective at transferring these carriers into the LEP. Our results indicated that for polyfluorenes, incorporation of an electron transport agent as a comonomer into the polymer so as to be conjugated with the LEP enhanced transfer of electrons from the host onto the LEP, resulting in much improved quantum efficiencies for blended systems.

Table 5 shows the results of an increase in oxadiazole content in the LEP. Blends of the copolymer of Example 23 (30 mole percent oxadiazole units) with several hole transport agents gave the same trends observed with the copolymer of Example 26 (10 mole percent oxadiazole units) in Table 4. In all cases, electroluminescence quantum efficiencies improved on going from 10% to 30% oxadiazole comonomer units. Blends of the copolymer of Example 23 with HT and TPD (Examples 64–70 and 73–74) gave the best results; blends with CBP (Examples 71–72) gave lower efficiencies and higher voltages than did blends with HT or TPD, but the contrast was less pronounced than was found for the copolymer of Example 26.

Table 5 also shows that the higher oxadiazole content in the copolymer of Example 23 enabled blending of the polymer with higher amounts of HT, TPD, or CBP without a drop off in quantum efficiency. For example, blends with HT in a ratio of LEP/HT=10:3, 10:6, and 10:9 (Examples 68–70) gave rise to quantum efficiencies of % QE=0.87, 0.82, and 0.67, respectively. Quantum efficiencies actually improved with increasing CBP content (Examples 71–72). Finally, blends with both PBD and HT in a 10:3:3 ratio gave even better results (Example 74). This lamp exhibited clean blue emission with performance numbers as shown (at 20 mA/cm$^2$: 6.38 volts 0.97% QE, 105 cd/m$^2$).

These results show that blended systems useful for electroluminescent devices and for laser induced thermal imaging of LEPs can be designed using the electroactive polymeric arylenes of the present invention as hosts without ruining the quantum efficiency. This strategy can now be achieved by incorporation of the electron transport oxadiazole unit into and in conjugation with the conjugated backbone of the polymer to enable charge balance and to shift the relative rates of intermolecular electron transport governing non-radiative transport through the molecular host and radiative transport from the host to the LEP.

Examples 75–83

Compositions and Electoluminescent Devices Based on Phenyl Oxadiazole—9,9-Dioctyl Fluorene—Phenylcarbazole Terpolymer Electroluminescent compositions and devices were prepared from the phenyl oxadiazole—9,9-dioctyl fluorene—phenylcarbazole terpolymer of Example 25 essentially as described in Examples 48–74. Compositions and lamp evaluation results are summarized in Table 6. In all cases, blue electroluminescence was observed.

TABLE 6

Composition and OLED Device Data for Neat or Blended Films Prepare with Phenyl Oxadiazole - 9,9-Dioctyl Fluorene - Phenylcarbazole Terpolymer

| Example | p/1000 p Toluene Polymer | p/1000 p Toluene ETA | p/1000 p Toluene HTA | $\lambda_{max}$ nm |
|---|---|---|---|---|
| 75 | 10 | none | none | 419, 445 sh |
| 76 | 10 | none | 3 HT | 419, 445 sh |
| 77 | 10 | none | 6 HT | 424, 445 sh |
| 78 | 10 | none | 3 CBP | 421, 445 sh |
| 79 | 10 | none | 6 CBP | 424, 445 sh |
| 80 | 10 | none | 3 TPD | 420, 445 sh |
| 81 | 10 | none | 6 TPD | 423, 445 sh |
| 82 | 10 | 3 PBD | none | 422, 445 sh |
| 83 | 10 | 6 PBD | none | 425, 445 sh |

"$\lambda_{max}$" is the wavelength of maximum emission intensity.
"sh" means shoulder.

Example 84

Preparation of a Donor Sheet

A thermal transfer donor sheet was prepared in the following manner. An LTHC solution, described in Table 7, was coated onto a 0.1 mm thick polyethylene terephthalate (PET) film substrate (M7 from Teijin, Osaka, Japan). Coating was performed using a Yasui Seiki Lab Coater, Model CAG-150, using a microgravure roll with 150 helical cells per inch. The LTHC coating was in-line dried at 80° C. and cured under ultraviolet (UV) radiation.

TABLE 7

LTHC Solution

| Component | Trade Designation | Parts by Weight |
|---|---|---|
| carbon black pigment | Raven 760 Ultra [1] | 3.88 |
| polyvinyl butyral resin | Butvar B-98 [2] | 0.69 |
| acrylic resin | Joncryl 67 [3] | 2.07 |
| dispersant | Disperbyk 161 [4] | 0.34 |
| fluoro surfactant | FC-430 [5] | 0.01 |
| epoxy novolac acrylate | Ebecryl 629 [6] | 13.18 |
| acrylic resin | Elvacite 2669 [7] | 8.79 |
| 2-benzyl-2-(dimethylamino)-1-(4 (morpholinyl)phenyl)butanone | Irgacure 369 [8] | 0.89 |
| 1-hydroxycyclohexyl phenyl ketone | Irgacure 184 [8] | 0.13 |
| 2-butanone | | 43.75 |
| 1,2-propanediol monomethyl ether acetate | | 26.25 |

[1] Columbian Chemicals Co., Atlanta, GA
[2] Solutia Inc., St. Louis, MO
[3] S. C. Johnson & Son, Inc. Racine, WI
[4] Byk-Chemie USA, Wallingford, CT
[5] Minnesota Mining and Manufacturing Co., St. Paul, MN
[6] UCB Radcure Inc., N. Augusta, SC
[7] ICI Acrylics Inc., Memphis, TN
[8] Ciba-Geigy Corp., Tarrytown, NY Next, an interlayer solution, given in Table 8, was coated onto the cured LTHC layer by a rotogravure coating method using the Yasui Seiki lab coater, Model CAG-150, with a microgravure roll having 180 helical cells per lineal inch. This coating was in-line dried at 60° C. and cured under ultraviolet (UV) radiation.

TABLE 8

Interlayer Coating Solution

| COMPONENT | PARTS BY WEIGHT |
| --- | --- |
| SR 351 HP (trimethylolpropane triacrylate ester, available from Sartomer, Exton, PA) | 14.85 |
| Butvar B-98 | 0.93 |
| Joncryl 67 | 2.78 |
| Irgacure 369 | 1.25 |
| Irgacure 184 | 0.19 |
| 2-butanone | 48.00 |
| 1-methoxy-2-propanol | 32.00 |

Next, a transfer layer was formed on the interlayer of the donor sheet. The transfer layer was disposed on the donor sheet by spinning the molecularly doped polymer composition of Example 47 at about 2000–2500 rpm for 30 seconds (Headway Research spincoater) to yield a film thickness of approximately 50 nm.

Example 85

Laser Induced Thermal Imaging of Transfer Layer

Part A

Preparation of Receptor Substrates

PEDT (poly(3,4-ethylenedioxythiophene)) solution (Baytron P 4083 from Bayer A G, Leverkusen, Germany) diluted 1:1 with deionized water) was filtered through a WHATMAN PURADISC 0.45 µm polypropylene syringe filter.

Unpatterned ITO(indium tin oxide) glass (Delta Technologies, Stillwater, Minn., less than 100 Ω/square, 1.1 mm thick) was ultrasonically cleaned in a hot, 3% solution of Deconex 12NS detergent (Borer Chemie A G, Zuchwil, Switzerland). The substrates were then placed in the Plasma Science plasma treater for surface treatment under the following conditions:

| Time: | 2 minutes |
| --- | --- |
| Power: | 500 watt (165 W/cm$^2$) |
| Oxygen Flow: | 100 Torr |

Immediately after plasma treatment, the PEDT solution was filtered and dispensed through a WHATMAN PURADISC 0.45 µm polypropylene syringe filter onto the ITO substrate. The substrate was then spun (Headway Research spincoater) at 2000 rpm for 30 seconds yielding a PEDT film thickness of 40 nm. All of the substrates were heated to 200° C. for 5 minutes under nitrogen.

Part B

Laser Induced Thermal Imaging of Transfer Layer from Donor Sheet

Donor sheets of Example 84 were brought into contact with the receptor substrates. Next, the donor sheets were imaged using two single-mode Nd:YAG lasers. Scanning was performed using a system of linear galvanometers, with the combined laser beams focused onto the image plane using an f-theta scan lens as part of a near-telecentric configuration. The laser energy density was 0.4 to 0.8 J/cm$^2$.

The laser spot size, measured at the 1/e$^2$ intensity, was 30 micrometers by 350 micrometers. The linear laser spot velocity was adjustable between 10 and 30 meters per second, measured at the image plane. The laser spot was dithered perpendicular to the major displacement direction with about a 100 micrometer amplitude. The transfer layers were transferred as lines onto the receptor substrates, and the intended width of the lines was about 100 micrometers. Laser induced thermal imaging was performed at a scan velocity from 11.4 to 20.0 m/s and the conditions describe in Table 9 below.

TABLE 9

Laser Induced Thermal Imaging Conditions

| Dose | 0.4–0.7 J/cm$^2$ |
| --- | --- |
| Scan speed | 20–11.4 m/s |
| Line width | 90 microns |
| Pitch | 225 microns |

Figure 7:
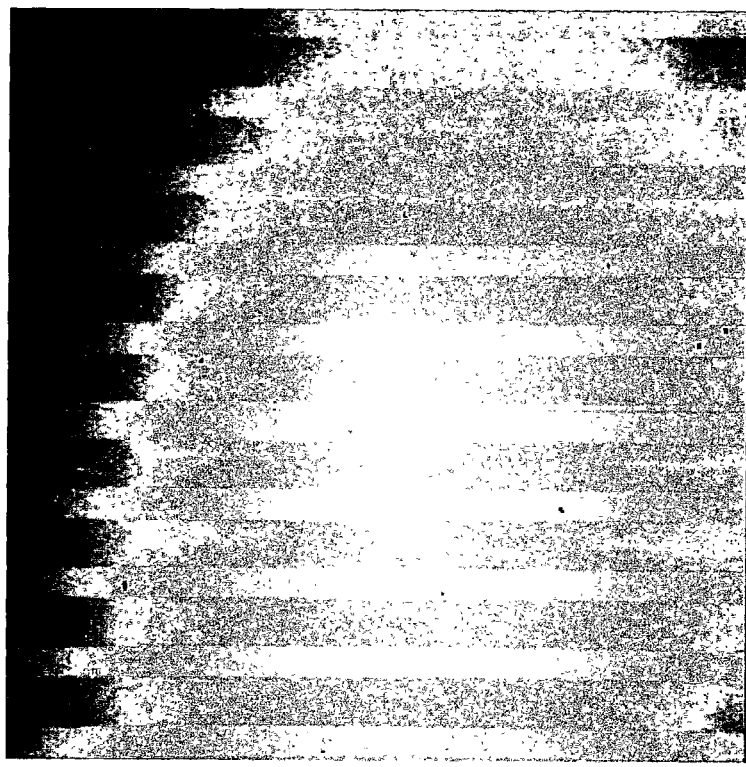
FIGS. 7 and 8 are digital images of a thermally transferred organic electroluminescent lamp device of the present invention.
Figure 8:
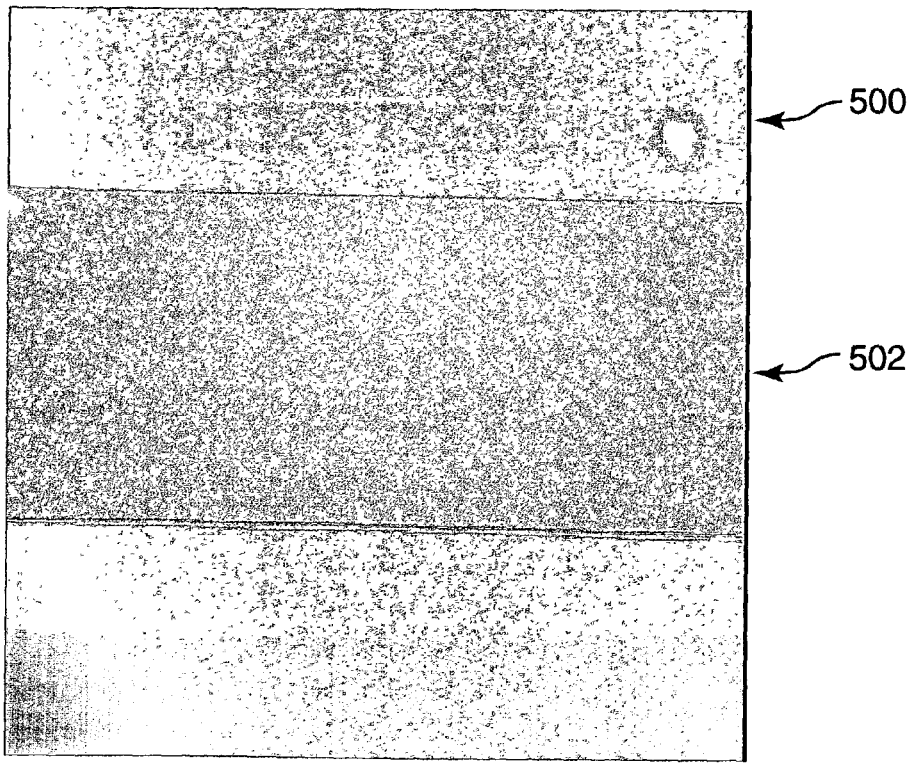

Digital images of the resulting laser induced thermal imaging pattern are shown in FIGS. 7 and 8, where the areas, 500, are the unimaged receptor surface, and the areas, 502, are the light emitting, transferred electroactive composition.

Each of the patents, patent documents, and publications cited above is hereby incorporated into this document as if reproduced in full.

What is claimed is:

1. A monomer having the structure of Formula IV

wherein each D is a reactive group independently selected from chlorine, bromine, iodine, boronic acid, and boronic ester;

wherein —Ar$^1$(E$_y$)$_a$- is selected from Formulas CLXV and CLXVI

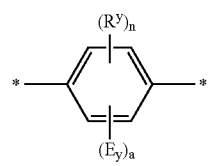

CLXV

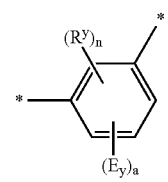

CLXVI wherein
R$^y$ is independently in each case fluoro, C$_{1-20}$ fluoroalkyl, C$_{1-20}$ perfluoroalkyl, C$_{1-20}$ alkyl, C$_{1-20}$ alkenyl, C$_{6-20}$ aryl, C$_{3-20}$ heteroaryl, or C$_{1-30}$ hydrocarbyl containing one or more S, N, O, P, or Si atoms;
n is 0, 1, or 2; a is 1 or 2;
Ey is Formula III

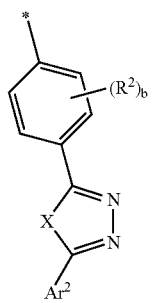

III where X is selected from —O—, —S—, and —N(R$^1$)—
wherein R$^1$ is alkyl, aryl, heteroaryl, or heteroalkyl;
wherein each R$^2$ is independently alkyl, alkenyl, alkoxy, fluoro, aryl, fluoroalkyl, heteroalkyl, or heteroaryl;
wherein b is 0, 1, or 2;
wherein Ar$^2$ is a carbocyclic aryl group selected from phenyl, biphenyl, naphthyl, anthracenyl, fluorenyl, 9-silafluorenyl, spirobisfluorenyl, dihydrophenanthrolinyl, dihydropyrenyl, tetrahydropyrenyl, pyrenyl, and perylenyl; and
wherein Ar$^2$ is unsubstituted or substituted on one or more of the aromatic rings with one or more groups selected from alkyl, alkenyl, alkoxy, fluoro, aryl, fluoroalkyl, heteroalkyl, heteroaryl, alkyloxadiazolyl, aryloxadiazolyl, alkyltriazolyl, aryltriazolyl, and hydrocarbyl containing on or more S, N, O, P, or Si atoms.

2. A monomer of claim 1
wherein —Ar$^1$ (E$_y$)$_a$- is selected from formulas CXI–CXIII

CXI

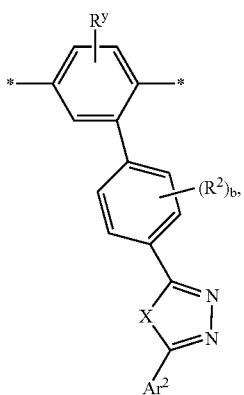

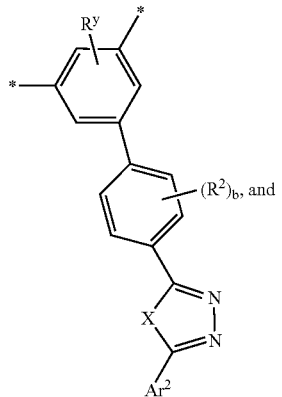

CXII

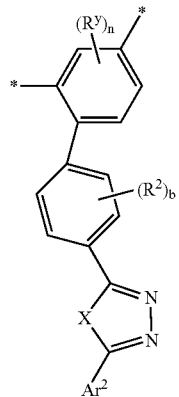

CXIII wherein X is selected from —O—, —S—, and —N(R$^1$).

3. A monomer selected from the group consisting of Compounds 1, 2, and 4–14

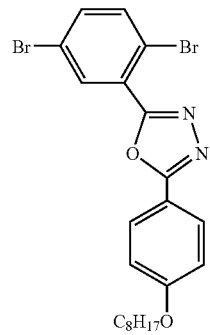

1

-continued
2
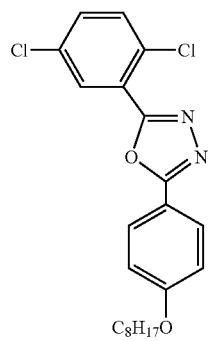
4
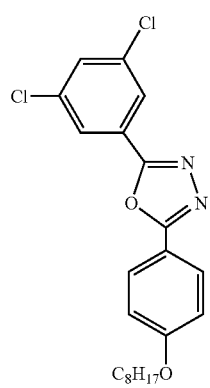
5
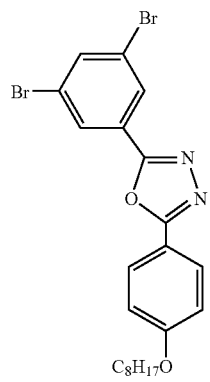
6
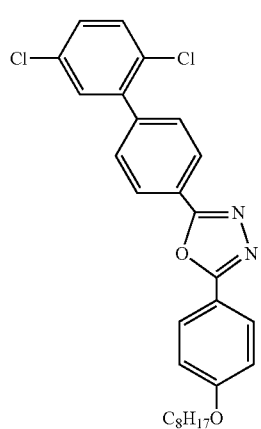
-continued
7
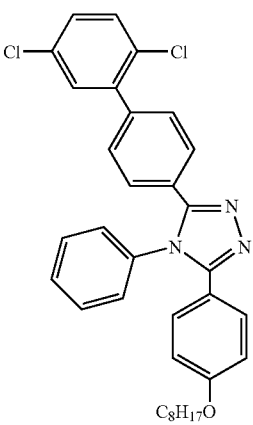
8
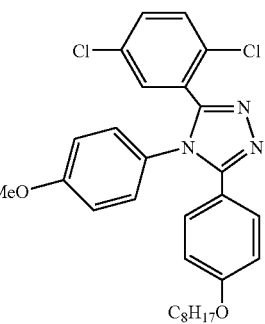
9
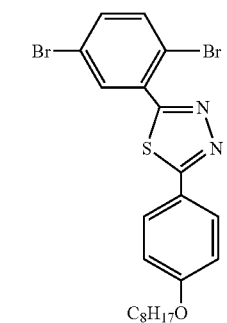
10
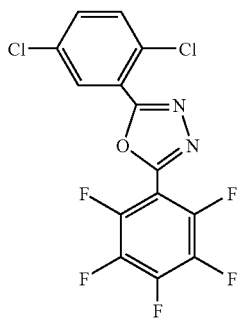

-continued

11

12

13

-continued

14

4. A monomer having the structure of Formula IV $$D—Ar^1—D$$
$$(E_y)_a$$

IV wherein each D is a reactive group independently selected from chlorine, bromine, iodine, boronic acid, and boronic ester;

wherein —Ar$^1$ (E$_y$)$_a$- is selected from Formulas XIV–XLIII

XIV

XV

XVI

XVII

XVIII

-continued
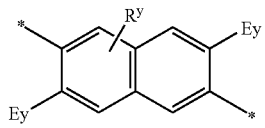
XIX
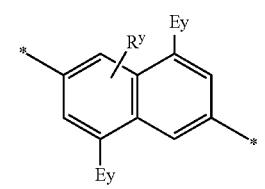
XX
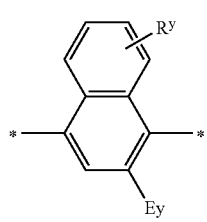
XXI
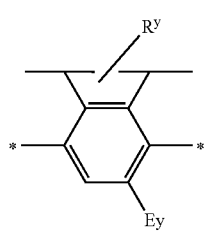
XXII
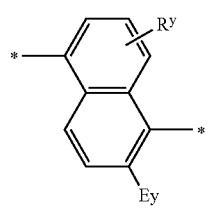
XXIII
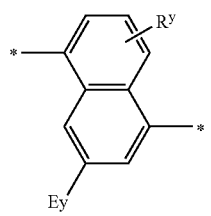
XXIV
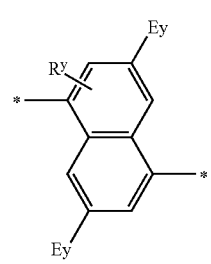
XXV
-continued
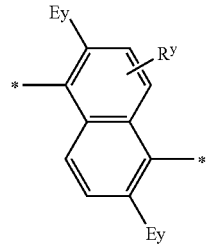
XXVI
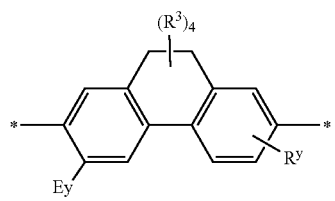
XXVII
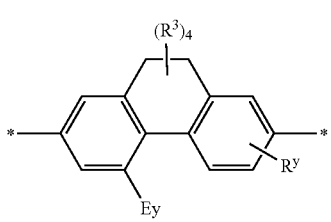
XXVIII
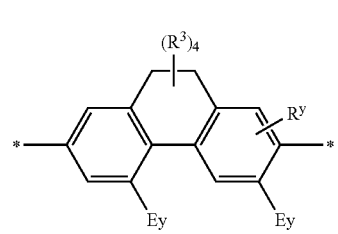
XXIX
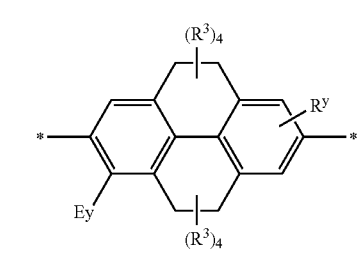
XXX
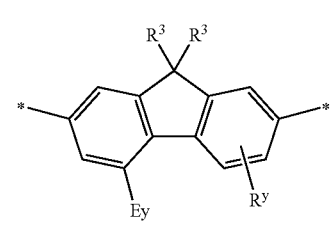
XXXI
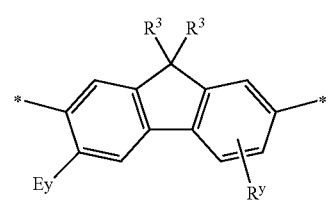
XXXII -continued
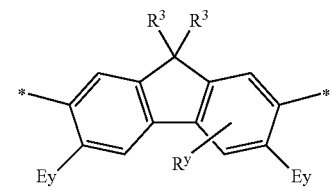
XXXIII
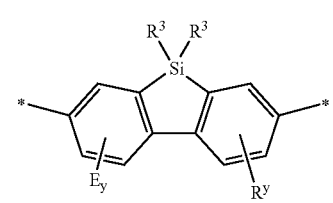
XXXIV
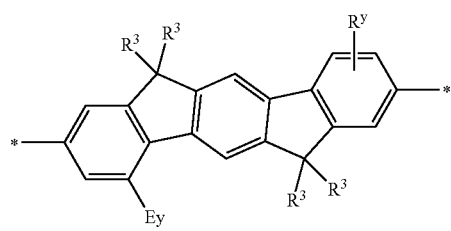
XXXV
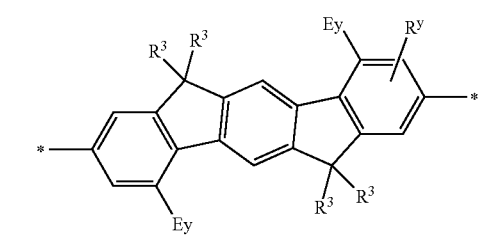
XXXVI
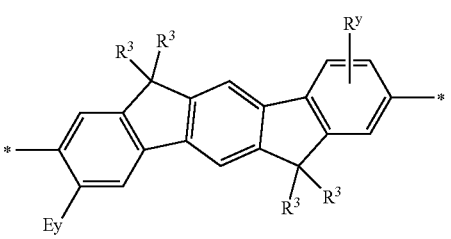
XXXVII
-continued
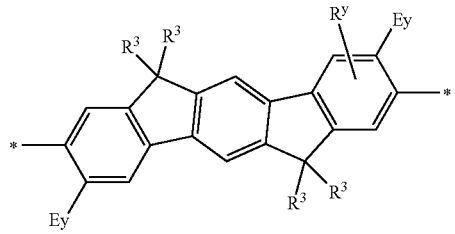
XXXVIII
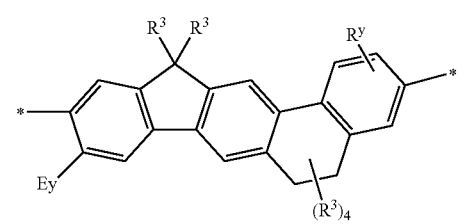
XXXIX
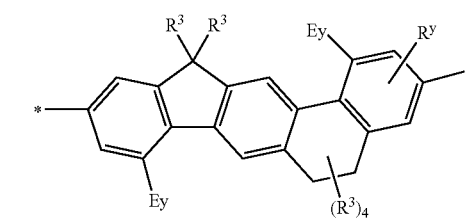
XL
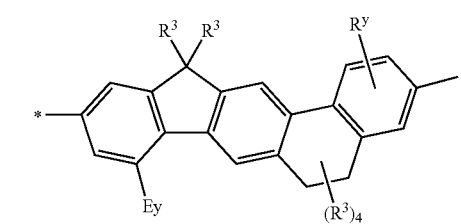
XLI
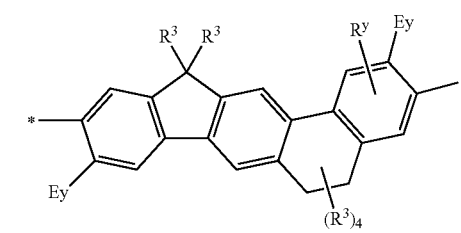
XLII -continued

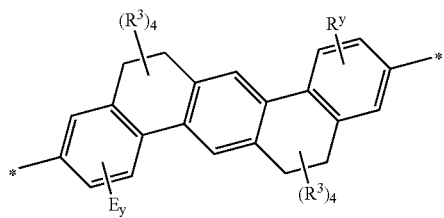

XLIII wherein each of the Formulas XIV–XLIII is independently unsubstituted or substituted on one or more of the aromatic rings with one or more $R^y$;

wherein each $R^y$ is independently selected from fluoro, $C_{1-20}$ fluoroalkyl, $C_{1-20}$ perfluoroalkyl, $C_{1-20}$ alkyl, $C_{1-20}$ alkenyl, $C_{6-20}$ carbocyclic aryl, $C_{3-20}$ heteroaryl, and $C_{1-30}$ hydrocarbyl containing one or more S, N, O, P, or Si atoms;

wherein each $R^3$ is independently selected from hydrogen, $C_{1-30}$ alkyl, $C_{1-30}$ alkenyl, $C_{6-20}$ carbocyclic aryl, $C_{3-20}$ heteroaryl, or $C_{1-30}$ hydrocarbyl containing one or more S, N, O, P, or Si atoms;

wherein 1 or 2 $E_y$ groups are present;

wherein each $E_y$ is independently selected from groups having the structures of Formulas II and III

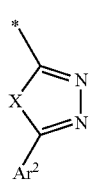

II

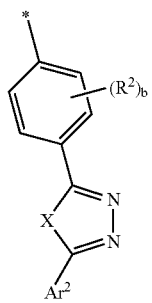

III wherein X is O, S, or $NR^1$, where $R^1$ is alkyl, aryl, heteroaryl, or heteroalkyl;

wherein each $R^2$ is independently selected from alkyl, alkenyl, alkoxy, fluoro, aryl, fluoroalkyl, heteroalkyl, and heteroaryl;

wherein b is 0, 1, or 2;

wherein $Ar^2$ is a carbocyclic aryl group selected from phenyl, biphenyl, naphthyl, anthracenyl, fluorenyl, 9-silafluorenyl, spirobisfluorenyl, dihydrophenanthrolinyl, dihydropyrenyl, tetrahydropyrenyl, pyrenyl, and perylenyl; and wherein $Ar^2$ is unsubstituted or substituted on one or more of the aromatic rings with one or more groups selected from alkyl, alkenyl, alkoxy, fluoro, aryl, fluoroalkyl, heteroalkyl, heteroaryl, alkyloxadiazolyl, aryloxadiazolyl, alkyltriazolyl, aryltriazolyl, and hydrocarbyl containing one or more S, N, O, P, or Si atoms.

5. A monomer of claim 4, wherein the monomer is selected from Formulas CXVII, CXVIII, and CXIX

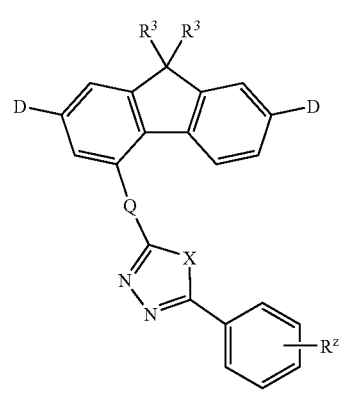

CXVII

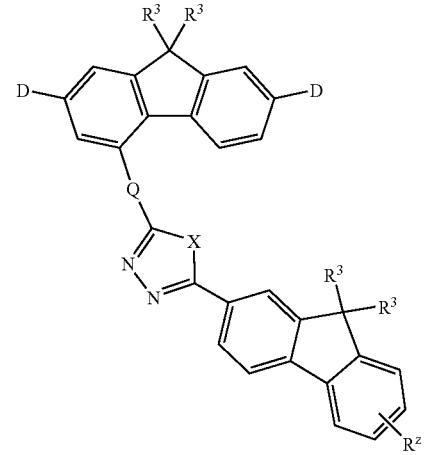

CXVIII

-continued

CXIX

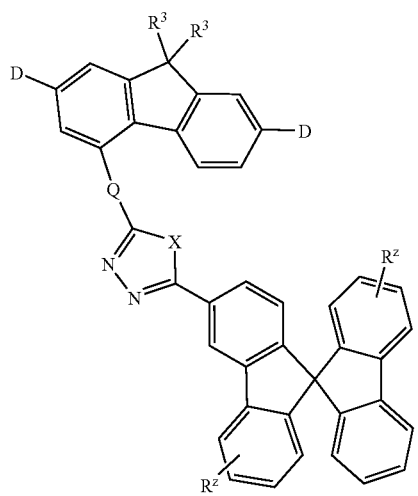

wherein

Q is phenylene or a bond;

$R^z$ is present or not present; and each $R^z$ is independently selected from fluoro, $C_{1-20}$ fluoroalkyl, $C_{1-20}$ perfluoroalkyl, $C_{1-20}$ alkyl, $C_{1-20}$ alkenyl, $C_{6-20}$ aryl, $C_{3-20}$ heteroaryl, $C_{1-30}$ hydrocarbyl containing one or more S, N, O, P, or Si atoms; $C_{3-30}$ alkyloxadiazolyl, $C_{3-30}$ aryloxadiazolyl, $C_{3-30}$ alkyltriazolyl, and $C_{3-30}$ aryltriazolyl.

6. A monomer of claim 4 wherein the monomer is Compound 15

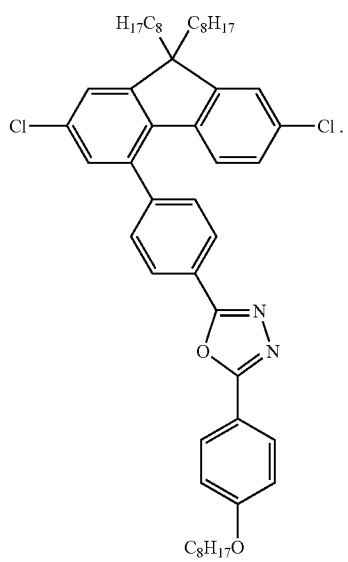

* * * * *

UNITED STATES PATENT AND TRADEMARK OFFICE
CERTIFICATE OF CORRECTION

PATENT NO. : 7,094,902 B2  Page 1 of 10
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 3:
Formula IV,

Delete " $\begin{array}{c} D-Ar^1-D \\ | \\ (Ey)_a \end{array}$ " and insert -- $\begin{array}{c} D-Ar^1-D \\ | \\ (E_y)_a \end{array}$ --, therefor.

Column 6:
Line 56, Delete "a π" and insert -- a $\pi$ --, therefor.

Column 8:
Line 10 (Approx.), Delete "O." and insert -- O, --, therefor.

Column 9:
Line 39, Delete "fluoroalky," and insert -- fluoroalkyl, --, therefor.
Line 54-55, Delete "undesireable" and insert -- undesirable --, therefor.
Line 58, Delete "undesireable" and insert -- undesirable --, therefor.
Line 62, Delete "undesireable" and insert -- undesirable --, therefor.

Column 15:
Line 44 (Approx.), Delete "NR," and insert -- $NR^1$, --, therefor.

Column 16:
Formula XLVIII,

Delete " 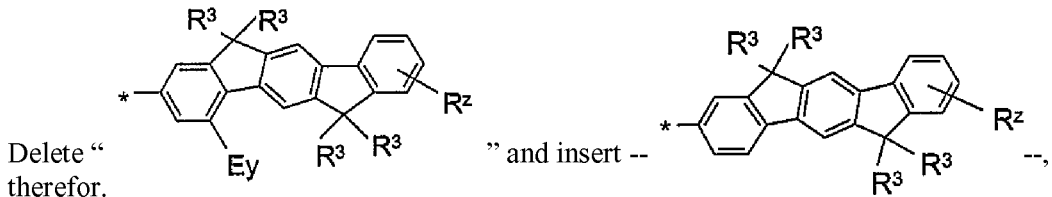 " and insert -- --, therefor.

Column 18:
Line 4, Delete "processiblity," and insert -- processibility, --, therefor.

Column 21:
Formula LXVI,

Delete " 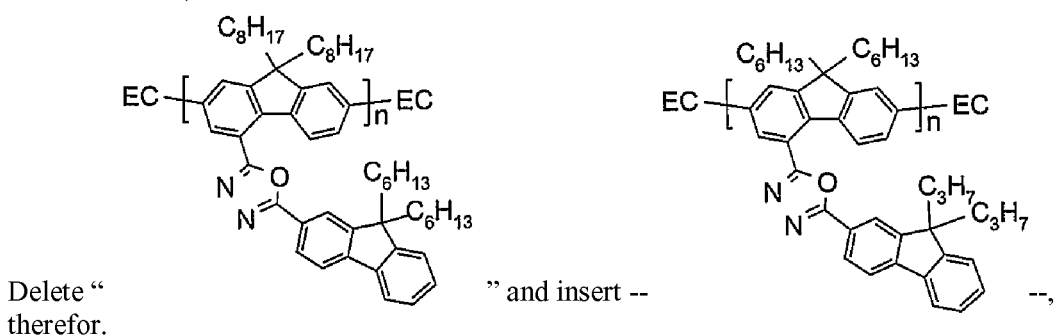 " and insert -- --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 21 (cont'd):
Line 55, Below "Formula LXVII" insert -- wherein EC and n are as described in Formula V. --.
Column 24:
Line 51 (Approx.), Delete "N" and insert -- N, --, therefor.
Column 25:
Line 7 (Approx.), Delete "substitued" and insert -- substituted --, therefor.
Line 17 (Approx.), Delete "processiblity," and insert -- processibility, --, therefor.
Line 42, Delete "9,2189–2200" and insert -- 9, 2189–2200 --, therefor.
Column 26:
Line 30 (Approx.), Delete "processiblity," and insert -- processibility, --, therefor.
Line 39, Delete "coplymers" and insert -- copolymers --, therefor.
Line 51 (Approx.), Delete "monomoer" and insert -- monomer --, therefor.
Column 29:
Formula XCV, Delete " 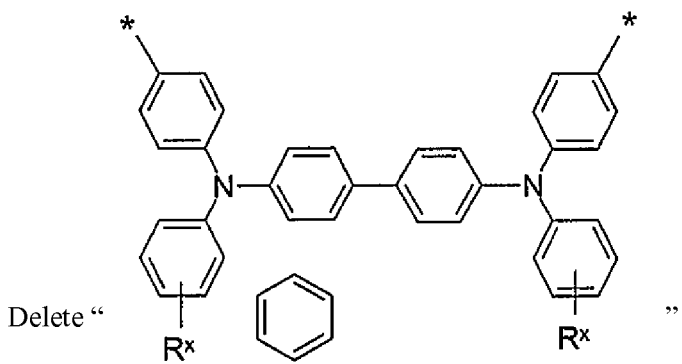 "

insert -- 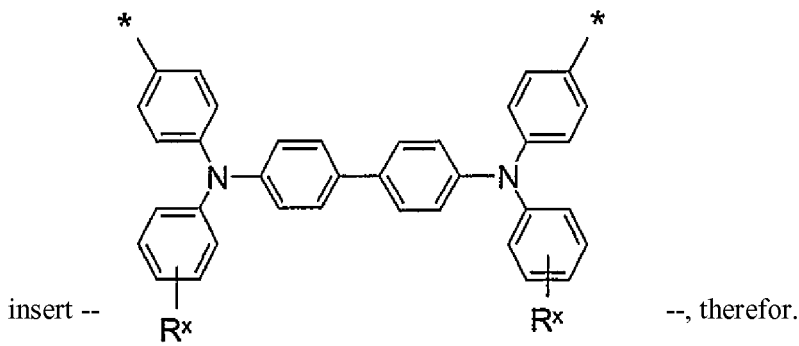 --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 29 (cont'd):
Formula XCVI,

Delete "

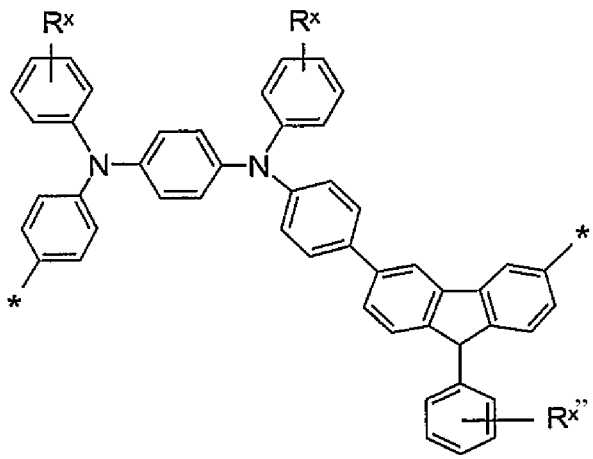

and insert --

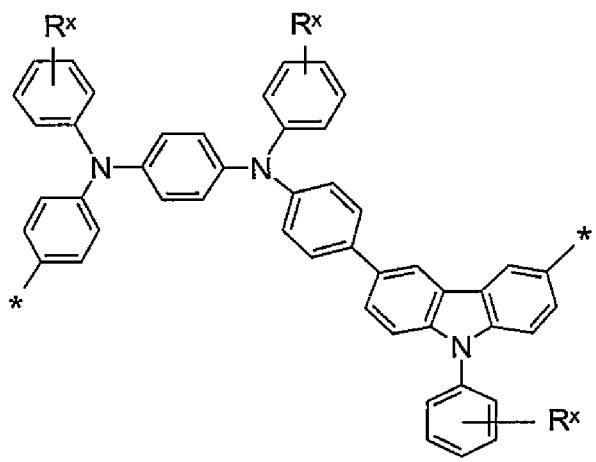

--, therefor.

Column 30:
Line 58 (Approx.), Delete "electoluminescent" and insert -- electroluminescent --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 31:
Formula XCVII,

Delete " 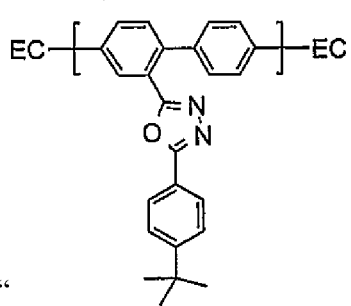 " and insert -- 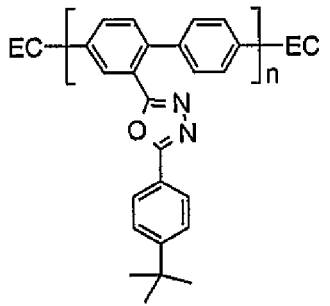 --, therefor.

Formula XCIX,

Delete " 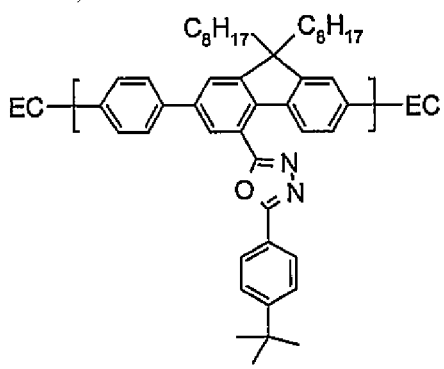 " and insert -- 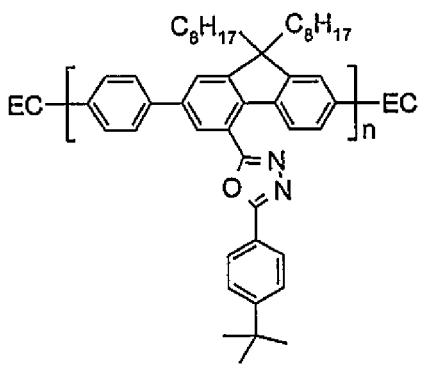 --, therefor.

Column 37:
Line 49 (Approx.), Delete "provios" and insert -- proviso --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 39:
Line 1, Delete "[—Si($C_rH_{2r+1}$)$_2$0—]$_n$," and insert -- [—Si($C_rH_{2r+1}$)$_2$O—]$_n$, --, therefor.

Column 42:
Line 4, Delete "tetrakistriphenylphosphine palladium" and insert
-- tetrakis(triphenylphosphine)palladium --, therefor.

Column 45:
Formula CXIII,

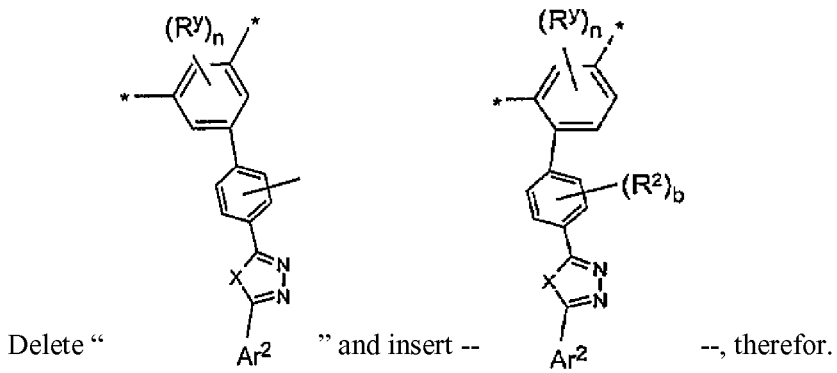

Delete "                    " and insert --                    --, therefor.

Column 46:
Line 39 (Approx.), Delete "—N(R1)—," and insert -- —N($R^1$)—, --, therefor.
Line 45 (Approx.), Delete "$C_{3-20}$" and insert -- $C_{3-30}$ --, therefor.

Column 53:
Line 54 (Approx.), Delete "3" and insert -- 3, --, therefor.
Line 55 (Approx.), Delete "correponding" and insert -- corresponding --, therefor.

Column 54:
Line 59, Delete "$R_1$" and insert -- $R^1$ --, therefor.

Column 55:
Line 1, delete "$R_1$" and insert -- $R^1$ --, therefor.

Column 61:
Lines 52-67, move lines 52-67 to column 62 to precede line 52 in column 62.
Line 56 (Approx.), Delete "tetramethyl [1,3,2]" and insert -- tetramethyl[1,3,2] --, therefor.

UNITED STATES PATENT AND TRADEMARK OFFICE
CERTIFICATE OF CORRECTION

PATENT NO.         : 7,094,902 B2                                     Page 6 of 10
APPLICATION NO. : 10/254218
DATED                  : August 22, 2006
INVENTOR(S)        : Ralph R. Roberts It is certified that error appears in the above-identified patent and that said Letters Patent is hereby corrected as shown below:

Column 62:
Lines 1-28, move lines 1-28 to follow lines 1-3 and formula 15 in column 61.
Line 14 (Approx.), Delete "(1992)" and insert -- (1992)) --, therefor.
Line 17 (Approx.), Delete "choride" and insert -- chloride --, therefor.

Column 63-64:
Reaction Scheme X, in step (3),

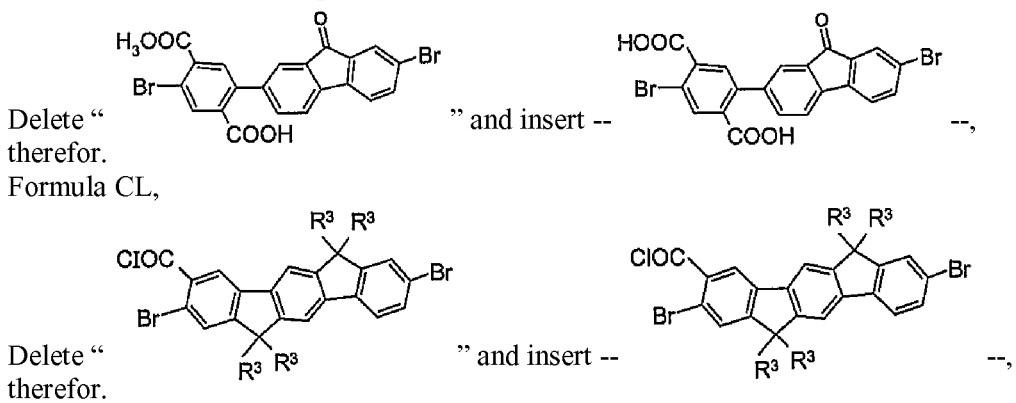

Delete " ... " and insert -- ... --, therefor.
Formula CL,

Delete " ... " and insert -- ... --, therefor.

Column 66:
Formula CLVII,

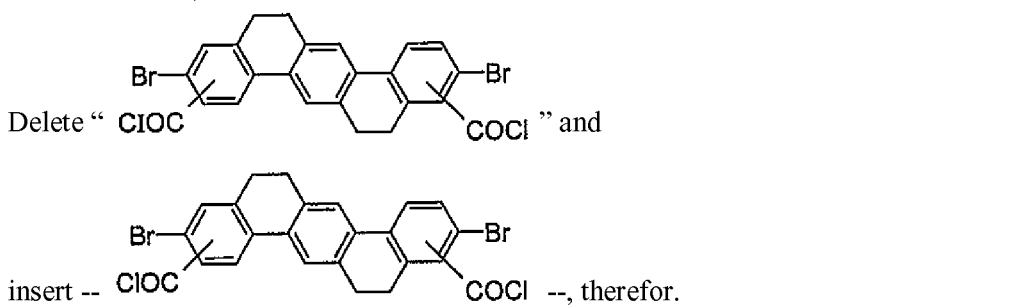

Delete " ... " and insert -- ... --, therefor.

Column 68:
Line 3, After "with" delete "with".

Column 74:
Line 19, Delete "exitons" and insert -- excitons --, therefor.

Column 77:
Line 25, Delete "(Alq3)." and insert -- (Alq$_3$). --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 79:
Line 11, Delete "transfering" and insert -- transferring --, therefor.

Column 83:
Line 44 (Approx.), Delete "Euopean" and insert -- European --, therefor.
Line 46 (Approx.), Delete "Ir(ppy)3" and insert -- Ir(ppy)$_3$ --, therefor.
Line 64, Delete "39,517(2000)." and insert -- 39, 517(2000). --, therefor.

Column 84:
Line 11, Delete "1H NMR" and insert -- $^1$H NMR --, therefor.
Line 14, Delete "13C NMR" and insert -- $^{13}$C NMR --, therefor.
Line 14, Delete "CDCl3)" and insert -- CDCl$_3$) --, therefor.

Column 86:
Line 40 (Approx.),

Delete " 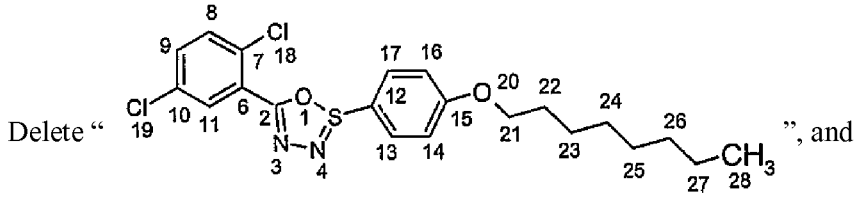 ", and insert -- 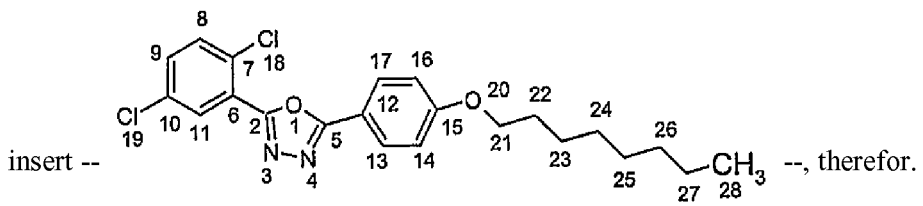 --, therefor.

Column 89:
Line 48, Delete "bromo,–9" and insert -- bromo–9 --, therefor.

Column 92:
Line 18 (Approx.), Delete "aqeous" and insert -- aqueous --, therefor.

Column 94:
Line 5-6 (Approx.), Delete "tetrakis(triphenylphosphine palladium" and insert
-- tetrakis(triphenylphosphine)palladium --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 96:
Line 36 (Approx.), Delete "min." and insert -- ml/min. --, therefor.
Line 47, After "$10^3$" insert -- , --.
Line 51, Delete "ssisted" and insert -- assisted --, therefor.

Column 99:
Line 50 (Approx.), Delete "3.8" and insert -- 3.86 --, therefor.

Column 101:
Line 65 (Approx.), Delete "orgainic" and insert -- organic --, therefor.

Column 102:
Line 30, Delete "orgainic" and insert -- organic --, therefor.

Column 104:
Line 62-63, Delete "trametbyl" and insert -- tetramethyl --, therefor.

Column 107:
Line 65 (Approx.), Delete "chromatogaraphy" insert -- chromatography --, therefor

Column 110:
Line 55, Delete "C." and insert -- C --, therefor.
Line 56 (Approx.), After "26" insert -- . --.

Column 111:
Line 6 (Approx.), Delete "Electoluminescent" and insert -- Electroluminescent --, therefor.

Column 112:
Line 64 (Approx.), Delete "Ir(ppy)3" and insert -- lr(ppy)$_3$ --, therefor.

Column 113:
Line 42 (Approx.), Delete "Electoluminescent" and insert -- Electroluminescent --, therefor.

Column 114:
Line 3, Delete "10$_3$)" and insert -- 10$^3$) --, therefor.

Column 117:
Line 58 (Approx.), Delete "Electoluminescent" and insert -- Electroluminescent --, therefor.

UNITED STATES PATENT AND TRADEMARK OFFICE
CERTIFICATE OF CORRECTION

PATENT NO. : 7,094,902 B2
APPLICATION NO. : 10/254218
DATED : August 22, 2006
INVENTOR(S) : Ralph R. Roberts It is certified that error appears in the above-identified patent and that said Letters Patent is hereby corrected as shown below:

Column 121:
Line 7, In Claim 1, delete "Ey" and insert -- $E_y$ --, therefor.
Line 30, In Claim 1, delete "1,or" and insert -- 1, or --, therefor.
Line 40 (Approx.), In Claim 1, delete "on" and insert -- one --, therefor.
Line 44, In Claim 2, delete "—$Ar^1$ $(E_y)_a$–" and insert -- —$Ar^1(E_y)_a$– --, therefor.
Line 44, In Claim 2, delete "formulas" and insert -- Formulas --, therefor.
Formula CXI,

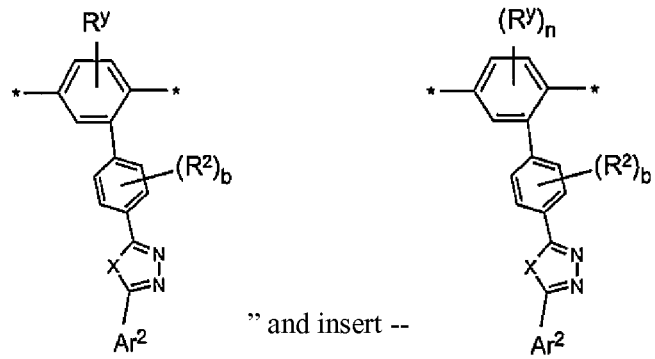

In Claim 2, delete " " and insert -- --, therefor.

Column 122:
Formula CXII,

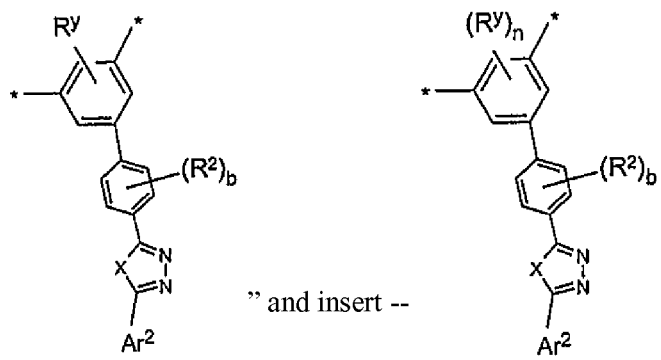

In Claim 2, delete " " and insert -- --, therefor.

UNITED STATES PATENT AND TRADEMARK OFFICE
CERTIFICATE OF CORRECTION

PATENT NO.       : 7,094,902 B2
APPLICATION NO.  : 10/254218
DATED            : August 22, 2006
INVENTOR(S)      : Ralph R. Roberts It is certified that error appears in the above-identified patent and that said Letters Patent is hereby corrected as shown below:

Column 126:
Line 33, In Claim 4, delete "—$Ar^1$ $(E_y)_a$—" and insert -- —$Ar^1(E_y)_a$— --, therefor.

Signed and Sealed this

Eighteenth Day of September, 2007

JON W. DUDAS
*Director of the United States Patent and Trademark Office*